US006185256B1

(12) United States Patent
Saito et al.

(10) Patent No.: US 6,185,256 B1
(45) Date of Patent: Feb. 6, 2001

(54) SIGNAL TRANSMISSION SYSTEM USING PRD METHOD, RECEIVER CIRCUIT FOR USE IN THE SIGNAL TRANSMISSION SYSTEM, AND SEMICONDUCTOR MEMORY DEVICE TO WHICH THE SIGNAL TRANSMISSION SYSTEM IS APPLIED

(75) Inventors: Miyoshi Saito; Junji Ogawa, both of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/062,586

(22) Filed: Apr. 20, 1998

(30) Foreign Application Priority Data

Nov. 19, 1997 (JP) .................................................. 9-318572

(51) Int. Cl.$^7$ ...................................................... H04B 3/30
(52) U.S. Cl. ............................ 375/257; 370/364; 326/20
(58) Field of Search .................................. 375/220, 257, 375/285, 346, 348; 370/359, 360, 362, 364; 340/825.83, 825.87, 825.88, 825.95; 365/230.01, 231; 326/20, 29, 26, 30, 31

(56) References Cited

U.S. PATENT DOCUMENTS

| 3,775,688 | 11/1973 | Hinoshita et al. ................... 325/42 |
| 4,388,725 | * 6/1983 | Saito et al ........................ 375/257 |
| 4,525,836 | * 7/1985 | Dayton et al. ..................... 370/362 |
| 4,646,305 | 2/1987 | Tretter et al. ....................... 371/43 |
| 4,811,342 | * 3/1989 | Huang ................................. 370/292 |
| 4,931,667 | 6/1990 | Pfennings et al. ................... 307/443 |
| 5,153,459 | 10/1992 | Park et al. .......................... 307/452 |
| 5,265,125 | 11/1993 | Ohta ..................................... 375/11 |
| 5,436,559 | * 7/1995 | Takagi et al. ..................... 324/158.1 |
| 5,506,808 | 4/1996 | Yamada et al. .................... 365/208 |
| 5,548,596 | * 8/1996 | Tobita .................................. 714/719 |
| 5,715,274 | * 2/1998 | Rostoker et al. ................... 375/200 |
| 5,872,809 | * 2/1999 | Batruni ............................... 375/219 |

FOREIGN PATENT DOCUMENTS

| 197 44 620 A1 | 5/1998 | (DE) . |
| 0 375 121 A2 | 6/1990 | (EP) . |
| 0 833 342 A2 | 4/1998 | (EP) . |
| 2 308 702 | 7/1997 | (GB) . |
| 10275038 | 10/1998 | (JP) . |

* cited by examiner

Primary Examiner—Young T. Tse
(74) Attorney, Agent, or Firm—Arent Fox Kintner Plotkin & Kahn PLLC

(57) ABSTRACT

A signal transmission system is constructed to transmit data over a signal transmission line without requiring precharging the signal transmission line for every bit, by eliminating the intersymbol interference component introduced by preceding data. The signal transmission line has a plurality of switchable signal transmission lines organized in a branching structure or a hierarchical structure, at least one target unit from which to read data is connected to each of the plurality of signal transmission lines, and a readout circuit including a circuit for eliminating the intersymbol interference component is connected to the signal transmission line, wherein the intersymbol interference component elimination circuit reduces noise introduced when the signal transmission line is switched between the plurality of signal transmission lines, and thereby provides a smooth intersymbol interference component elimination operation when the signal transmission line is switched. This makes continuous readout possible and achieves an increase in the overall speed of the signal transmission system.

17 Claims, 66 Drawing Sheets

INTERSYMBOL
INTERFERENCE
ELIMINATION
PREPARATION
AND AUTO-ZERO
OPERATIONS

SIGNAL
DECISION
OPERATION $$C30 = \frac{\alpha(C10-C20)(C10+C20)}{(2-\alpha)C10+\alpha C20}$$
Where, $\alpha = CLDB/(CGDB+CLDB)$ $$C30 = \frac{\alpha(C10-C20)(C10+C20)}{(2-\alpha)C10+\alpha C20}$$

Where, $\alpha = CLDB/(CGDB+CLDB)$ $$C30 = \frac{a(C10-C20)(C10+C20)}{(2-a)C10+aC20}$$

Where, $a = CLDB/(CGDB+CLDB)$

ROW BLOCK STATE LATCH CIRCUIT
(HOLDS ONE OF FOUR STATES)

| ST1 | RB1 IN CURRENT STATE | RB1 ACCESS PERMITTED |
|---|---|---|
| ST2 | RB1 IN CURRENT STATE<br>RB5 IN NEXT STATE | RB1 AND RB5 ACCESS PERMITTED |
| ST3 | RB1 IN PREVIOUS STATE<br>RB5 IN CURRENT STATE | RB1 IN WRITE RESTORE OPERATION,<br>RB5 ACCESS PERMITTED |
| ST4 | RB1 IN STANDBY (RESET STATE)<br>RB5 IN CURRENT STATE<br>RB6 IN NEXT STATE | RB5 AND RB6 ACCESS PERMITTED |

@ DENOTES BLOCK NUMBER

Fig.52
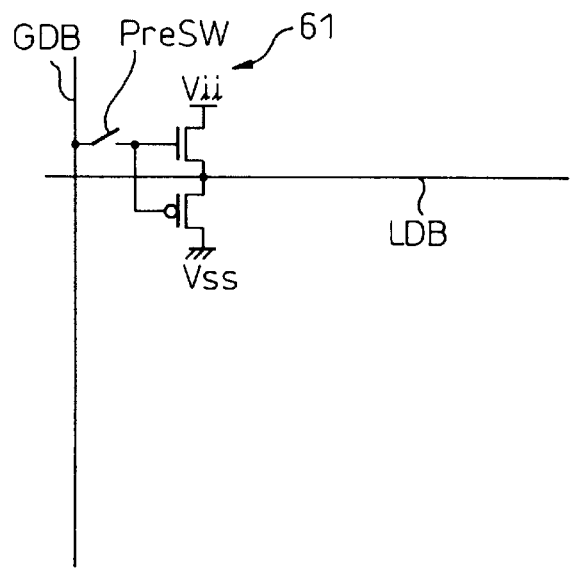
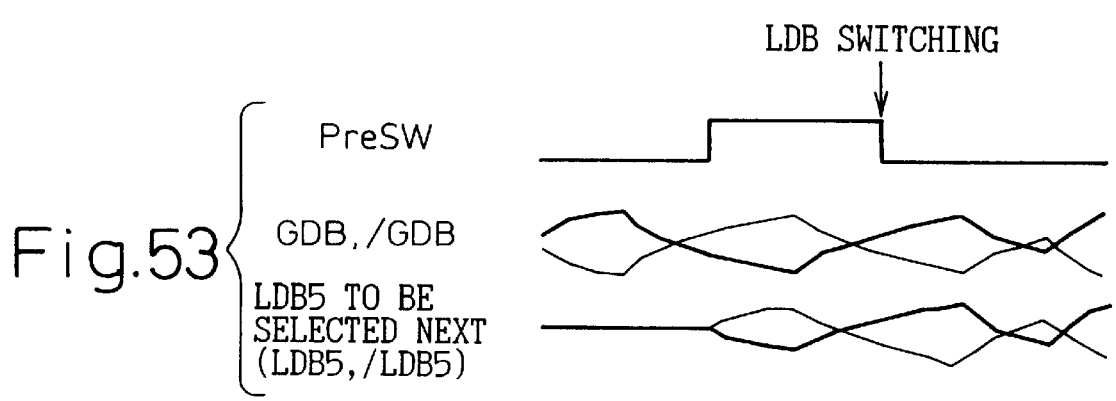
Fig.53

RISING SLOWED
BY DELAY

BLT RAISED IN
TWO STEPS

BLT RAISED IN
THREE STEPS

DATA BUS PRECHARGE OPERATION

LDB,/LDB

Fig.77

[LDB PRECHARGE LEVELS]

INTERNAL SUPPLY ─────
VOLTAGE (Vii)

WRITE PRECHARGE LEVEL

READ PRECHARGE LEVEL ─────

GND ─────
(Vss)

SIGNAL TRANSMISSION SYSTEM USING PRD METHOD, RECEIVER CIRCUIT FOR USE IN THE SIGNAL TRANSMISSION SYSTEM, AND SEMICONDUCTOR MEMORY DEVICE TO WHICH THE SIGNAL TRANSMISSION SYSTEM IS APPLIED

BACKGROUND OF THE INVENTION

1. Field of the Invention

The present invention relates to a transmission system, a receiver circuit for use in the transmission system, and a semiconductor memory device to which the signal transmission system is applied, and more particularly to a transmission system using a PRD (partial response detection) method, a receiver circuit for use in the signal transmission system, and a semiconductor memory device to which the signal transmission system is applied.

2. Description of the Related Art

In recent years, with advances in semiconductor technology, the speed of processors (MPUs: Micro Processor Units) has increased dramatically. The performance of semiconductor memory devices, exemplified by DRAMs (Dynamic Random Access Memories), has also improved to some extent in terms of speed, but compared with the increase in processor speed, the disparity has been growing steadily.

Stated another way, processor performance has increased dramatically in terms of speed, whereas DRAM performance improvements have been dramatic primarily in terms of storage capacity. However, DRAM speed improvements have not been so dramatic as the increase in storage capacity, as a result of which the gap between the speed of DRAMs and that of processors has widened and this speed gap has become a bottleneck in boosting system (computer) performance in recent years. Furthermore, as chip sizes increase, the speed of signal transfers between devices and between constituent circuits within one LSI chip (semiconductor memory) is becoming a major limiting factor in chip performance.

If this situation continues, a situation may arise where the overall system speed cannot increase at all despite increased processor speed, eventually leading to stagnation of the information industry. There is therefore a growing need to increase the speed of semiconductor memory devices and, particularly, the data transfer speed in semiconductor memory devices.

The prior art and problems associated with the prior art will be described in detail later with reference to drawings.

SUMMARY OF THE INVENTION

A primary object of the present invention is to improve the overall speed of semiconductor memory devices by making continuous (seamless) column reads possible while increasing not only readout but also write speeds.

According to the present invention, there is provided a signal transmission system for transmitting data over a signal transmission line without requiring precharging the signal transmission line for every bit, by eliminating an intersymbol interference component introduced by preceding data, wherein the signal transmission line comprises a plurality of switchable signal transmission lines organized in a branching structure or a hierarchical structure, at least one target unit from which to read data is connected to each of the plurality of signal transmission lines, and a readout circuit including a circuit for eliminating the intersymbol interference component is connected to the signal transmission line, and the intersymbol interference component elimination circuit reduces noise introduced when the signal transmission line is switched between the plurality of signal transmission lines, and thereby provides a smooth intersymbol interference component elimination operation when the signal transmission line is switched.

The response time of the signal transmission line may be set approximately equal to or longer than the length of a transmitted symbol. When transferring continuous data from the same signal transmission line, precharging of the signal transmission line for every bit may not be performed, and during a period preceding the switching of the transmission line and during a period when continuous data transmission is not performed, some of the plurality of signal transmission lines may be precharged to a predetermined voltage level. When the signal transmission line is switched from a first signal transmission line to a second signal transmission line, the second signal transmission line to be selected next may be precharged to a predetermined voltage level before the signal transmission line is switched.

The readout circuit may be a circuit employing a partial-response detection method, and the readout circuit employing the partial-response detection method may correct the intersymbol interference component elimination, when the signal transmission line is switched, by varying an input capacitance value. The readout circuit employing the partial-response detection method may include an intersymbol interference estimation unit for estimating intersymbol interference from a previously received signal; and a decision unit for making a logic decision on a currently received signal by subtracting the estimated intersymbol interference from the currently received signal. The readout circuit employing the partial-response detection method may include first and second partial-response detection amplifiers, arranged in parallel with each other, wherein the first partial-response amplifier may perform an intersymbol interference estimation operation while the second partial-response detection amplifier is performing a data decision operation and, at the next timing, may perform a data decision operation while the second partial-response detection amplifier is performing an intersymbol interference estimation operation.

The signal transmission line may be configured as complementary buses and the readout circuit may be configured as a complementary-type bus amplifier. The readout circuit may operate only when data is transferred via the signal transmission line. When the signal transmission line is switched, a first driver select signal for selecting a driver on an activated signal transmission line currently transmitting data thereon and a second driver select signal for selecting a driver on a signal transmission line currently inactive and expected to be activated after the switching may be generated as a common driver select signal, and the inactive signal transmission line may be precharged during a period that includes the last cycle of the state in which data in an arbitrary driver on the inactive signal transmission line, selected simultaneously when selecting a driver on the activated signal transmission line, may be transmitted on the inactive signal transmission line. The common driver select signal may be also supplied in common to the plurality of signal transmission lines other than the signal transmission line expected to be activated next.

A timing signal for carrying out the switching of the signal transmission line may be generated externally and distributed to a switching circuit for each signal transmission line, or may be supplied at timing before the last one cycle of amplification of a currently activated signal transmission line. Before switching the signal transmission line an inactive signal transmission line may be precharged in such a direction as to reduce the noise that has an effect on an intersymbol interference component elimination operation subsequently performed in the readout circuit, or may be precharged to a voltage level within a range of plus or minus a predetermined voltage about a voltage at one half of either a read or write maximum amplitude of the signal transmission line, the predetermined voltage being smaller than a transistor threshold voltage.

According to the present invention, there is also provided a signal transmission system for transmitting data over a signal transmission line without requiring precharging the signal transmission line for every bit, by eliminating an intersymbol interference component introduced by preceding data, wherein the signal transmission line comprises a plurality of switchable transmission lines, and when the signal transmission line is switched from a first transmission line to a second transmission line, the second transmission line to be selected next is precharged to a predetermined level before switching the signal transmission line, in order to continue data transmission.

The signal transmission system may include a state latch circuit for holding at least two states consisting of a CURRENT state indicating a bus currently in an active state and a NEXT state indicating a bus to be selected and activated next, or four states consisting of the CURRENT state, the NEXT state, a STANDBY state indicating a bus in a standby state, and a PREVIOUS state indicating a bus just deactivated. The target unit may be a sense amplifier for reading data out of a memory cell, and the readout circuit may be a data bus amplifier having an intersymbol interference component elimination function.

The sense amplifier for reading data out of the memory cell may also function by itself as a drive circuit for the data bus. The semiconductor memory device may be a dynamic random-access memory. From the sense amplifier the data may be first transferred onto a local data bus via a selected column gate, and then onto a global data bus via a local data bus switch that selects the local data bus, and the data may be amplified by a complementary-type data bus amplifier having an intersymbol interference component elimination function, thereby continuing data transmission uninterruptedly without performing data bus precharge during data transfer.

Further, according to the present invention, there is provided a semiconductor memory device comprising a plurality of blocks, wherein the semiconductor memory device includes a state latch circuit for holding at least two states consisting of a CURRENT state indicating a bus currently in an active state and a NEXT state indicating a bus to be selected and activated next, or four states consisting of the CURRENT state, the NEXT state, a STANDBY state indicating a bus in a standby state, and a PREVIOUS state indicating a bus just deactivated.

Each of the blocks may cycle through the four states, changing state from the STANDBY state to the NEXT state to the CURRENT state to the PREVIOUS state and then back to the STANDBY state. The block may be in the STANDBY state, a signal input for raising a word line within the block may be enabled; when the block is in the NEXT state, the block may be in a state ready to read data from a unit target or a sense amplifier onto a bus or ready to write data to the unit target or the sense amplifier, with the word line rising and a sense amplifier activated at least at the end of the NEXT state period; when the block is in the CURRENT state, data may be being read out of or being written in the block; and when the block is in the PREVIOUS state, data may be rewritten, and then the word line may be lowered and a bit line is precharged.

When performing a data write operation, a switch connecting a sense amplifier to a bit line may be turned off near the end of the period when the block is in the NEXT state and, while maintaining the off state during the CURRENT state, a data write sense amplifier connected to a data bus may write data into the sense amplifier connected to a memory cell where the data is to be written; when a transition is made from the CURRENT state to the PREVIOUS state, the switch connecting the sense amplifier to the bit line may be turned on and, during a portion of the period of the PREVIOUS state, the data held in the sense amplifier may be written into the memory cell via the bit line, after which a word line is lowered, the sense amplifier may be deactivated, and the bit line may be precharged, the block then entering the STANDBY state. An external access may not be allowed to memory cell arrays of the block during the period when the block is in the PREVIOUS state.

The state latch circuit may be provided for each block. The semiconductor memory device may further include an operation signal generating circuit for generating some of operation signals for use within each of the blocks from state signals output from the state latch circuit for each of the blocks. The operation signal generating circuit may generate a row address latch signal by using a state signal indicating the NEXT state out of the state signals output from the state latch circuit for each of the blocks.

According to the present invention there is also provided a semiconductor memory device comprising a plurality of blocks, wherein each of the row block has a local data bus which is selectively controlled by a selection switch for connection to a global data bus at a hierarchically upper level, and a period is provided during which at least two of the plurality of row blocks are active at the same time and, when the local data bus is switched between the row blocks that are activated at the same time during the period, data on the global data bus transferred from the local data bus are continuously read out.

The semiconductor memory device may be constructed so that a memory cell or a sense amplifier for reading data in the memory cell transfers data onto the local data bus by a row selection line and a column select signal; a local data bus is selected in accordance with a row block select signal; at least one local data bus is connected to the global data bus; and using a complementary-type partial-response detection bus amplifier connected to the global data bus, an intersymbol interference component on the global data bus is eliminated, thereby providing a high-speed data read.

The semiconductor memory device may include a circuit which, after switching is made from a first local data bus to a second local data bus, holds the selected state of the row selection line in the row block having the first local data bus for a prescribed amount of time, thus enabling local data bus switching between a plurality of activated row blocks. The semiconductor memory device may further include a decoder and row selection line holding circuit which latches a row address into the decoder in accordance with a row address latch signal given to each block, selects a designated row selection line within the block, and holds the row selection line in its selected state for a prescribed amount of time or until a signal for initializing the decoder is input.

The decoder and row selection line holding circuit may share address lines with decoder and row selection line holding circuits provided for other blocks, may latch the address signal and select the designated row selection line in the block for which the row address latch signal given to each of the blocks is valid, and may prevent row selection lines from transitioning in other blocks for which the row address latch signal is not valid. The decoder and row selection line holding circuit may comprise a dynamic logic circuit and a switch unit for controlling the activation of the logic circuit, and when the row address is input at an input of the logic circuit, and the switch unit is on, transition of a data decoder output section is enabled, and when the switch unit is off, transition of the decoder output section is prohibited to hold the state of the row selection line. The decoder and row selection line holding circuit may hold the state of the row selection line for a finite amount of time.

The decoder and row selection line holding circuit may include a circuit, provided for each block, for holding the address to be input to the decoder for each block, and may hold the state of the row selection line by holding the address for each block. The row selection line may be a word line in an memory cell array.

According to the present invention, there is provided a signal transmission system for a semiconductor memory device for writing data from a write amplifier to a sense amplifier via a data bus, wherein when writing, at least during a portion of a period when a select signal for connecting the data bus to the sense amplifier is being supplied a bit line connected to the sense amplifier for amplification is disconnected from the sense amplifier, thereby allowing information on the data bus to be transferred at high speed into the sense amplifier.

The data bus and the sense amplifier may be connected via a column gate which is controlled by the select signal. During the writing, after transferring data to the sense amplifier for writing therein, the bit line disconnected from the sense amplifier may be reconnected to the sense amplifier, the data written in the sense amplifier may be transferred for writing into a memory cell selected by a memory cell selection line from among memory cells connected to the bit line, and thereafter the memory cell selection line may be deselected, thereby storing data in the memory cell.

Further, according to the present invention, there is provided a semiconductor memory device in which data is written from a write amplifier to a sense amplifier via a data bus, wherein when writing, at least during a portion of a period when a select signal for connecting the data bus to the sense amplifier is being supplied a bit line connected to the sense amplifier for amplification is disconnected from the sense amplifier, thereby allowing information on the data bus to be transferred at high speed into the sense amplifier.

The bit line disconnection may be performed in such a manner that, during a period when write cycles are performed continuously with a plurality of sense amplifiers within the same block being selected sequentially, the plurality of sense amplifiers remain disconnected from their associated bit lines, and when the continuous write within the same block is completed, the disconnected bit lines are reconnected to their associated sense amplifiers. During the writing, after transferring data to the sense amplifier for writing therein, the bit line disconnected from the sense amplifier may be reconnected to the sense amplifier, the data written in the sense amplifier may be transferred for writing into a memory cell selected by a memory cell selection line from among memory cells connected to the bit line, and thereafter the memory cell selection line may be deselected, thereby storing data in the memory cell.

The sense amplifier may be configured as a CMOS complementary type, and two N-channel MOS transistors may be used as a column selection gate connected to complementary buses, and wherein the ratio of P-channel MOS transistors of the sense amplifier to the N-channel MOS transistors of the column selection gate may be made small so that data on a low voltage side of the complementary buses is written.

The data bus and the sense amplifier may be connected via a column gate which is controlled by the select signal. When switching from one row block to another, local data buses in the block where writing may be completed are precharged to prevent an erroneous write in the write-completed block. At least during writing to the sense amplifier, a maximum value of data on a high voltage side of the data bus may be set lower than a source voltage of the P-channel MOS transistor of the sense amplifier in an activated state or a maximum voltage of the data bus in a read state, and higher than one half of the maximum voltage. The maximum value of the data on the high voltage side of the data bus that a final-stage driver in the write amplifier outputs may be clamped at a predetermined voltage near the sense amplifier regardless of the output level of the write amplifier.

After activating a selected row block, the data bus may be precharged before writing data to the first sense amplifier and after writing data is done to the final sense amplifier. Data bus precharge before supplying the select signal may be rendered unnecessary at least during the period when the continuous write cycles are being performed. The semiconductor memory device may include a latch-type sense amplifier, and the connection between the sense amplifier and the bit line may be controlled by a bit line transfer gate with a control signal applied to the bit line transfer gate and operated quickly for disconnection and slowly for connection.

The control signal applied to the bit line transfer gate may be formed so that the bit line rises slowly or in a steplike manner in order to prevent inversion of data latched in the sense amplifier. The control signal applied to the bit line transfer gate may be generated by being delayed through delay unit so that the control signal rises slowly, or may be generated by a circuit having a plurality of switching transistors whose sources are coupled to different voltages or whose gates are supplied with different control voltages so that the control signal rises in a steplike manner.

The pulse width of a read select signal for selecting the connection between the target unit and the data bus for data read may be made shorter than the pulse width of a write select signal for selecting the connection between the target unit and the data bus for data write. During the continuous cycle period, whether read or write cycles, data bus precharge may be rendered unnecessary at least for activated buses. In any data bus state except for the continuous read and write cycle periods, a read precharge level may be set at a different level than a write precharge level.

In addition, according to the present invention, there is also provided a receiver circuit for use in a signal transmission system which transmits data via complementary buses and detects the data by eliminating an intersymbol interference component introduced by preceding data, and in which switching from a first transmission line to a second transmission line connected to the same receiver circuit takes place during signal transmission, comprising a differential amplifier; an amplifier precharge circuit provided at an input of the differential amplifier; and a function, provided at an input of the differential amplifier, for changing the value of a capacitance in the receiver circuit for periods of n bits each before and after the switching from the first transmission line to the second transmission line, thereby reducing noise due to a transmission line voltage level change caused by the switching from the first transmission line to the second transmission line.

The receiver circuit may comprise a differential amplifier having first and second gate-receiving complementary inputs; an amplifier precharge circuit, provided at each of the first and second inputs of the differential amplifier, for precharging the differential amplifier; and three kinds of capacitors consisting of first, second, and third capacitors provided at the first and second inputs of the differential amplifier, wherein the first and second inputs of the differential amplifier may be coupled to the complementary buses via the first and second capacitors, with the first capacitor coupled to one of the complementary buses and the second capacitor selectively coupled by a switch unit to one or the other of the complementary buses, and the third capacitor may be connected by a switch unit to change capacitance values at the first and second inputs of the differential amplifier for periods of n bits each before and after the switching from the first transmission line to the second transmission line.

During an operation to estimate the intersymbol interference component, the second capacitor may be coupled to the bus opposite to the bus to which the first capacitor connected to the same differential input is coupled, and during a data decision operation, the second capacitor may be coupled to the same bus that is coupled to the first capacitor connected to the same differential input. When the capacitance value of the first capacitor is denoted by C10, the capacitance value of the second capacitor by C20, and the capacitance value of the third capacitor by C30, the capacitance values of the first and second capacitors may be chosen to substantially satisfy the equation $C10/(C10+C20)=(1+\exp(-T/\tau))/2$ and also the equation $C30=\{\alpha(C10-C20)\cdot(C10+C20)\}/\{(2-\alpha)\ C10+\alpha C20\}$, where $\tau$ is the time constant of the bus, T is the cycle of one bit or the time one-bit data appears on the bus, and $\alpha$ is the ratio of capacitance change due to transmission line switching. When transmission line switching occurs from a first local data bus to a second local data bus for connection to one global data bus, the ratio $\alpha$ of capacitance change due to the transmission line switching may satisfy the equation $\alpha=CLDB/(CGDB+CLDB)$, where CGDB is the capacitance of the global data bus and CLDB is the capacitance of the local data bus.

An intersymbol interference component estimation operation may be performed during the period of n bits before the switching from the first transmission line to the second transmission line, and a data decision operation may be performed during the period of n bits after the switching from the first transmission line to the second transmission line. Voltage levels may be different between the first transmission line and the second transmission line.

Data may be read out by operating the receiver in such a manner that during a bit time when the first receiver circuit block is performing an intersymbol interference component estimation operation, the second receiver circuit block may perform a data decision operation and, during the next bit time, the first receiver circuit block may perform a data decision operation while the second receiver circuit block is performing an intersymbol interference component estimation operation. The function of changing the value of capacitance in the receiver may be provided only in the first receiver circuit block which, on a transmission line where the transmission line switching occurs, performs the intersymbol interference component estimation operation during the period of n bits before the transmission line switching and the data decision operation during the period of n bits after the transmission line switching.

The second receiver circuit block may perform the intersymbol interference component estimation during an odd-numbered bit time, and the third capacitor and the switch unit for controlling the connection of the third capacitor are omitted from the second receiver circuit block. The receiver circuit may be supplied with an output signal from an operating pulse generating circuit common to the plurality of receiver circuits. The receiver circuit may be a bus amplifier for a dynamic random-access memory having a configuration such that transmission line switching is made from a first local data bus to a second local data bus for connection to one global data bus.

BRIEF DESCRIPTION OF THE DRAWINGS

The present invention will be more clearly understood from the description of the preferred embodiments as set forth below with reference to the accompanying drawings, wherein:

FIGS. 46 and 47 are diagrams showing operational states of the semiconductor memory device of the eighth embodiment shown in FIG. 40;

FIG. 52 is a circuit diagram showing an example of the configuration of a bus level setting circuit as an 11th embodiment of signal transmission system to which the present invention is applied;

FIG. 53 is a diagram for explaining the operation of the bus level setting circuit of FIG. 52;

FIG. 77 is a diagram showing local data bus precharge levels in a semiconductor memory device as an 18th embodiment of the signal transmission system to which the present invention is applied.

DESCRIPTION OF THE PREFERRED EMBODIMENTS

Before describing the preferred embodiments of the present invention, prior art semiconductor memory devices and problems associated with the semiconductor memory devices will be described with reference to drawings.

Figure 1:
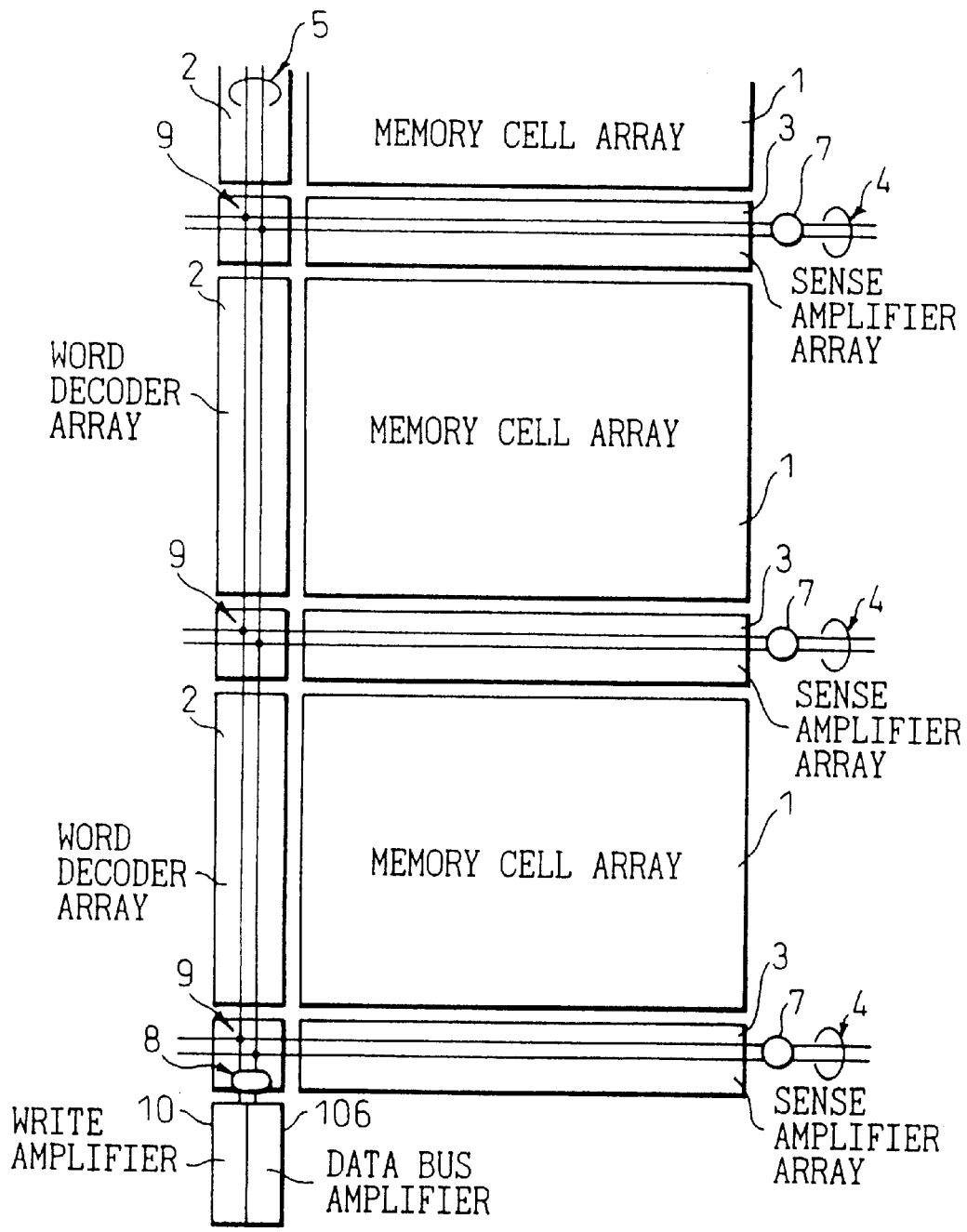
FIG. 1 is a block diagram showing one example of a prior art semiconductor memory device in schematic form.

FIG. 1 is a block diagram showing in schematic form one example of a prior art semiconductor memory device (a semiconductor memory device that requires precharge operations). In FIG. 1, reference numeral 1 is a memory cell array, 2 is a word decoder (word decoder array), 3 is a sense amplifier (sense amplifier array), 4 is a local data bus, 5 is a global data bus, 106 is a data bus amplifier, 7 is a local data bus precharge circuit, 8 is a global data bus precharge circuit, 9 is a local bus switch, and 10 is a write amplifier.

As shown in FIG. 1, the prior art semiconductor memory device (memory cell array section of a DRAM) comprises a plurality of memory cell arrays 1, word decoders (word decoder arrays) 2, sense amplifiers (sense amplifier arrays) 3, local data buses 4, and global data buses 5. The prior art semiconductor memory device further comprises data bus amplifiers 106 for amplifying data on the global data buses 5 when reading out data, local data bus precharge circuits 7 for precharging the local data buses 4, global data bus precharge circuits 8 for precharging the global data buses 5, local bus switches 9 for controlling the connections between the global data buses (GDB, /GDB) 5 and the local data buses (LDB, /LDB) 4, and write amplifiers 10 for writing data to the memory cells.

Figure 2:
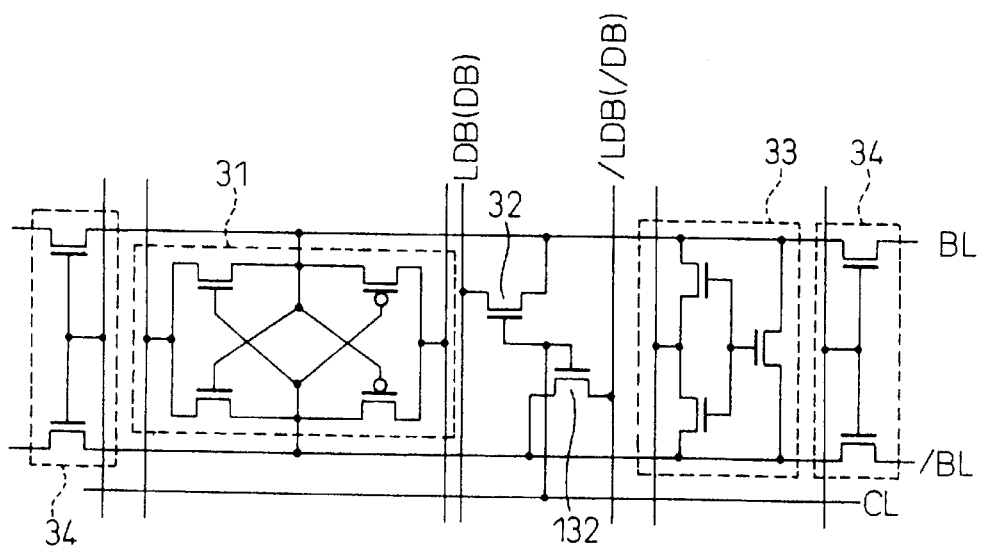
FIG. 2 is a circuit diagram showing one example of a sense amplifier in the semiconductor memory device of FIG. 1.

FIG. 2 is a circuit diagram showing one example of the sense amplifier 3 in the semiconductor memory device of FIG. 1.

As shown in FIG. 2, the sense amplifier 3 comprises a latch-type sense amplifier 31, a column transfer gate 32, a bit line short/precharge circuit 33, and a bit line transfer gate 34. Here, reference characters BL and /BL designate complementary bit lines, LDB and /LDB denote complementary local data buses, and CL indicates a column selection line.

Figure 3:
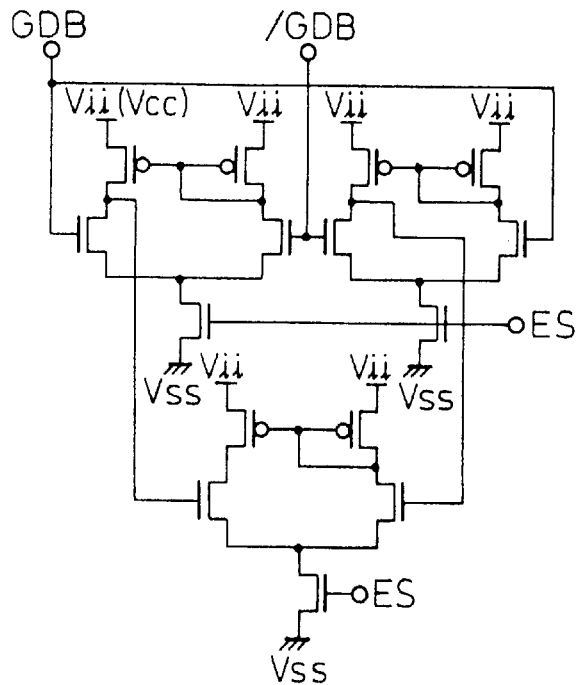
FIG. 3 is a circuit diagram showing one example of a data bus amplifier in the semiconductor memory device of FIG. 1.
Figure 4:
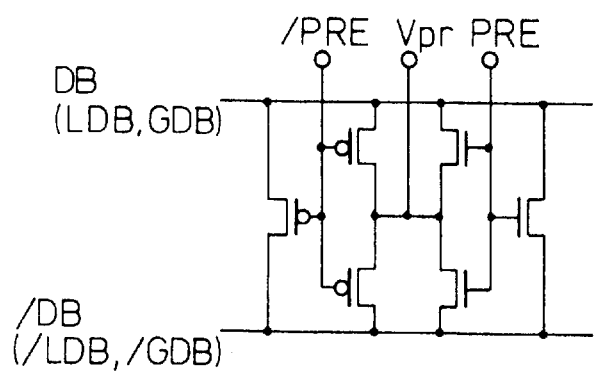
FIG. 4 is a circuit diagram showing one example of a data bus short/precharge circuit in the semiconductor memory device of FIG. 1.

FIG. 3 is a circuit diagram showing one example of the data bus amplifier in the semiconductor memory device of FIG. 1, and FIG. 4 is a circuit diagram showing one example of the data bus short/precharge circuit (global data bus precharge circuit 8 or local data bus precharge circuit 7) in the semiconductor memory device of FIG. 1.

As shown in FIGS. 3 and 4, the data bus amplifier 106 and the global data bus precharge circuit 8 (local data bus precharge circuit 7) are each constructed with a plurality of P-channel MOS transistors (PMOS transistors) and N-channel MOS transistors (NMOS transistors). Here, reference characters DB and /DB show the complementary data buses(complementary global data buses GDB and /GDB, or complementary local data buses LDB and /LDB), PRE and /PRE denote complementary precharge control signals, Vpr indicates a precharge reference voltage, and ES designates an enable signal. Further, reference character Vii indicates a high-level supply voltage (Vcc) and Vss denotes a low-level supply voltage.

Figure 5:
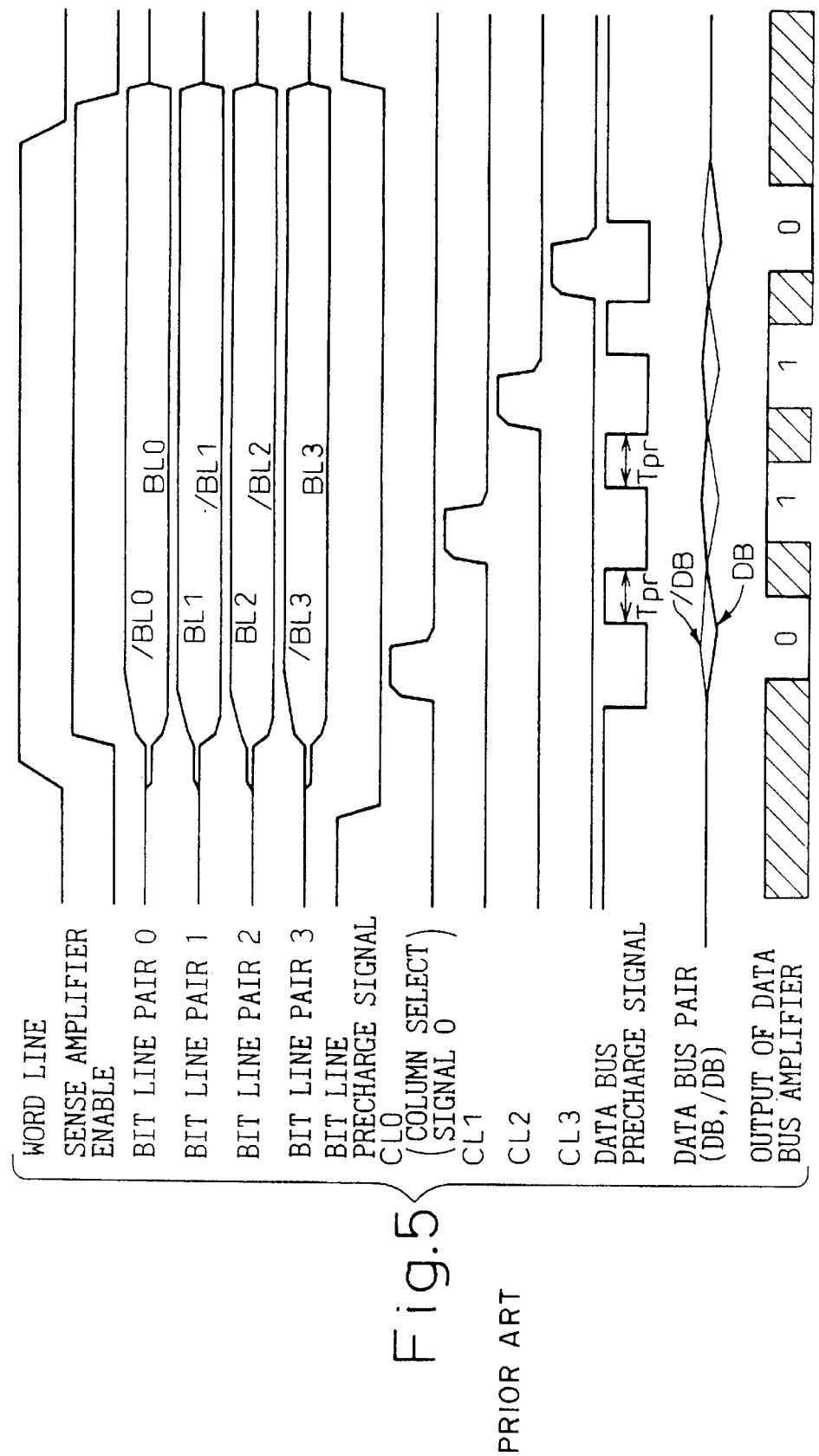
FIG. 5 is a waveform diagram for explaining one example of a data readout sequence in the semiconductor memory device of FIG. 1.

FIG. 5 is a waveform diagram for explaining one example of a data readout (burst read) sequence in the semiconductor memory device of FIG. 1. FIG. 5 shows the case where the output is high "H" (data "1") when the data bus amplifier 106 is disabled. The burst read mentioned here is a data read method employed, for example, for synchronous DRAMs (SDRAMs), in which data in the memory cells connected to the same word line are read out at one time without a break.

As shown in FIG. 5, for the burst data read operation in the prior art semiconductor memory device, when the semiconductor memory device is constructed using the complementary data buses DB, /DB and complementary bit lines BL, /BL (BL0, /BL0 to BL3, /BL3), for example, the bit lines BL, /BL and data buses DB, /DB are first precharged to a predetermined level (precharge reference voltage Vpr) for a predetermined precharge period (Tpr); in particular, each complementary bit line or complementary data bus is precharged to the same potential as that of the other of the complementary pair.

Further, as shown in FIGS. 4 and 5, in the data read operation, when data appears on the bit line pair BL, /BL (BL0, /BL0 to BL3, /BL3), a differential voltage occurs on the bit line pair BL, /BL initially precharged to the same potential and, after amplifying this voltage differential to some degree by the sense amplifier 3 (latch-type sense amplifier 31), the column transfer gate 32 corresponding to the selected column address is opened (turned on). That is, by sequentially applying column select signals CL0 to CL3, the potential on each of the bit line pairs BL0, /BL0 to BL3, /BL3 is transferred to the local data bus pair DB, /DB (LDB, /LDB) 4 initially precharged to the same potential. The voltage differential is then transferred via the local data bus switch 9 to the global data bus pair DB, /DB (GDB, /GDB) 5 initially precharged to the same potential, is amplified by the global data bus amplifier (data bus amplifier 106), and is output as readout data via a buffer, another amplifier, etc.

When reading the next data, with the sense amplifier 3 remaining activated the local data buses (paired) 4 and the global data buses (paired) 5 are precharged to initialize the system. After that, the column transfer gate 32 is opened, and the resulting voltage differential is transferred to the local data buses 4 and the global data buses 5, is amplified by the global data bus amplifier 106, and is output as readout data in the same manner as described above.

For a data write operation, on the other hand, usually the global data bus pair GDB, /GDB (5) and local data bus pair LDB, /LDB,(4) are already precharged and, in this condition, the write amplifier 10 activated by a write signal drives the global data bus pair; that is, the write amplifier 10 fully drives the global data buses GDB and /GDB (DB and /DB) 5, for example, one up to the high-level supply voltage Vii (Vcc) and the other down to the low-level supply voltage Vss in accordance with data "1" or "0" to be written. The information ("1" or "0") on the global data bus pair is transferred to the local data bus pair LDB, /LDB (DB, /DB) 4 via the selected local data bus switch 9, usually without causing level loss, and the local data buses LDB and /LDB are fully driven, for example, one up to the high-level supply voltage Vii and the other down to the low-level supply voltage Vss in accordance with the data "1" or "0".

The information ("1" or "0") on the local data bus pair is then transferred to the selected sense amplifier 3 via the column transfer gate 32 selected in accordance with the column address. Actually, the structure is such that a number of data bus/sense amplifier ratios (capacitance ratios and transistor Gm ratios) are satisfied across the column transfer gate 32, and inversion of the sense amplifier 3 (data write) takes place in accordance with the information on the data bus. As a result, the complementary bit lines connected to the sense amplifier are inverted, and the data is written into the memory cell connected to the bit lines and selected by the word line.

From the standpoint of improving the data read speed, the present inventor et al. proposed, in Japanese Patent Unexamined Publication No. 9-262507, a high-speed data read system that eliminated the need for precharging during continuous column read periods by employing a partial response detection (PRD) method for data transfers on data buses.

PRD is an interface system for high-speed chip-to-chip data transmission invented by the present inventor et al. For PRD, reference is made, for example, to H. Tamura, M. Saito, K. Gotoh, S. Wakayama, J. Ogawa, Y, Kato, M. Taguchi, T. Imamura, "Partial Response Detection Technique for Driver Power Reduction in High-Speed Memory-to-Processor Communications," 1997 IEEE International Solid-State Conference, ISSC97/SESSION 20/CLOCKING AND I/O/PAPER SA 20.7, pp. 342–343.

To describe PRD briefly, if it is attempted to transmit on a band-limited transmission line a signal of bandwidth greater than that of the transmission line, the signal will be disrupted because of the intersymbol interference component of the signal. The PRD method is a technique for recovering the original signal from the disrupted signal (that is, regenerating correct data from the disrupted signal) by eliminating (estimating) the intersymbol interference component. Since the PRD method not only eliminates the intersymbol interference component but also creates a reference level by itself during the process of intersymbol interference elimination, it becomes possible to transmit data without precharging the transmission line, which is a hidden characteristic of the PRD method. Therefore, the characteristic that enables data to be transmitted without requiring precharge is utilized to eliminate data bus precharge times from data read cycles.

Furthermore, when the PRD method is used, if data in the previous cycle remains on the transmission line, a certain degree of data overlap is allowed as long as the next data arrives at the receiving end after the previous data arrives. That is, when this characteristic is utilized for a memory bus, a certain degree of overlapping of column transfer gate selections is also allowed. Moreover, the PRD method reduces bus amplitude, and can theoretically eliminate the need for precharge (though the precharge need not necessarily be eliminated), as a result of which power consumption due to charging and discharging of the bus can also be reduced. Additionally, with the PRD method, it becomes possible to increase the data rate by appropriately designing the circuit, and no major modifications need be made to the core elements (sense amplifiers, memory cell arrays, word decoders, etc.) of the conventional memory.

Figure 6A:
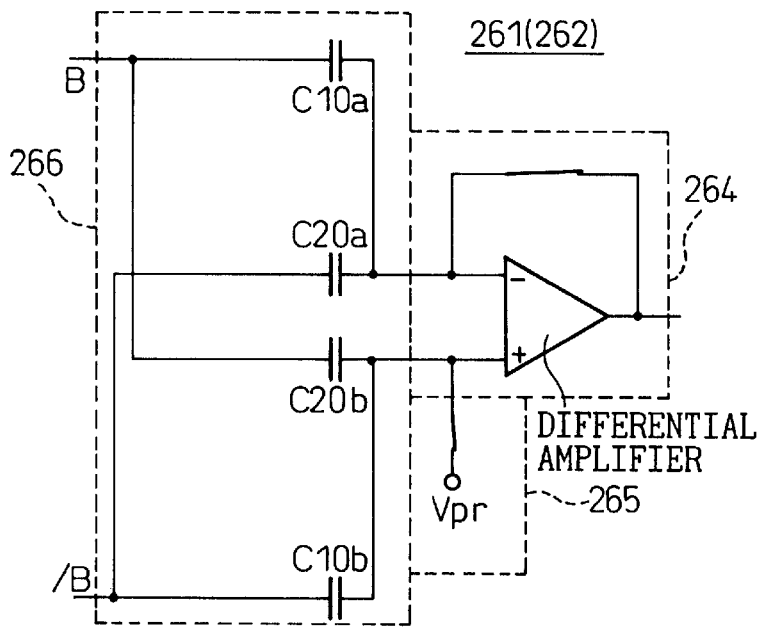
FIGS. 6A and 6B are diagrams for explaining the operation of a PRD-type complementary amplifier as an example of the related art.
Figure 6B:
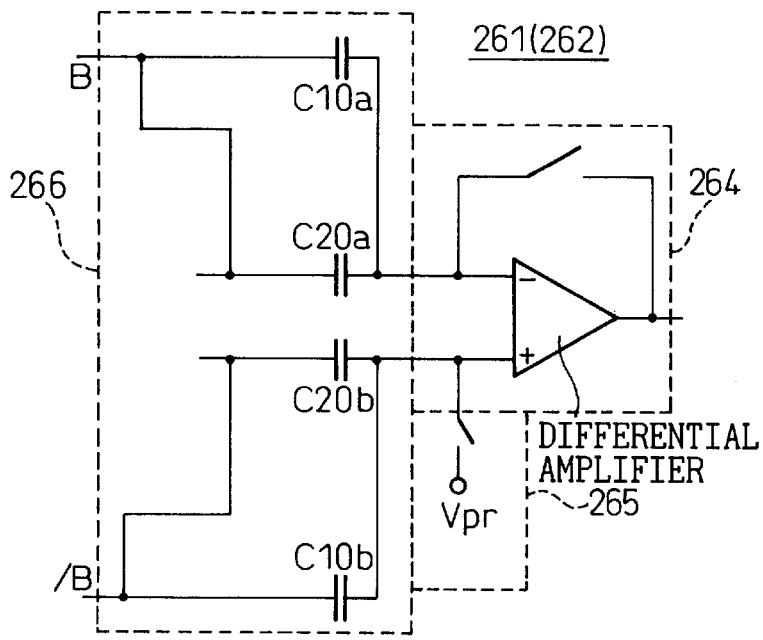

FIGS. 6A and 6B are diagrams for explaining the operation of a PRD-type complementary amplifier as an example of the related art: FIG. 6A shows an intersymbol interference elimination preparation and auto-zero operation, and FIG. 6B shows a signal decision operation. The PRD-type complementary amplifier (206) shown here comprises two PRD amplifiers 261 and 262 which operate in interleaving fashion and a multiplexer (MUX) 266 which alternately selects the outputs of the PRD amplifiers. Each PRD amplifier 261 (262) comprises a differential amplifier 264, an amplifier precharge circuit 265, and a PRD functional block 266.

First, as shown in FIG. 6A, at a first timing (the first-half period of the interleave operation) the intersymbol interference component estimation operation is performed while, at the same time, performing an operation to eliminate the input offset of the differential amplifier 264 itself by electrically short-circuiting one input and the output of the differential amplifier 264. At the same time, the other input of the differential amplifier 264 is precharged by the precharge circuit 265 to a level (Vpr) that enhances the sensitivity of the differential amplifier 264.

Next, as shown in FIG. 6B, at a second timing (the second-half period of the interleave operation) the data decision operation (intersymbol interference component elimination operation) is performed. At this time, the short circuit between the input and output of the differential amplifier 264 is open, and the precharging by the precharge circuit 265 is also stopped.

As described, in the operation of the PRD-type complementary amplifier shown in FIGS. 6A and 6B, a function (auto-zero function) to eliminate the input offset, a shortcoming of a complementary-type differential amplifier, is provided. With the elimination of the input offset, it becomes possible to detect, regenerate, and amplify weak signals.

Figure 7A:
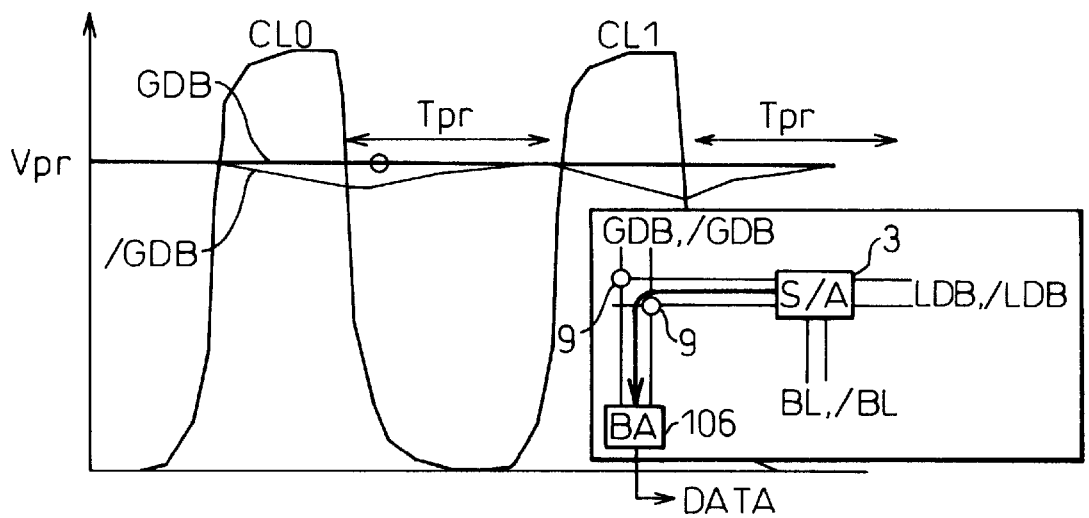
FIGS. 7A and 7B are diagrams for explaining read operations in the prior art and related art semiconductor memory devices.
Figure 7B:
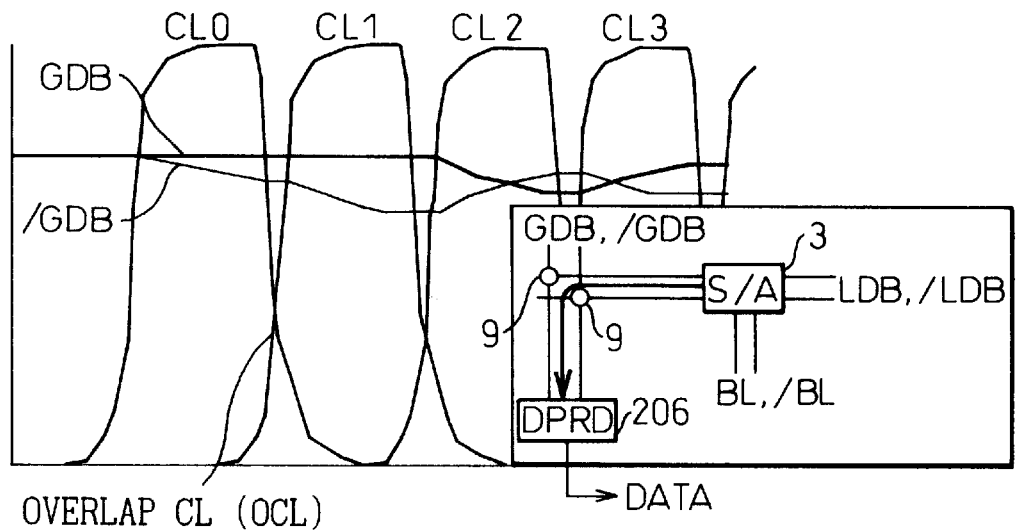

FIGS. 7A and 7B are diagrams for explaining read operations in the prior art and related art semiconductor memory devices: FIG. 7A shows the read operation in the prior art semiconductor memory device (using the conventional data bus amplifier 6), and FIG. 7B shows the read operation in the semiconductor memory device (using the PRD-type data bus amplifier 206) of the related art shown in FIGS. 6A and 6B.

First, as shown in FIG. 7A, in the prior art semiconductor memory device which uses the conventional data bus amplifier 106, the bus (local data bus and global data bus) precharge operation, that is, the initialize operation, must be performed for each readout data. Even when outputting dada synchronously with the clock, these buses usually have large capacitances and, therefore, take a time Tpr to precharge; for example, the precharge time accounts for about half of one clock cycle.

On the other hand, as shown in FIG. 7B, in the related art semiconductor memory device which uses the PRD-type data bus amplifier 206, not only the need for the precharge time Tpr in FIG. 7A is eliminated, but the selection of each column transfer gate (the timing for outputting column select signals CL0, CL1, CL2, ... ) is allowed to overlap in time with the preceding and succeeding column transfer gate selections, thereby achieving a dramatic increase in data rate for data read out of the semiconductor memory device.

Figure 8:
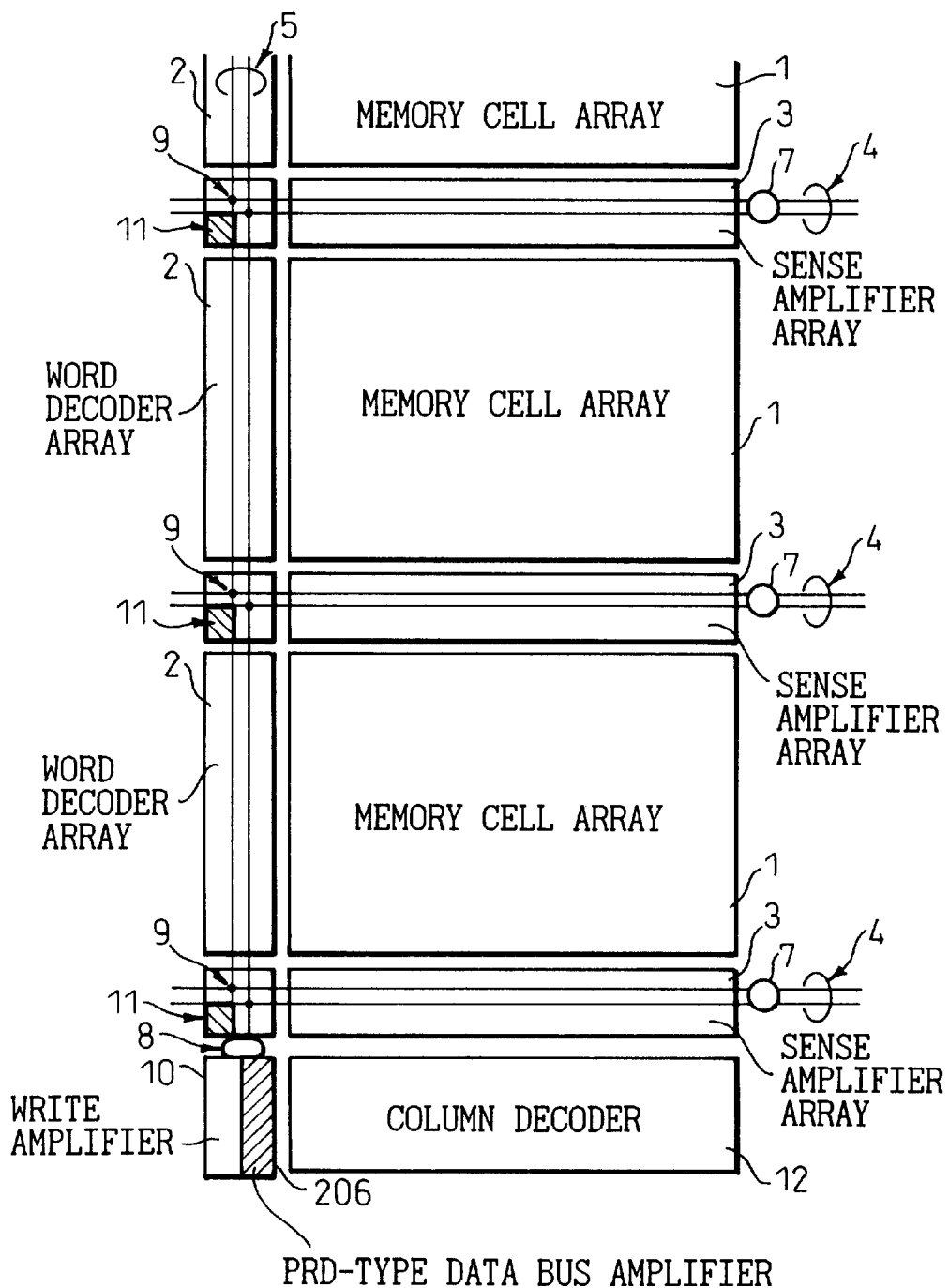
FIG. 8 is a block diagram showing in schematic form one example of a semiconductor memory device to which a PRD-type data bus system of the related art is applied.

FIG. 8 is a block diagram showing in schematic form one example of the semiconductor memory device to which the PRD-type data bus system of the related art is applied. In FIG. 8, reference numeral 1 is a memory cell array, 2 is a word decoder, 3 is a sense amplifier, 4 is a local data bus, 5 is a global data bus, 7 is a local data bus precharge circuit, 8 is a global data bus precharge circuit, 9 is a local data bus switch, 10 is a write amplifier, 11 is a sense amplifier driver, 12 is a column decoder (column decoder array), and 206 is a PRD-type data bus amplifier (PRD-type complementary global data bus amplifier).

As shown in FIG. 8, the related art semiconductor memory device (memory cell array section of a DRAM) comprises a plurality of memory arrays 1, word decoders 2, sense amplifiers 3, local data buses 4, and global data buses 5. The related art semiconductor memory device further comprises PRD-type data bus amplifiers 206 for amplifying data on the global data buses 5 when reading out data, local data bus precharge circuits 7 for precharging the local data buses 4, global data bus precharge circuits 8 for precharging the global data buses 5, local data bus switches 9 for controlling the connections between the global data buses 5 and the local data buses 4, and write amplifiers 10 for writing data to the memory cells. Furthermore, the semiconductor memory device of the related art comprises column decoders 12 for selecting column transfer gates, as will be described later, and sense amplifier drivers 11 for driving the sense amplifiers 3. Here, the local data bus switches 9 are each constructed, for example, from an NMOS or PMOS complementary transfer gate.

Figure 9:
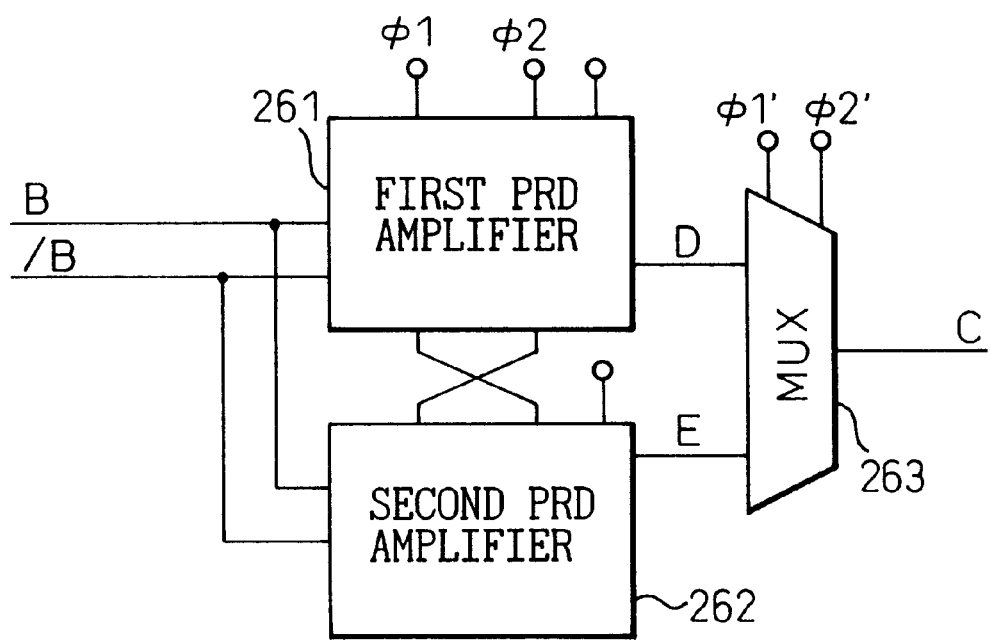
FIG. 9 is a diagram showing one example of a bus amplifier in the semiconductor memory device of FIG. 8.

FIG. 9 is a diagram showing one example of the bus amplifier 206 in the semiconductor memory device of FIG. 8. Here, the global data bus 5 in FIG. 8 corresponds to the complementary buses B, /B in FIG. 9.

As shown in FIG. 9, the bus amplifier (PRD-type data bus amplifier) 206 is constructed as a complementary differential bus amplifier, and comprises first and second PRD amplifiers 261 and 262 and a multiplexer (MUX) 263. Here, the bus amplifier 206 operates the two PRD amplifiers 261 and 262 in interleaving fashion, alternately performing signal regeneration and amplification and thereby achieving high-speed signal transmission. More specifically, high-speed data transmission is achieved by performing interleaving operations such that one PRD amplifier (the first PRD amplifier 261) estimates the intersymbol interference component while the other PRD amplifier (the second PRD amplifier 262) is making a decision on data, and at the next timing, the one PRD amplifier (the first PRD amplifier 261) makes a decision on data while the other PRD amplifier (the second PRD amplifier 262) is estimating the intersymbol interference component.

Here, in the PRD amplifier that is performing the intersymbol interference component estimation operation, precharging of the same PRD amplifier is being performed at the same time. Since this precharging is performed in the background during the interleave data read period, the precharge time does not affect the data transfer cycle.

Figure 10:
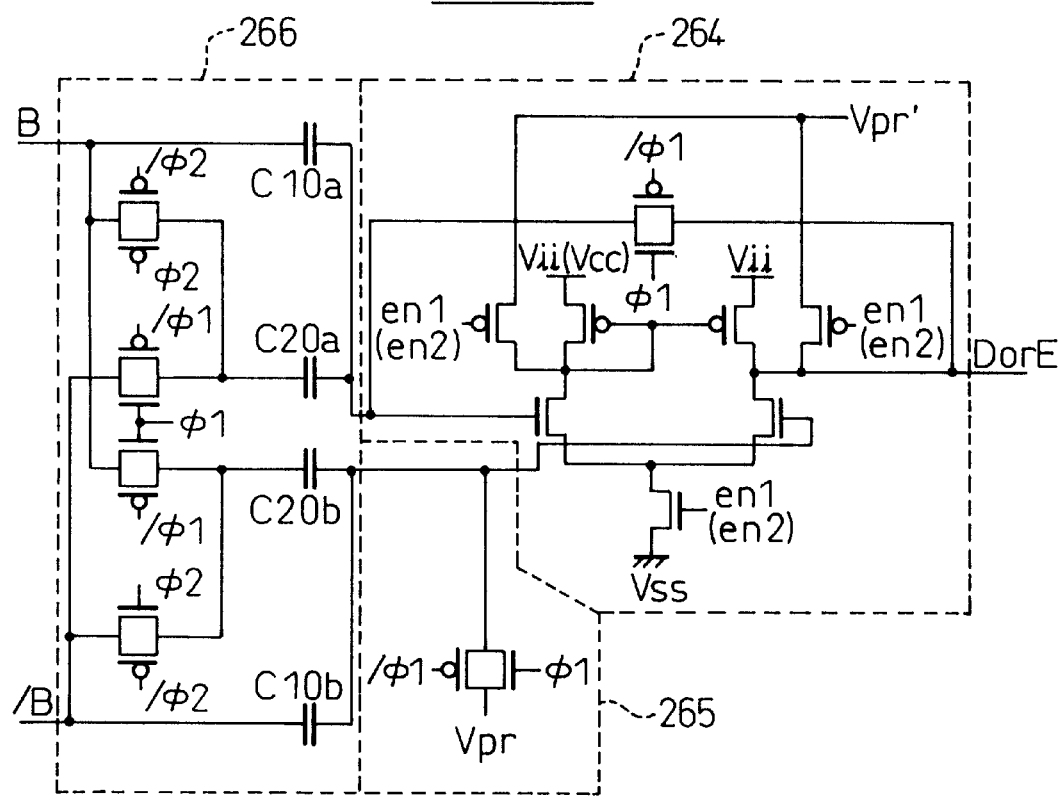
FIG. 10 is a circuit diagram showing one example of a PRD amplifier configuration in the bus amplifier of FIG. 9.

FIG. 10 is a circuit diagram showing one example of the PRD amplifier unit 261 (262) in the bus amplifier of FIG. 9.

As shown in FIG. 10, each PRD amplifier 261 (262) comprises: a PRD functional block 266 consisting of four transfer gates, the switching operations of which are controlled by control signals $\phi 1$, $\phi 2$ ($/\phi 1$, $/\phi 2$), and four capacitors (C10a, C10b, C20a, and C20b); and a differential amplifier 264 and amplifier precharge circuit 265 provided on the output side of the PRD functional block 266. Here, the differential amplifier 264 is constructed as a current-mirror type differential amplifier so that a prescribed precharge voltage Vpr' is applied to the sources of the PMOS transistors controlled by enable signals en (en1, en2). The precharge circuit 265 is coupled to one input of the current-mirror type differential amplifier 264, the other input and the output of which are connected by a transfer gate whose switching operation is controlled by the control signals $\phi 1$ ($/\phi 1$). The precharge operation of the amplifier precharge circuit 265 is controlled by the control signals $\phi 1$ ($/\phi 1$).

Here, when the value of the capacitors C10a and C10b is denoted by C10, and the value of the capacitors C20a and C20b by C20, theoretically intersymbol interference can be estimated (eliminated) perfectly if these capacitor values C10 and C20 are determined so as to satisfy the equation $C10/(C10+C20)=(1+\exp(-T/\tau))/2$. This is true in an ideal condition, but in practice, because of the presence of parasitic capacitances, etc. the capacitor values are chosen to provide a capacitance ratio close to the ratio that satisfies the above equation. In the above equation, $\tau$ is the time constant of the bus 200, and T is the cycle of one bit or the time one-bit data appears on the bus.

Figure 11:
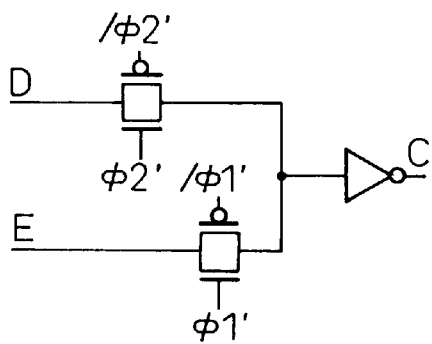
FIG. 11 is a circuit diagram showing one example of a multiplexer in the bus amplifier of FIG. 9.

FIG. 11 is a circuit diagram showing one example of the multiplexer (MUX) 263 in the bus amplifier of FIG. 9.

As shown in FIG. 11, the multiplexer 263 consists of an inverter and two transfer gates controlled by control signals $\phi 1'$, $/\phi 1'$ and $\phi 2'$, $/\phi 2'$. The multiplexer 263 selects the outputs of the PRD amplifiers 261 and 262 in turn for output.

The sense amplifier 3 is the same as the sense amplifier in the prior art semiconductor memory device described with reference to FIG. 2.

Figure 12:
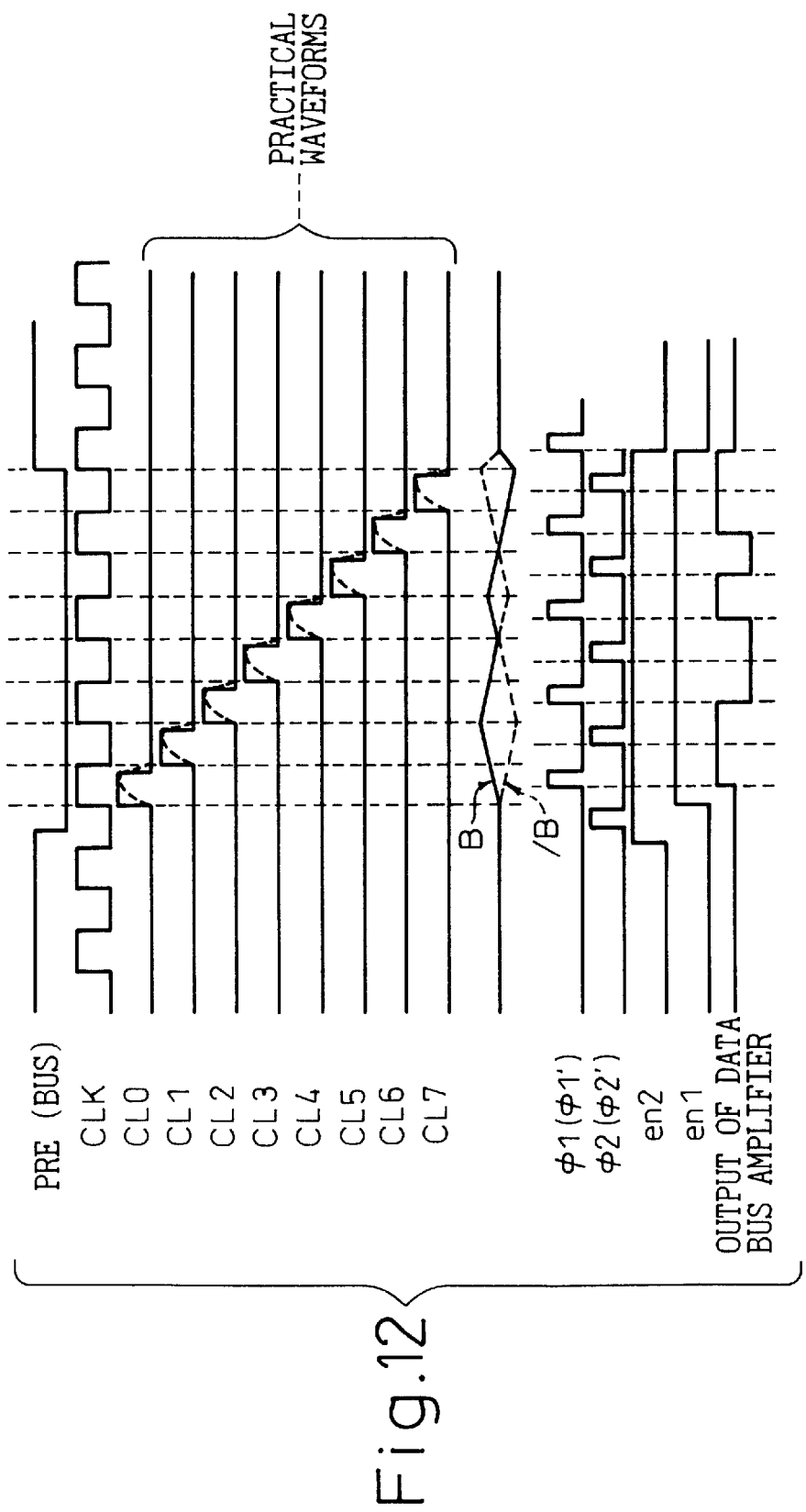
FIG. 12 is a diagram showing one example of the bus and bus amplifier operating waveforms in the semiconductor memory device of FIG. 8.

FIG. 12 is a diagram showing one example of the bus and bus amplifier operating waveforms in the semiconductor memory device of FIG. 8. An example of a read operation with a burst length of 8 (in blocks of 8 bits: CL0 to CL7) is shown here. Here, the control signals $\phi 1'$ (/ 1') and $\phi 2'$ ($/\phi 2'$) are substantially the same as the control signals $\phi 1$ ($/\phi 1$) and $\phi 2$ ($/\phi 2$), except that the timing is slightly different.

As shown in FIG. 12, in the semiconductor memory device (DRAM using the PRD-type data bus amplifier 206) shown in FIG. 8, the PRD amplifier 261 and 262 are driven in interleaving fashion in accordance with the control signals $\phi 1$ and $\phi 2$ ($\phi 1'$ and $\phi 2'$), and the outputs of the PRD amplifiers 261 and 262 are selected in turn by the MUX 263 to produce the output (C: read data) of the data bus amplifier 206.

The PRD-type data bus amplifier 206 is constructed so that when there is no data on the data bus B, /B (200: 5), the precharge control signal PRE is set to a high level "H" to precharge the data bus. It is also possible to configure the system so that bus precharging is not performed under any circumstances; in that case, the local data bus and global data bus short/precharge switches, etc. can be eliminated. Furthermore, it is also possible to perform a precharge selectively; for example, when the next read operation is expected to begin immediately, precharge is not performed, or precharge is performed by supplying a bus precharge command from the outside, or precharge is performed only before a write operation to ensure smooth operation of the write amplifier 10. Further, the bus amplifier 206 (the PRD amplifiers 261, 262) has an auto-zero function so that data can be detected and amplified even when the voltage change appearing on the data line is extremely small.

Moreover, since capacitors are inserted between the buses (B, /B) and the inputs of the current-mirror amplifier (differential amplifier 264) in the bus amplifier 206, the inputs of the amplifier can be set at such levels that most enhance the sensitivity of the current-mirror amplifier. This makes it possible to amplify even smaller voltage changes.

Here, since the auto-zero and precharge operations are performed in the background during the interleave data read period, these operations do not affect data transfer cycles (do not increase cycle times). Further, as shown in FIG. 12, the enable signal en1 supplied to the first PRD amplifier 261 is output at a timing delayed by one bit from the enable signal en2 supplied to the second PRD amplifier 262, so as to prevent an unwanted signal from being output from the MUX 263.

Since signal transmission can be performed by eliminating the bus precharge time, as described above, the related art semiconductor memory device using the PRD technique can more than double the data transfer rate, for example, when reading data. However, the above semiconductor memory device using the PRD technique has the following problems yet to be solved.

First, in a memory architecture such as in conventional DRAMs, each time switching occurs from one row block to the next (memory cell array blocks at the row side), column seamless read is interrupted, and a long row access latency, including the time to reset the previous row block, is required before the next row block can be accessed.

Furthermore, if column seamless operation is performed by quickly switching the bus switch between row blocks in order to achieve high-speed operation, in the case of the prior art semiconductor memory device (using the conventional data bus amplifier) shown in FIG. 1 the row decoder cannot handle the operation, and there occurs a possibility that the same column select signal CL may be fed to both the row block being reset and the row block being activated, causing unselected sense amplifiers (S/As) to perform erroneous write operations. Moreover, when a non-PRD type bus amplifier is used, the residual voltage value in the bus information carrying the previous cycle history may result in noise, and the bus amplifier may malfunction unless a high-speed precharge is performed. High-speed seamless operations are therefore not possible.

Even when the PRD method is applied to the bus amplifier (the semiconductor memory device using the PRD-type data bus amplifier), if column seamless operation is performed by quickly switching the bus switch between row blocks, the row decoder still cannot handle the operation and, in this case also, the possibility of unselected sense amplifiers performing erroneous write operations becomes a problem if the pulse duration of the column select signal CL is long. Furthermore, since the possibility of unselected sense amplifiers performing erroneous write operations presents a problem also to the write amplifier, the overall speed of the semiconductor memory device cannot be improved by simply applying the PRD method to the read amplifier (data bus amplifier). As for the problem of noise resulting from the residual voltage value in the bus information carrying the previous cycle history, there is a possibility that, for stored information (LSI information), large inverse signals (information) that can cause noise may be input to the PRD-type bus amplifier, and in order for the bus amplifier, immediately after switching, to correctly detect information, the sense amplifier must supply information at high speed to the bus (bus pair) and must quickly bring the differential voltage on the bus pair to a level greater than a predetermined level. As a result, the high speed performance obtained by the application of the PRD method is limited because of the switching latency time, that is, the cycle time performance is restricted.

Furthermore, if a high-speed read operation is made possible by applying the PRD method to the data bus amplifier, this will do nothing to improve the write operation speed. That is, in a write operation, information from the write amplifier flows in a direction opposite to the direction in the case of a read operation, that is, the write information flows from the global data bus to the memory cell via the local data bus switch, the local data bus, the column gate, the sense amplifier, and the bit line pair in the order stated; therefore, if the PRD method is applied to the data bus amplifier, it does not have any effect in increasing the write operation speed, as a matter of course.

The preferred embodiments of the signal transmission system according to the present invention, the receiver circuit for use in the signal transmission system, and the semiconductor memory device to which the signal transmission system is applied will be described below with reference to drawings.

Figure 13:
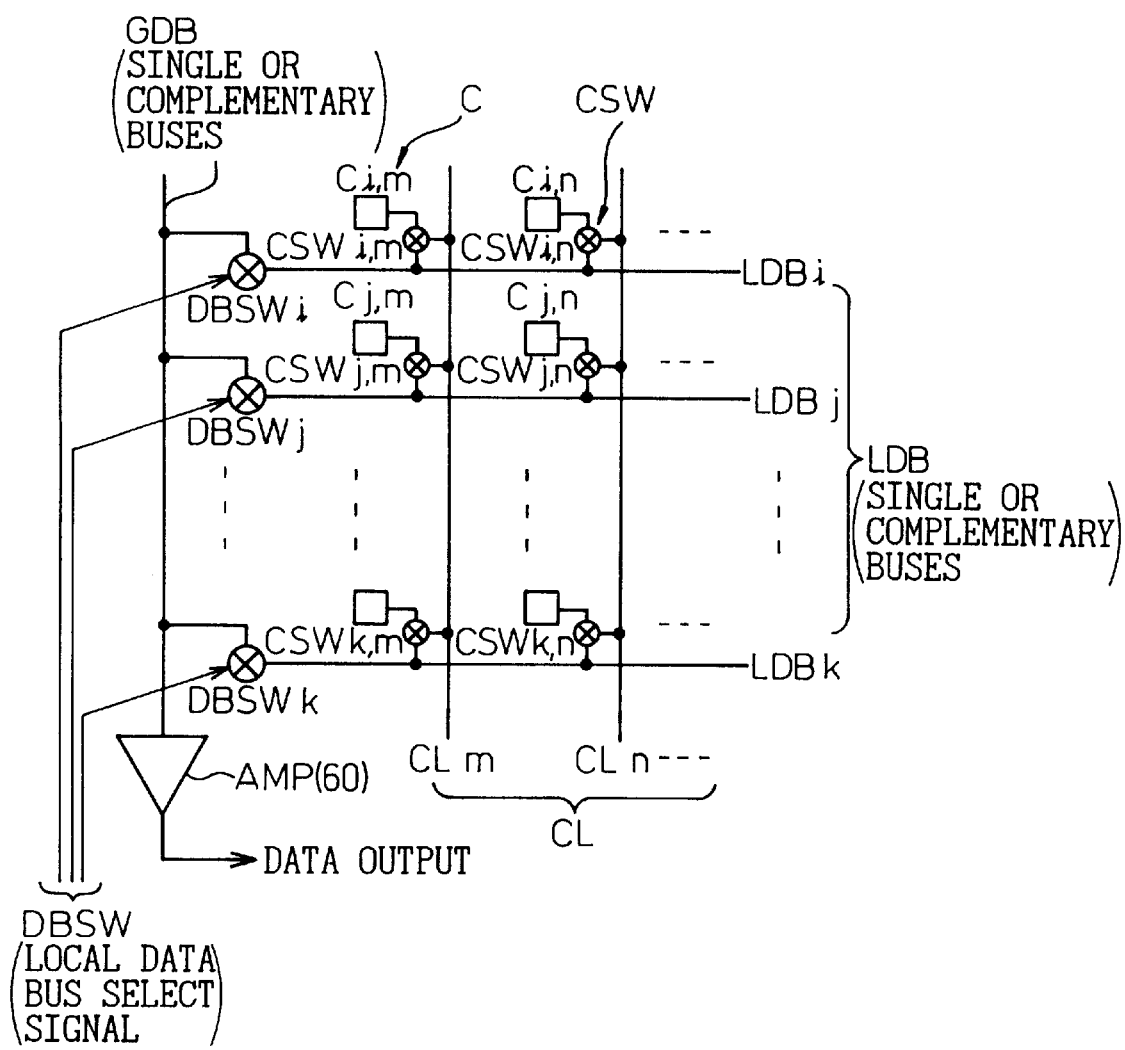
FIG. 13 is a diagram conceptually illustrating a hierarchical bus structure as a first embodiment of the signal transmission system to which the present invention is applied.

FIG. 13 is a diagram conceptually illustrating a hierarchical bus structure as a first embodiment of the signal transmission system to which the present invention is applied. In FIG. 13, reference character GDB is a global data bus (i.e., signal transmission line) (5), LDB (LDBi, LDBj, . . . , LDBk) are local data buses (i.e., switchable transmission line) (4), DBSW (DBSWi, DBSWj, . . . , DBSWk) are data bus switches (9), CL (CLm, CLn, . . . ) are column selection lines (column select signals), C (Ci,m, Cj,m, . . . , Ck,m; Ci,n, Cj,n, . . . , Ck,n) are units (i.e., target units), and CSW (CSWi,m, CSWj,m, . . . , CSWk,m; CSWi,n, CSWj,n, . . . , CSWk,n) are column switches. Here, the unit C, in the case of a semiconductor memory device (DRAM), for example, is a memory cell or a sense amplifier, or a flip-flop or the like with a driver. The global data bus (global bus) GDB and the local data bus (local bus) LDB may be constructed either in a single bus structure or in a complementary bus structure.

As shown in FIG. 13, in the bus system (hierarchical bus system) of the first embodiment, the global data bus (GDB) and the plurality of local data buses (LDB: LDBi, LDBj, . . . , LDBk) connected to it are organized in a hierarchical structure. The local data buses LDBi, LDBj, . . . , LDBk are connected, one at a time, to the global data bus GDB by the respective data bus switches DBSWi, DBSWj, . . . , DBSWk. Local data bus select signals (row select signals) for selecting and switching the respective local bus switches are supplied to the an respective local bus switches DBSW.

At least one unit C (Cx,y) from which to read information is subordinate (belongs) to each local bus LDB, each unit C being coupled to the local data bus LDB by its associated column switch CSW (corresponding to a column gate). In FIG. 13, each column gate CSW is selected by the column select signal CL.

In the first embodiment shown in FIG. 13, each column select signal CL is supplied simultaneously to the column switches CSW on the units belonging to different local data buses LDB. However, though not shown here, each column select signal need not necessarily activate or deactivate the switches on the units on all the local data buses; likewise, between the local buses, the number of units belonging to each local bus need not be made equal. Furthermore, the bus system may be configured so that each unit C is directly subordinate to the global data bus GDB. The minimum requirement here is that a plurality of (two or more) switchable units C be provided for the global data bus GDB and two or more local data buses LDB or units C be made directly subordinate to the global data bus GDB via switches (DBSW). Each local data bus LDB, if provided, has a plurality of (two or more) units C subordinate to it. That is, if a local data bus LDB does not have two or more units C subordinate to it, then such a bus is not called a bus, because it is equivalent to making the unit C directly subordinate to the global data bus GDB.

As shown in FIG. 13, at least one read amplifier (data bus amplifier 60) AMP (i.e., readout unit) is attached to the global data bus GDB, and the final result of the amplification is output as data. The amplification here refers to a read operation that involves amplifying the information read onto the bus from the selected target unit. As earlier described, each unit C may be constructed from a memory cell, or a sense amplifier (latch) for amplifying data read out of a memory cell, or a logic circuit (flip-flop) having a bus driver at its final stage, or other similar circuitry from which the amplifier AMP can read logic information "1" and "0".

Figure 14:
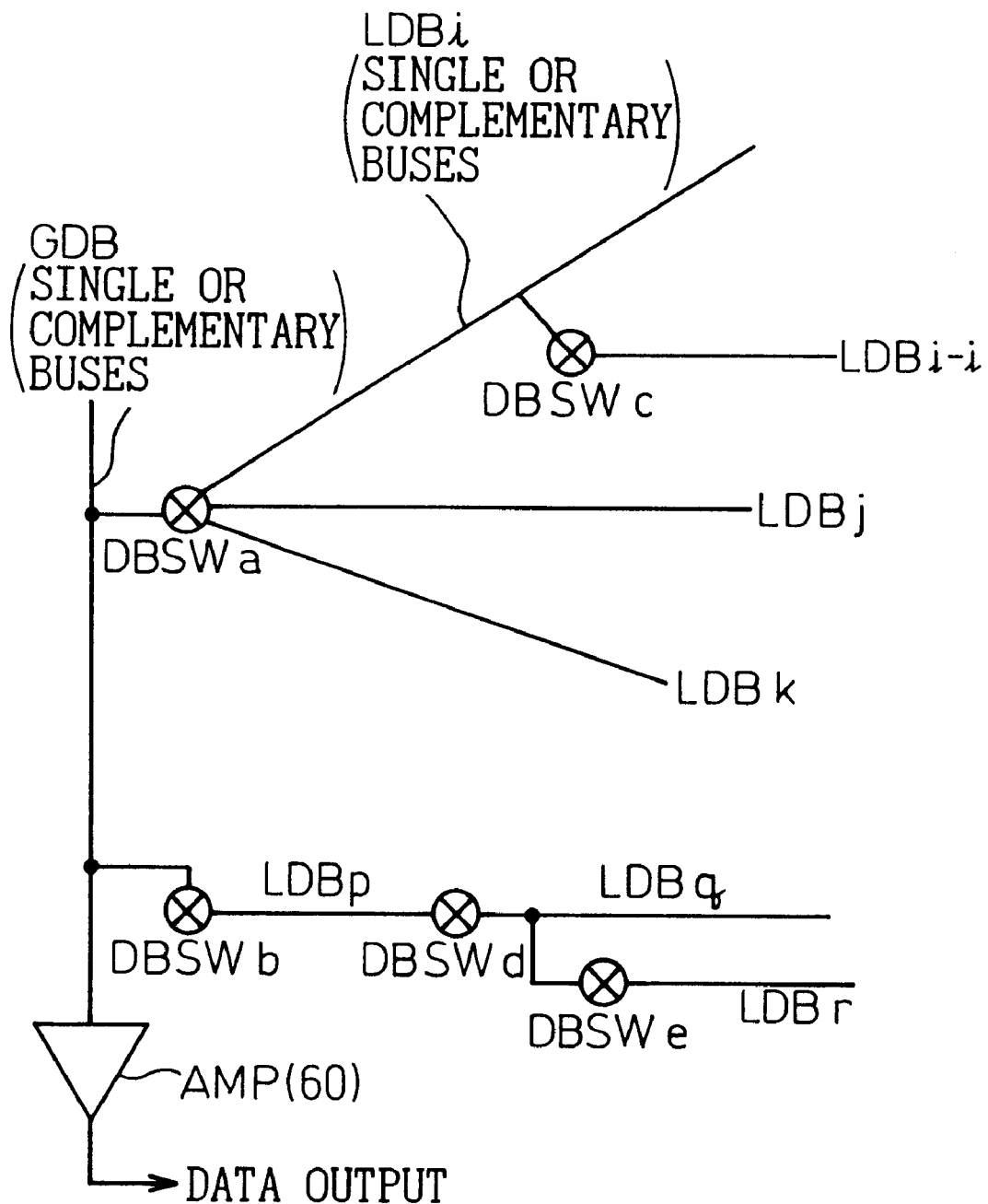
FIG. 14 is a diagram conceptually illustrating a branching bus structure as a second embodiment of the signal transmission system to which the present invention is applied.

FIG. 14 is a diagram conceptually illustrating a branching bus structure as a second embodiment of the signal transmission system to which the present invention is applied.

As shown in FIG. 14, the bus system (branching bus system) of the second embodiment comprises a global data bus (GDB) (i.e., signal transmission line) and a plurality of local data buses (LDB: LDBi, LDBi-i, LDBj, LDBk; LDBp, LDBq, LDBr) branching (i.e., switchable transmission line) out via data bus switches DBSW (DBSWa–DBSWe). The local data buses, LDBi, LDBi-i, LDBj, LDBk; LDBp, LDBq, LDBr, are connected, one at a time, to the global data bus GDB via their associated data bus switches DBSWa–DBSWe, and data is output from the read amplifier (data bus amplifier 60) AMP (i.e., readout circuit). More specifically, the local data bus LDBq, for example, is selected for connection to the global data bus GDB (amplifier 60) when the data bus switches DBSWb and DBSWd are on and the other data bus switches DWSWa, DWSWc, and DWSWe are off. The bus system may also be configured so that a plurality of data buses are subordinate to one switch, for example, like the data bus switch DBSWa. As in the first embodiment, in the second embodiment also, the global data bus GDB and the local data bus LDB may be constructed either in a single bus structure or in a complementary bus structure.

Figure 15:
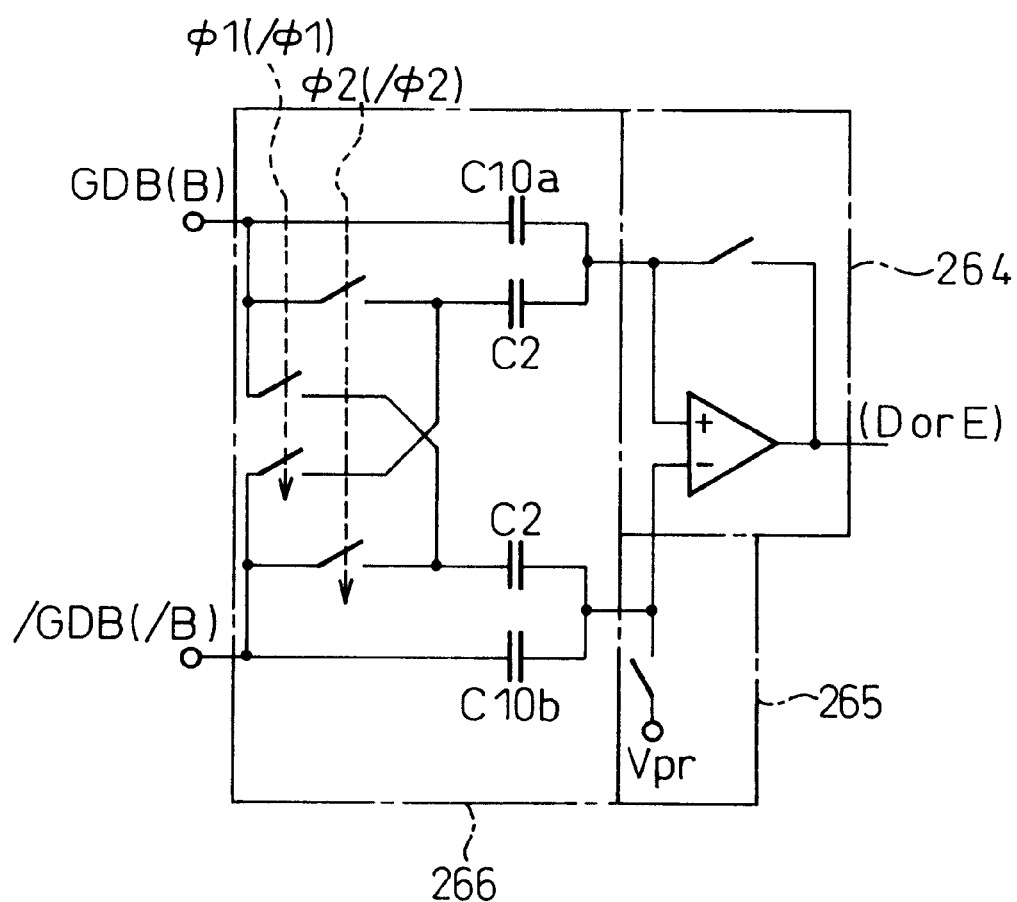
FIG. 15 is a diagram showing in simplified form one example of a PRD-type data bus amplifier in a signal transmission system of the related art.

FIG. 15 is a diagram showing in simplified form one example of the PRD-type data bus amplifier in a signal transmission system of the related art. This data bus amplifier is similar in configuration to the PRD amplifier 261 (262) previously described with reference to FIG. 10. That is, the PRD amplifier 260 estimates the intersymbol interference component at the first timing and makes a decision on data at the next timing.

Figure 16:
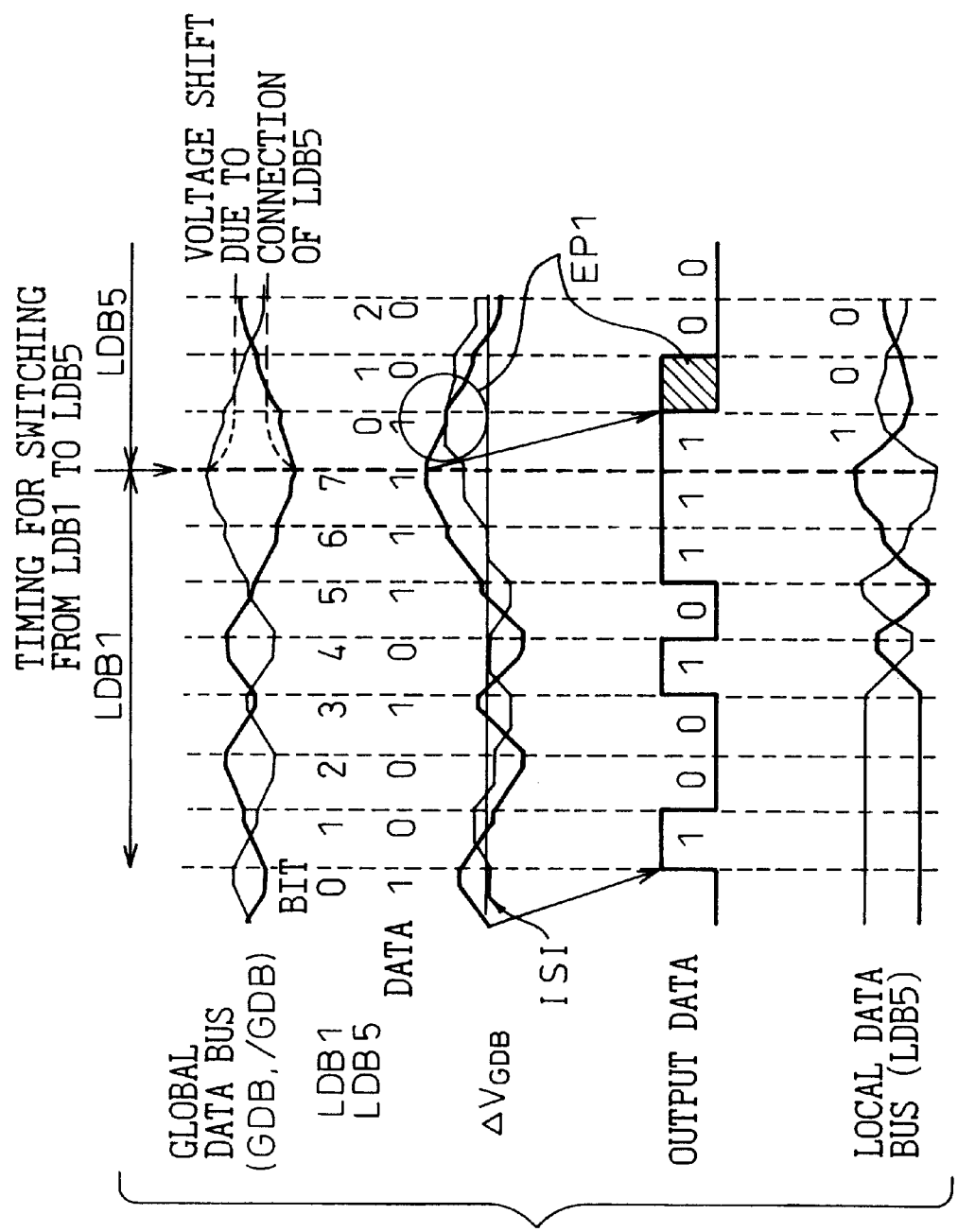
FIG. 16 is a diagram showing one example of operating waveforms in the signal transmission system for explaining the problem associated with the application of the data bus amplifier of FIG. 15.

FIG. 16 is a diagram showing one example of operating waveforms in the signal transmission system for explaining the problem associated with the application of the data bus amplifier of FIG. 15. The waveform diagram shows the operation under worst case conditions.

Here, consider the situation where the path of the readout data being supplied to the data bus amplifier via the global data bus GDB is switched from the local data bus LDB1 to the local data bus LDB5, as shown in FIG. 16. When the bus amplifier of the related art shown in FIG. 15 is used, malfunctioning could occur in the worst case, that is, if the potential on the local data bus pair LDB5, /LDB5 to which the data path is being switched is opposite in relation to the potential on the global data bus pair GDB, /GDB just before the switching is made, and if the potential difference on the local data bus pair LDB5, /LDB5 to which the data path is being switched is at its maximum value. More specifically, the voltage present on the next local data bus (LDB) pair before the switching will appear on the global data bus (GDB) after the switching, as shown in FIG. 16, but when the PRD data bus amplifier 260 of the related art shown in FIG. 15 is used, the difference between the reference level created from the potential of the bit immediately preceding the switching timing and the differential input level of the PRD data amplifier 260 immediately after the switching becomes substantially zero, resulting in malfunctioning. Stated more specifically, there is a danger that data that should be output as a 1 may be output as a 0, as shown by reference character EP1 in FIG. 16.

Figure 17:
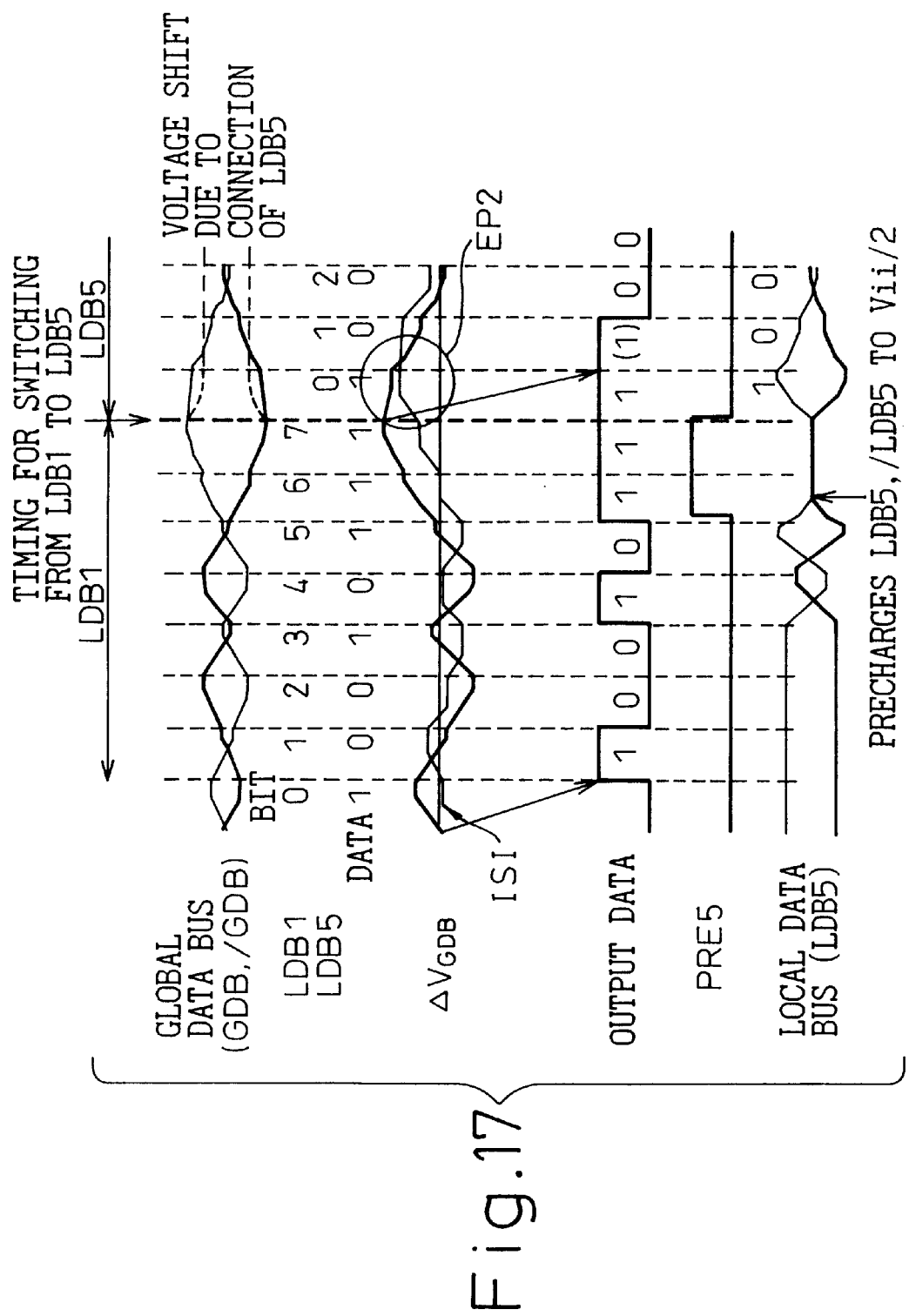
FIG. 17 is a diagram showing another example of operating waveforms in the signal transmission system for explaining the problem associated with the application of the data bus amplifier of FIG. 15.

FIG. 17 is a diagram showing another example of operating waveforms in the signal transmission system for explaining the problem associated with the application of the data bus amplifier of FIG. 15. In the case of FIG. 17, a precharge circuit is provided for the local data bus (LDB), and the local data bus (LDB5) to which the data path is to be switched next (the next bus to be connected to the global data bus) is precharged just before the switching timing. More specifically, precharge control signal PRE5 for controlling the precharge circuit for the local data bus LDB5 is output for the duration of a predetermined period (for example, a period of about two bits) immediately preceding the time at which the data path is switched from the local data bus LDB1 to the local data bus LDB5, and the next local data bus LDB5 (LDB5, /LDB5) is thus precharged, for example, to Vii/2. In this case, the difference between the reference level and the differential input level of the PRD data amplifier 260 can be made larger than in the worst case shown in FIG. 16, but since the level difference (the magnitude of the absolute value) is still small, for example, at the portion indicated by reference character EP2, there still exists a danger that malfunctioning may occur due to, for example, noise, etc.

Figure 18:
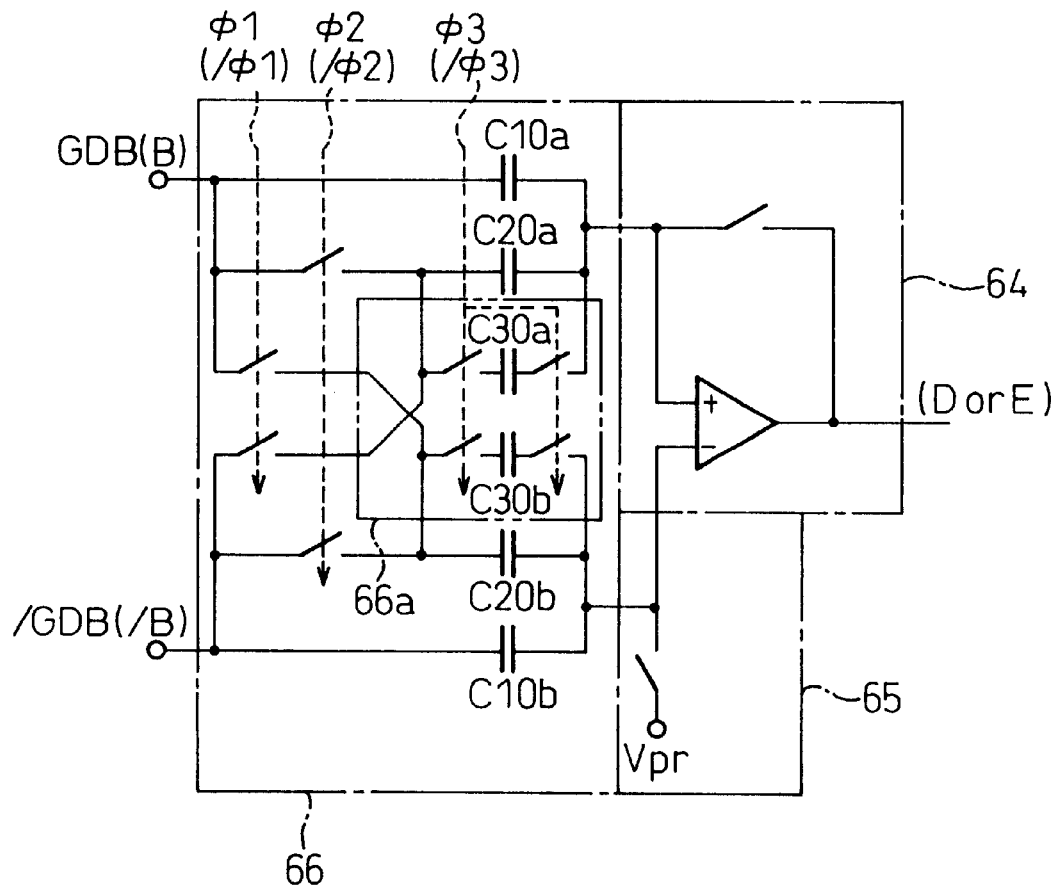
FIG. 18 is a diagram showing in simplified form one example of the PRD-type data bus amplifier in the signal transmission system of the present invention.

FIG. 18 is a diagram showing in simplified form one example of the PRD-type data bus amplifier in the signal transmission system of the present invention. This example concerns the configuration of the data bus amplifier 60 in the first and second embodiments of FIGS. 13 and 14.

As shown in FIG. 18, the PRD amplifier 60 comprises a PRD functional block 66, and a differential amplifier 64 and amplifier precharge circuit 65 provided on the output side of the PRD functional block 66. As can be seen from the comparison between FIGS. 15 and 18, the PRD functional block 66 of the data bus amplifier 60 applicable to the embodiments of FIGS. 13 and 14 differs from the PRD functional block 266 of the data bus amplifier 260 of the related art shown in FIG. 15, in that four switches (for example, transfer gates), controlled by control signals φ3 (/φ3), and two capacitors C30a and C30b are added as shown by reference numeral 66a (i.e., intersymbol interference eliminating circuit). The differential amplifier 64 and amplifier precharge circuit 65 shown in FIG. 18 are the same in configuration as the differential amplifier 264 and amplifier precharge circuit 265 shown in FIG. 15. As will be described later, it is also possible to construct the PRD-type data bus amplifier 60 using two PRD amplifiers (61, 62), which operate in interleaving fashion, and a multiplexer (63), which alternately selects the outputs of the two PRD amplifiers for output, in order to achieve higher speed data transfer.

Figure 19:
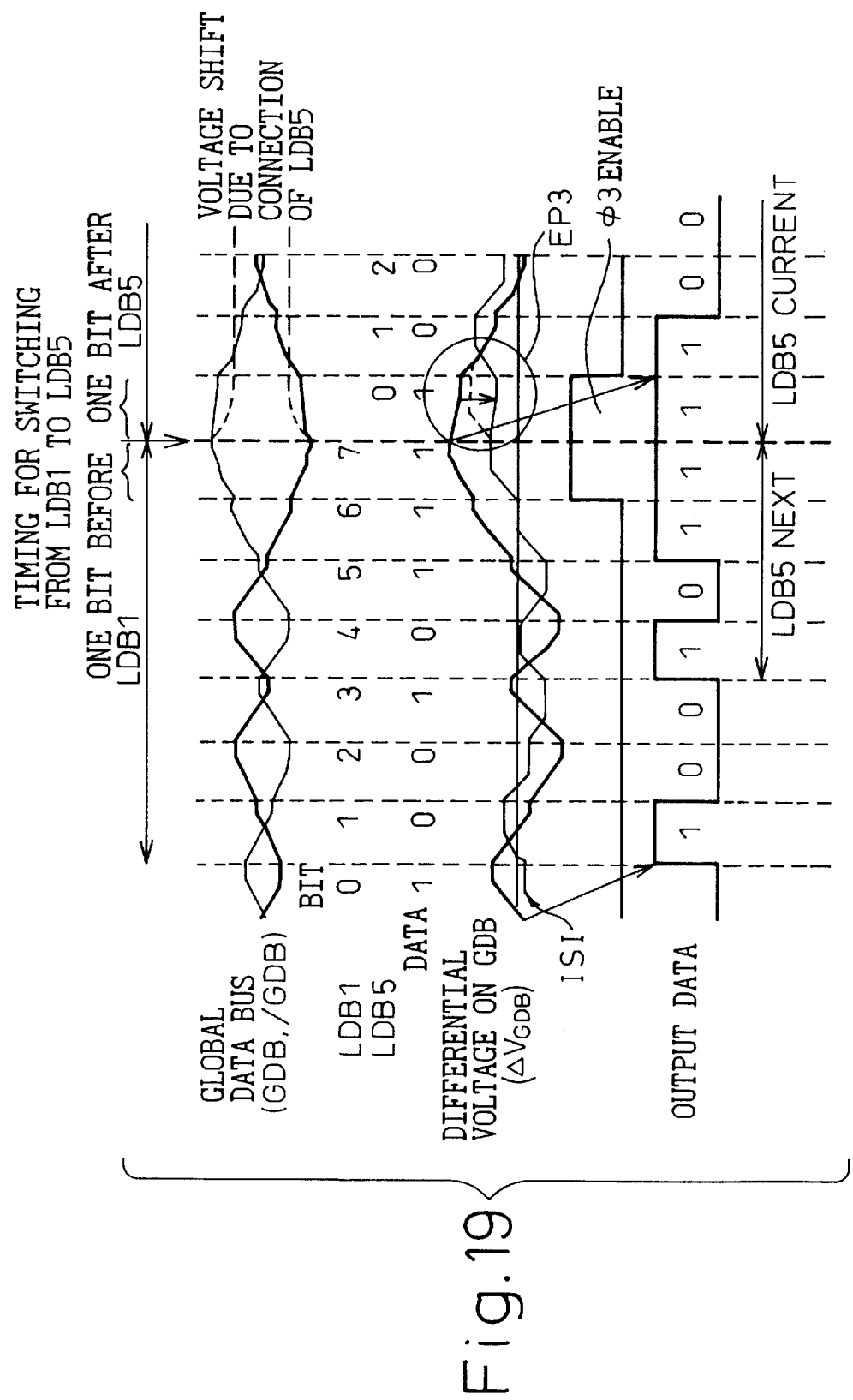
FIG. 19 is a diagram showing one example of operating waveforms in the signal transmission system employing the data bus amplifier of FIG. 18.

FIG. 19 is a diagram showing one example of operating waveforms in the signal transmission system employing the data bus amplifier of FIG. 18. The diagram shows the case where data is read out by switching from the local data bus LDB1 (bank 1) to the local data bus LDB5 (bank 5). More specifically, the example concerns the case where the data to be read out by the data bus amplifier 60 via the global data bus GDB is switched from the local data bus LDB1 to the local data bus LDB2, for example, by operating the data bus switch DBSW shown in FIG. 13.

As shown in FIG. 19, when switching the data read from the local data bus LDB1 to the local data bus LDB5, for example, the control signal φ3 (/φ3) is enabled only for a period of one bit immediately preceding the switching timing and a period of one bit immediately following the switching timing (i.e., for a period of two bits in total), to turn on the switch elements provided before and after the capacitors C30a and C30b. At this time, when the capacitance value of the capacitors C10a and C10b is denoted by C10 and the capacitance value of the capacitors C20a and C20b by C20, the capacitance value C30 of the capacitors C30a and C30b is expressed by $C30=\{\alpha(C10-C20)\cdot(C10+C20)\}/\{(2-\alpha)C10+\alpha C20\}$.

Here, $\alpha=CLDB/(CGDB+CLDB)$, where CGDB is the capacitance (parasitic capacitance) of the global data bus GDB and CLDB is the capacitance (parasitic capacitance) of the local data bus LDB. Further, as in the case of the related art PRD amplifier, the capacitance values of C10 and C20 substantially satisfy the equation $(C10-C20)/(C10+C20)=\exp(-T/\tau)$, where $\tau$ is the time constant of the bus and T is driver output valid time per bit.

As shown in FIG. 19, according to the present embodiment, when data bus switching (for example, from the local data bus LDB1 to the local data bus LDB5) occurs, the local data bus (LDB5) to be selected next is precharged using the PRD-type bus amplifier (the control signal φ3 is enabled only for the periods of one bit each immediately preceding the switching timing and immediately following the switching timing), that is, the capacitors C30a and C30b are connected in parallel with the capacitors C20a and C20b only for the predetermined period before and after the switching timing, to correct the reference level and thereby reduce the ISI (intersymbol interference) level as shown by reference character EP3. In this way, data can be read out continuously and uninterruptedly by the bus amplifier (60). This operation of the present invention will be described more clearly and in further detail in the embodiments hereinafter described.

Figure 20:
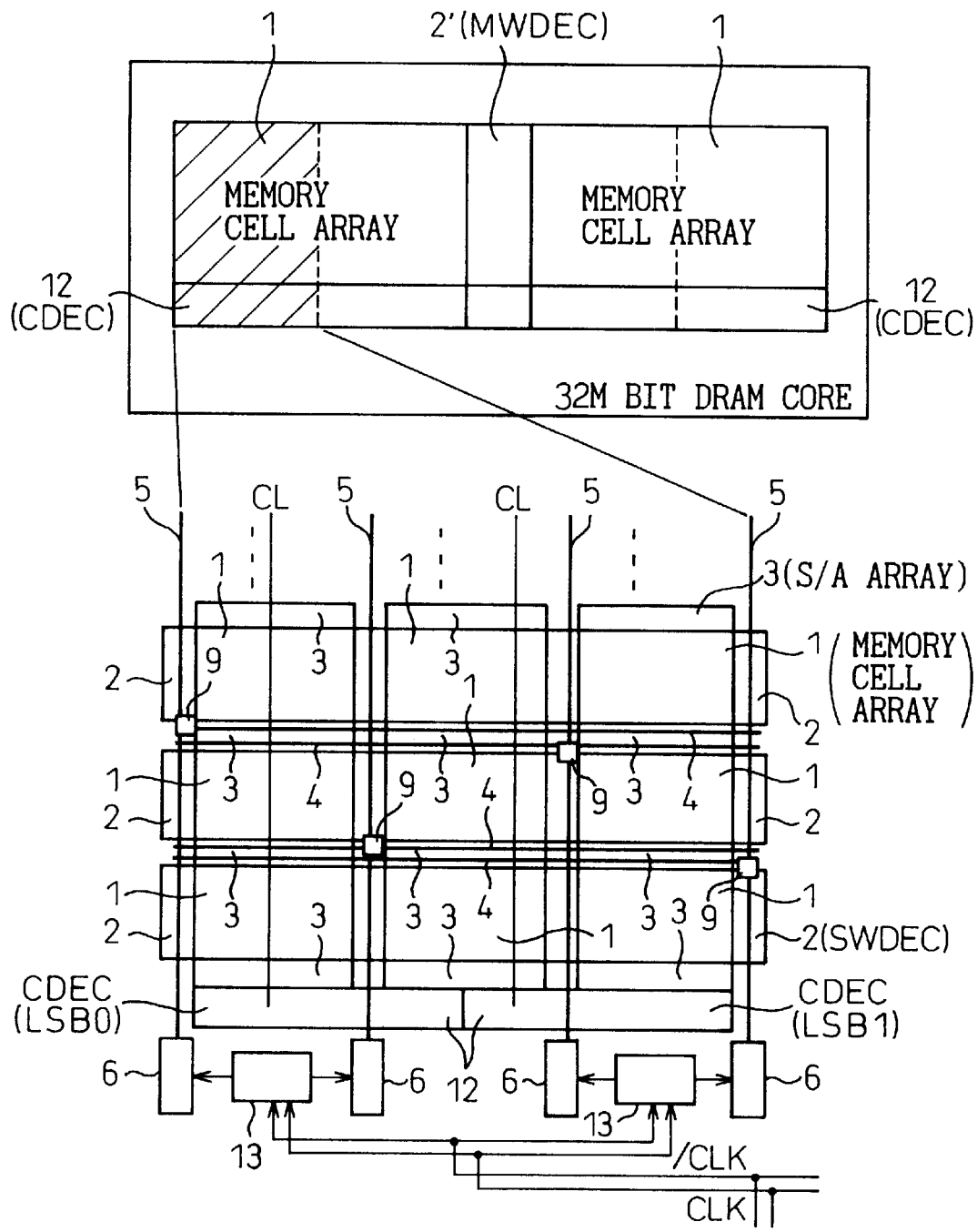
FIG. 20 is a block diagram showing an example of the organization of a semiconductor memory device to which the present invention is applied.

FIG. 20 is a block diagram showing an example of the organization of a semiconductor memory device to which the present invention is applied. Specifically, the organization of an essential portion of a 32-bit DRAM core is shown. In FIG. 20, reference numeral 1 is a memory cell array, 2 is a word decoder array (sub word decoder: SWDEC), 2' is a word decoder array (main word decoder: MWDEC), 3 is a sense amplifier array, 4 is a local data bus (LDB), 5 is a global data bus (GDB), 6 is a data bus amplifier (differential-type PRD data bus amplifier: DPRD), 9 is a local data bus switch, 12 is a column decoder (CDEC), and 13 is a PRD pulse generating circuit. The PRD pulse generating circuit 13 is a circuit that generates control signals (φ1, φ2, φ3), etc. used in the data bus amplifier 6.

In FIG. 20, data from the local data buses 4 connected to the global data bus 5 via the respective local data bus switches 9 are output in parallel from the respective data bus amplifiers 6. The global data bus 5 and the local data bus 4 may be constructed in a single bus structure (GDB; LDB) or may be constructed in a complementary bus structure (GDB, /GDB; LDB, /LDB).

Figure 21:
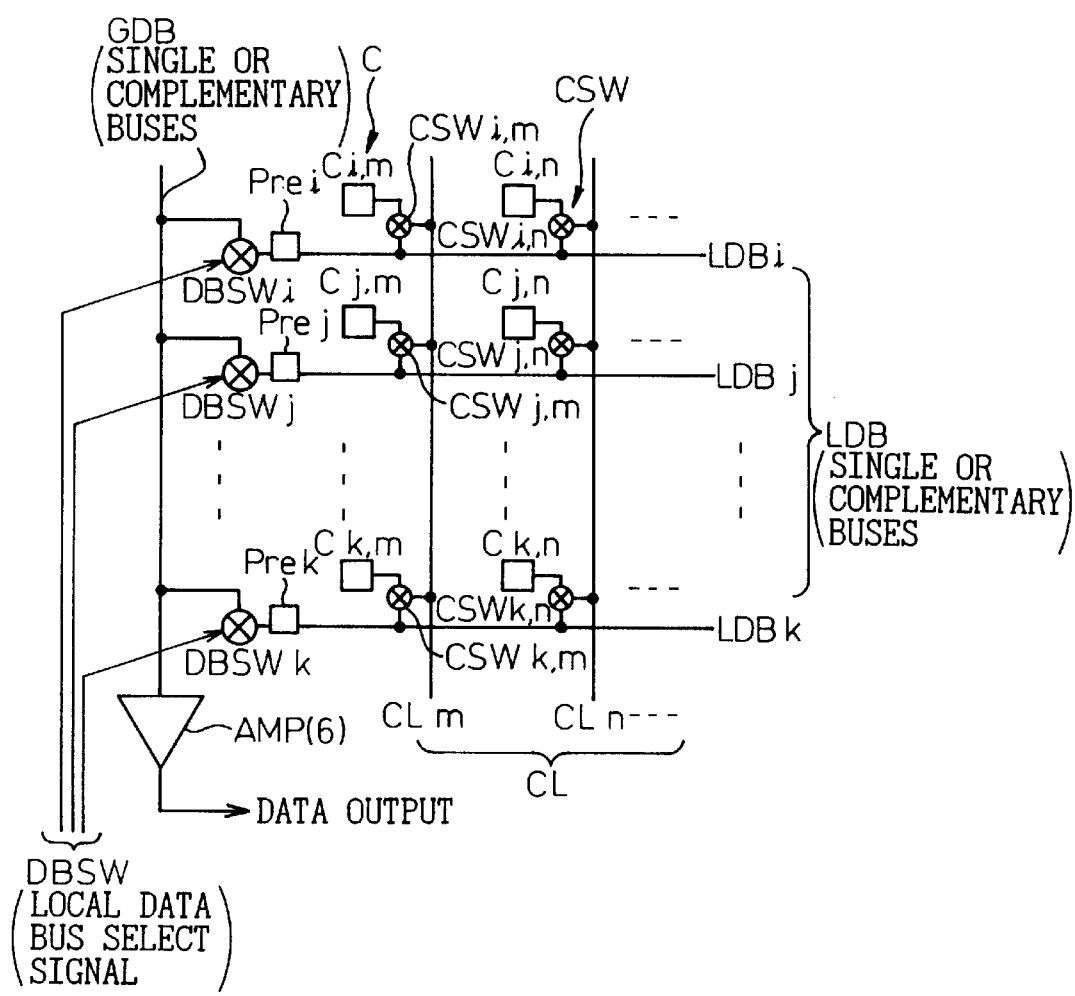
FIG. 21 is a diagram conceptually illustrating a hierarchical bus structure as a third embodiment of the signal transmission system to which the present invention is applied.

FIG. 21 is a diagram conceptually illustrating a hierarchical bus structure as a third embodiment of the signal transmission system to which the present invention is applied.

The third embodiment of FIG. 21 differs from the hierarchical bus structure of the first embodiment shown in FIG. 13, in that precharge circuits Prei, Prej, ..., Prek are provided for the respective local data buses LDBi, LDBj, ..., LDBk, that is, for the respective units directly subordinate to the global data bus GDB, to precharge the respective local data buses or units. Here, each unit C, as in the first embodiment of FIG. 13, is constructed, for example, in the case of a semiconductor memory device, from a memory cell, or a sense amplifier, or a flip-flop or the like with a driver. Separate precharge control signals are supplied to the respective precharge circuits Prei, Prej, ..., Prek to control the precharge of each of the local data buses LDBi, LDBj, ..., LDBk independently of each other. The global data bus GDB and the local data bus LDB may be constructed either in a single bus structure or in a complementary bus structure.

Figure 22:
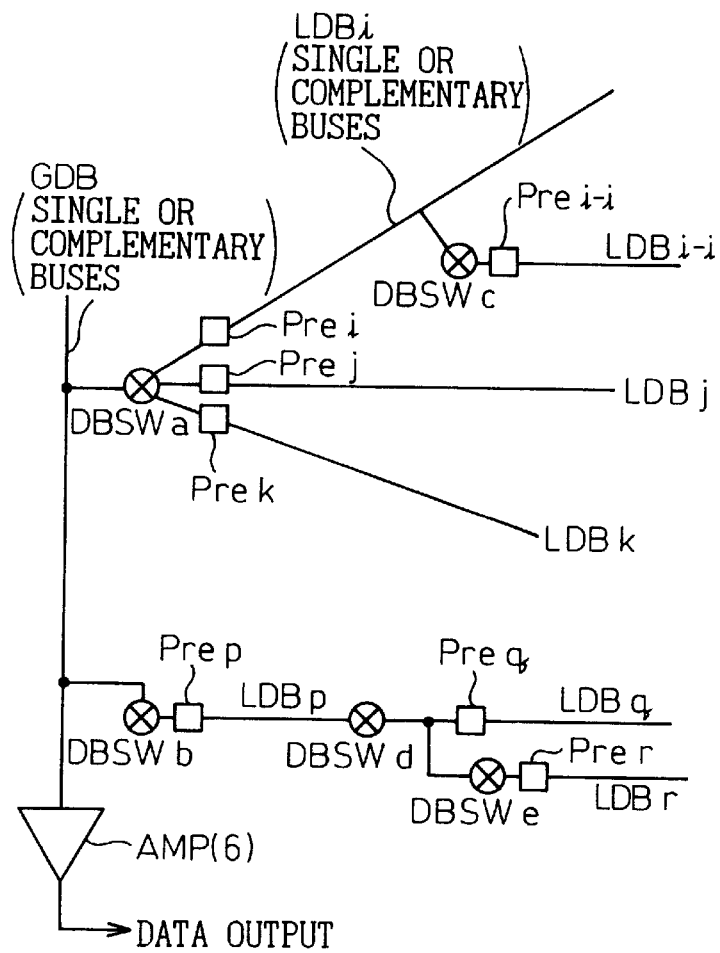
FIG. 22 is a diagram conceptually illustrating a branching bus structure as a fourth embodiment of the signal transmission system to which the present invention is applied.

FIG. 22 is a diagram conceptually illustrating a branching bus structure as a fourth embodiment of the signal transmission system to which the present invention is applied.

Figure 23:
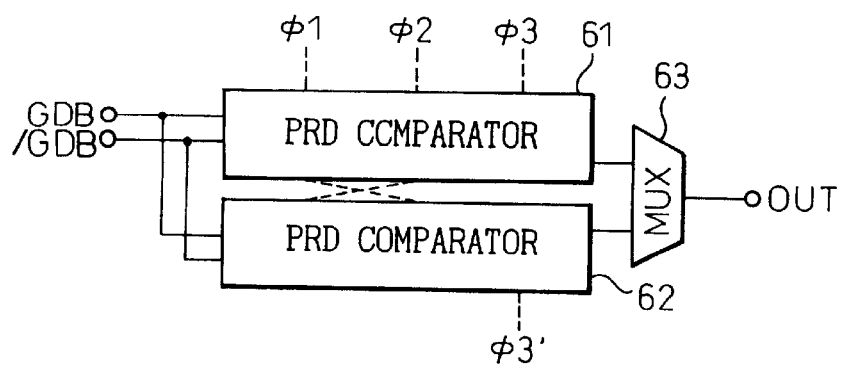
FIG. 23 is a diagram showing in simplified form another example of the PRD-type data bus amplifier in the signal transmission system of the present invention.

The fourth embodiment of FIG. 22 differs from the branching bus structure of the second embodiment shown in FIG. 14, in that precharge circuits Prei, Prei-i, Prej, Prek; Prep, Preq, Prer are provided for the respective local data buses LDBi, LDBi-i, LDBj, LDBk; LDBp, LDBq, LDBr, to precharge the respective local data buses. As in the third embodiment, in the fourth embodiment also, separate precharge control signals are supplied to the respective precharge circuits Prei, Prei-i, Prej, Prek; Prep, Preq, Prer to control the precharge of each of the local data buses LDBi, LDBi-i, LDBj, LDBk; LDBp, LDBq, LDBr independently of each other. In the fourth embodiment also, the global data bus GDB and the local data bus LDB may be constructed either in a single bus structure or in a complementary bus structure. FIG. 23 is a diagram showing in simplified form another example of the PRD-type data bus amplifier in the signal transmission system of the present invention. An example of the data bus amplifier AMP (6) in the above-described third and fourth embodiments is shown here.

As shown in FIG. 23, the PRD-type data bus amplifier 6 comprises two paralleled PRD-type comparators (PRD comparators: PRD amplifiers) 61 and 62 which are driven in interleaving fashion. That is, while one (first) PRD comparator 61 is performing an intersymbol interference estimation operation, the other (second) PRD comparator 62 performs a data decision operation, and while the first PRD comparator 61 is performing a data decision operation, the second PRD comparator 62 performs an intersymbol interference estimation operation. A multiplexer 63 alternately selects the outputs of the two PRD comparators 61 and 62 for connection to the output, thus achieving high-speed signal read operation.

Figure 24:
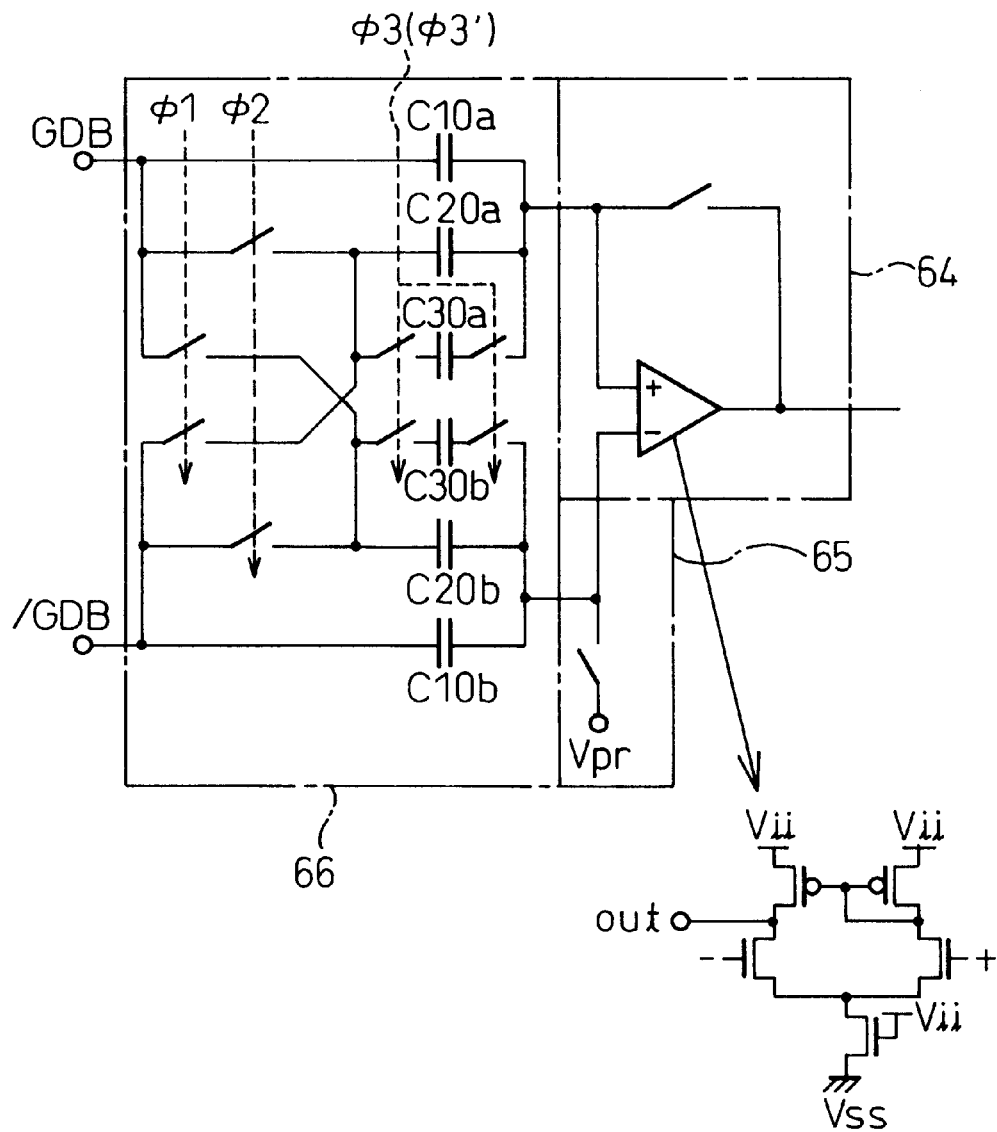
FIG. 24 is a diagram showing a PRD comparator in the data bus amplifier of FIG. 23.

FIG. 24 is a diagram showing the PRD comparator in the data bus amplifier of FIG. 23.

As can be seen from the comparison between FIGS. 24 and 18, each of the PRD comparators 61 and 62 constituting the data bus amplifier 6 is the same in configuration as the data bus amplifier 60 shown in FIG. 18. However, in one PRD comparator 61, the connections of the capacitors C30$a$ and C30$b$ are controlled by the control signal $\phi3$, and in the other PRD comparator 62, the connections of the capacitors C30$a$ and C30$b$ are controlled by the control signal $\phi3'$. Here, the control signals $\phi3$ and $\phi3'$ supplied to the PRD comparators 61 and 62 are necessary for only one of the two PRD comparators operating in interleaving fashion, that is, the one corresponding to the bus switching timing; for example, in applications where the bus switching timing occurs for every predetermined even number of bits (which is usually the case), the data bus amplifier may be configured so that the capacitors C30$a$ and C30$b$ are provided only in one PRD comparator 61 and the control signal $\phi3$ supplied to it to control their connections, while, for the other PRD comparator 62, the capacitors C30$a$ and C30$b$ are not provided and the control signal 43' is not supplied to it.

Figure 25:
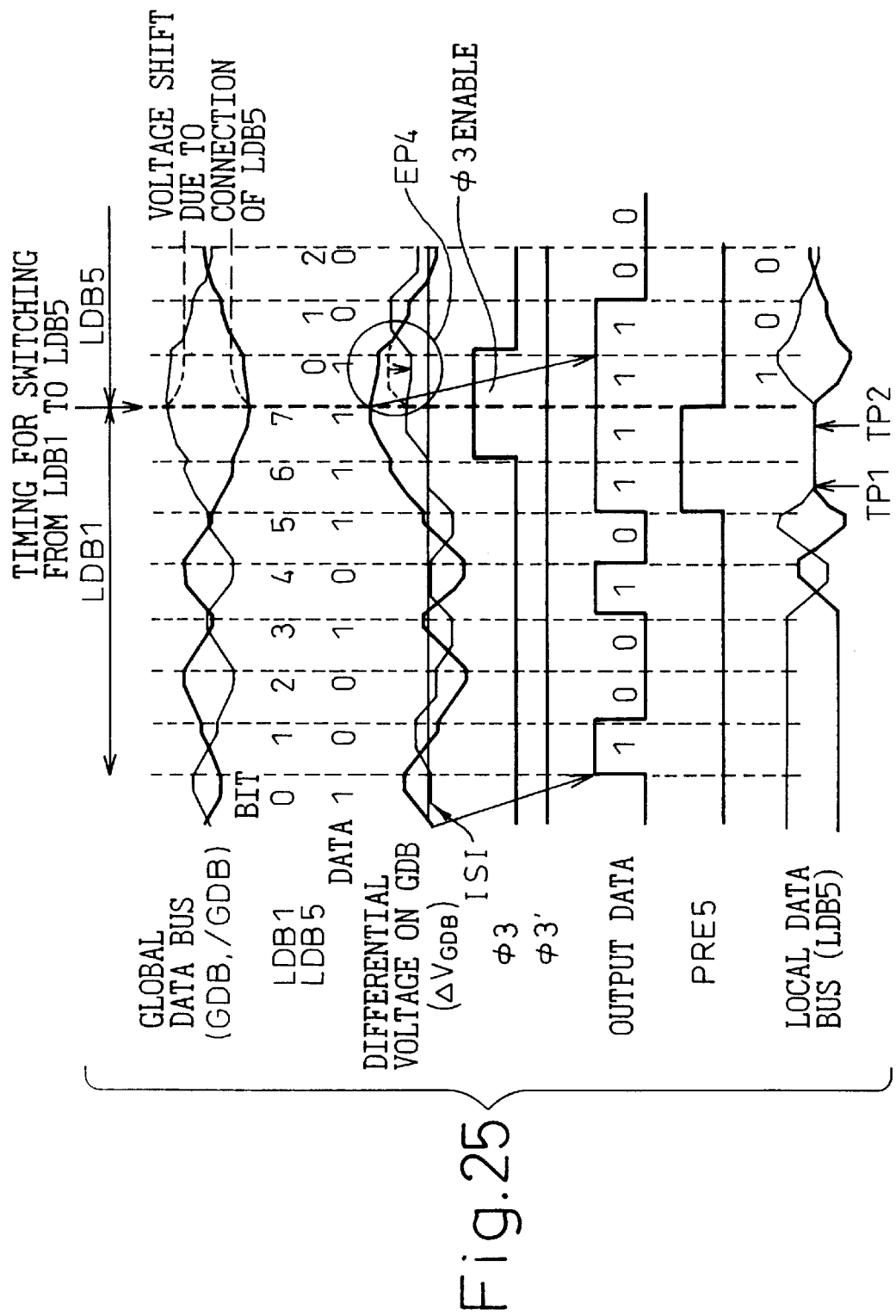
FIG. 25 is a diagram showing one example of operating waveforms in the signal transmission system employing the data bus amplifier of FIG. 23.

FIG. 25 is a diagram showing one example of operating waveforms in the signal transmission system employing the data bus amplifier of FIG. 23.

As shown in FIG. 25, when switching the data path from the local data bus LDB1 to the local data bus LDB5, for example, the paired local data buses LDB5 (LDB5, /LDB5) to be next connected to the global data bus GDB (GDB, /GDB) are short-circuited and precharged for the period of two bits before the switching timing. That is, the control signal PRE5 to the precharge circuit provided for the local data pair LDB5, /LDB5 is enabled for the period of two bits before the switching timing; by so doing, the complementary local data buses LDB5, /LDB5 are short-circuited, for example, at the timing indicated by reference character TP1 in FIG. 25, and precharged to an intermediate voltage (Vii/2).

Further, the control signal (3 is enabled only for the period of one bit immediately preceding the switching timing and the period of one bit immediately following the switching timing (i.e., the period of two bits in total), to turn on the switch elements provided before and after the capacitors C30$a$ and C30$b$ in one PRD comparator 61; in this way, since the voltage change on the global data bus is determined when the switching is made to the local data bus LDB5, /LDB5 (that is, when it is connected to the global data bus GDB, /GDB), the amount of voltage change caused by the switching can be reduced in the PRD comparator (PRD amplifier) of FIG. 24. That is, by connecting the capacitors C30$a$ and C30$b$ in parallel with the capacitors C20$a$ and C20$b$ only for a predetermined period before and after the switching timing, and thereby correcting the reference level, the ISI (intersymbol interference) level can be reduced as shown by reference character EP4, and data can thus be read out continuously and uninterruptedly by the bus amplifier 6.

Here, when the capacitance value of the capacitors C10$a$ and C10$b$ is denoted by C10 and the capacitance value of the capacitors C20$a$ and C20$b$ by C20, the capacitance value C30 of the capacitors C30$a$ and C30$b$ is expressed by C30=$\{\alpha(C10-C20)\cdot(C10+C20)\}/\{(2-\alpha)C10+\alpha C20\}$.

Here, $\alpha$=CLDB/(CGDB+CLDB), where CGDB is the capacitance (parasitic capacitance) of the global data bus GDB and CLDB is the capacitance (parasitic capacitance) of the local data bus LDB. Further, as in the case of the related art PRD amplifier, the capacitance values of C10 and C20 substantially satisfy the equation (C10−C20)/(C10+C20)= exp(−T/τ), where T is the time constant of the bus and T is driver output valid time per bit.

As shown by the operating waveforms in FIG. 25, if data bus (local data bus) switching occurs, the PRD-type bus amplifier and the precharging of the local data bus to be selected next provide seamless data read operation. Here, while data are being continuously sent from the driver of a local data bus, precharge is not performed on the same local data bus. In the example of FIG. 25, it is shown that the local data bus to be selected next is precharged to one half of the driver power supply level (i.e., to Vii/2) before it is selected, but the precharge level need not necessarily be set to that exact value; the only requirement is that the precharge level be set to about one half of the power supply level, or at least to a value intermediate between the power supply level (Vii) and ground level (Vss). Further, the paired local data buses (LDB, /LDB: LDB5, /LDB5) are precharged to approximately the same level between them.

In the example of FIG. 25, precharge of the local data bus (LDB5) to be selected next is initiated two bit times before the local data bus switching (switching from LDB1 to LDB5) occurs, but the precharge may be initiated one bit time before the switching. Alternatively, provisions may be made so that local data buses not in operation are always held in a precharged state and, when local data bus switching occurs, the selected local data bus is released from the precharged state.

Figure 26:
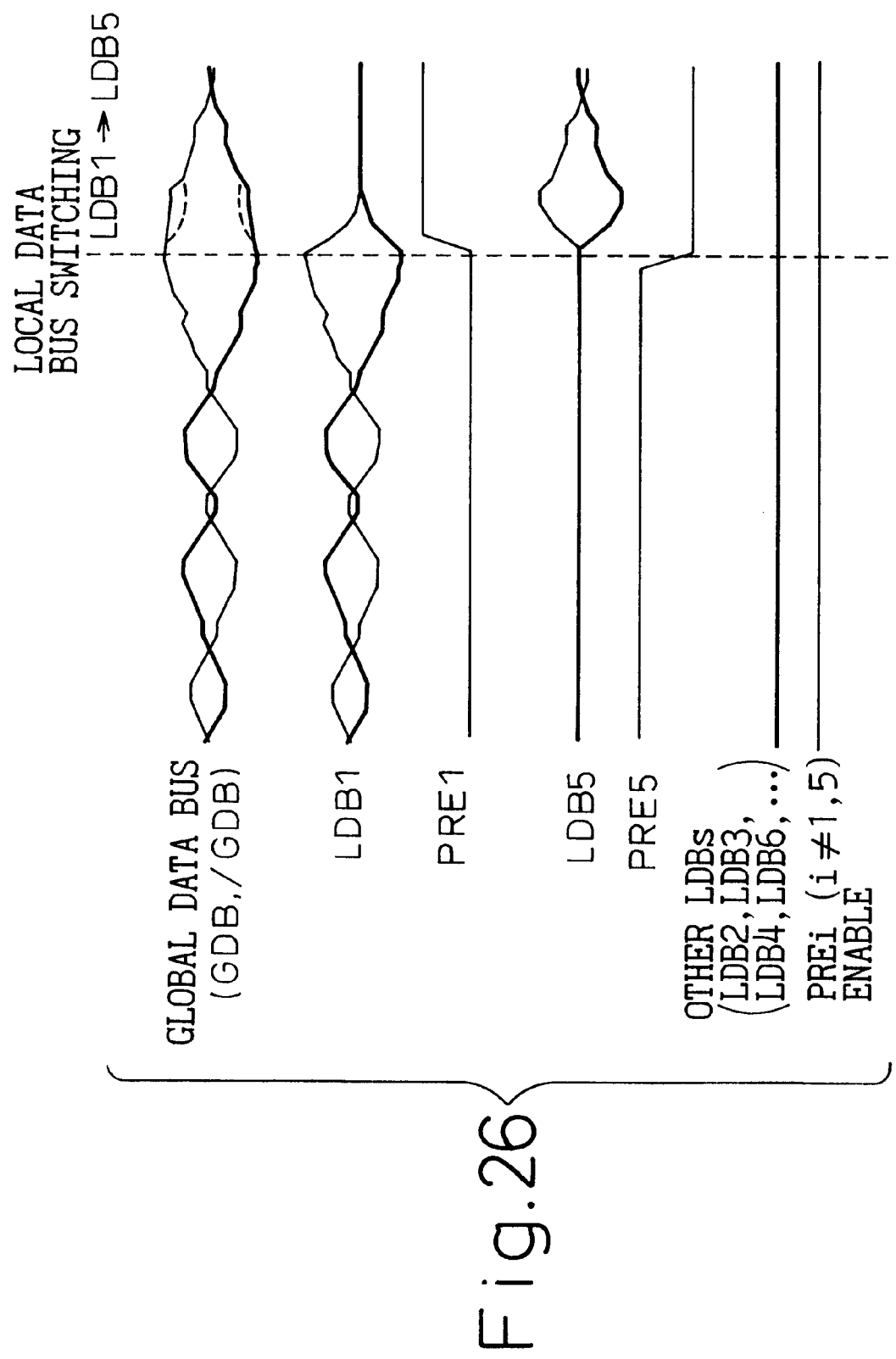
FIG. 26 is a waveform diagram for explaining a characteristic operation in the signal transmission system employing the data bus amplifier of FIG. 23.

FIG. 26 is a waveform diagram for explaining a characteristic operation in the signal transmission system employing the data bus amplifier of FIG. 23. The illustrated example concerns the configuration where local data buses (PRE2, PRE2, PRE4, PRE6, . . . ) not in operation are held in the precharged state and, when local data bus switching occurs (from LDB1 to LDB5), the selected local data bus (LDB5) is released from the precharged state.

Figure 27:
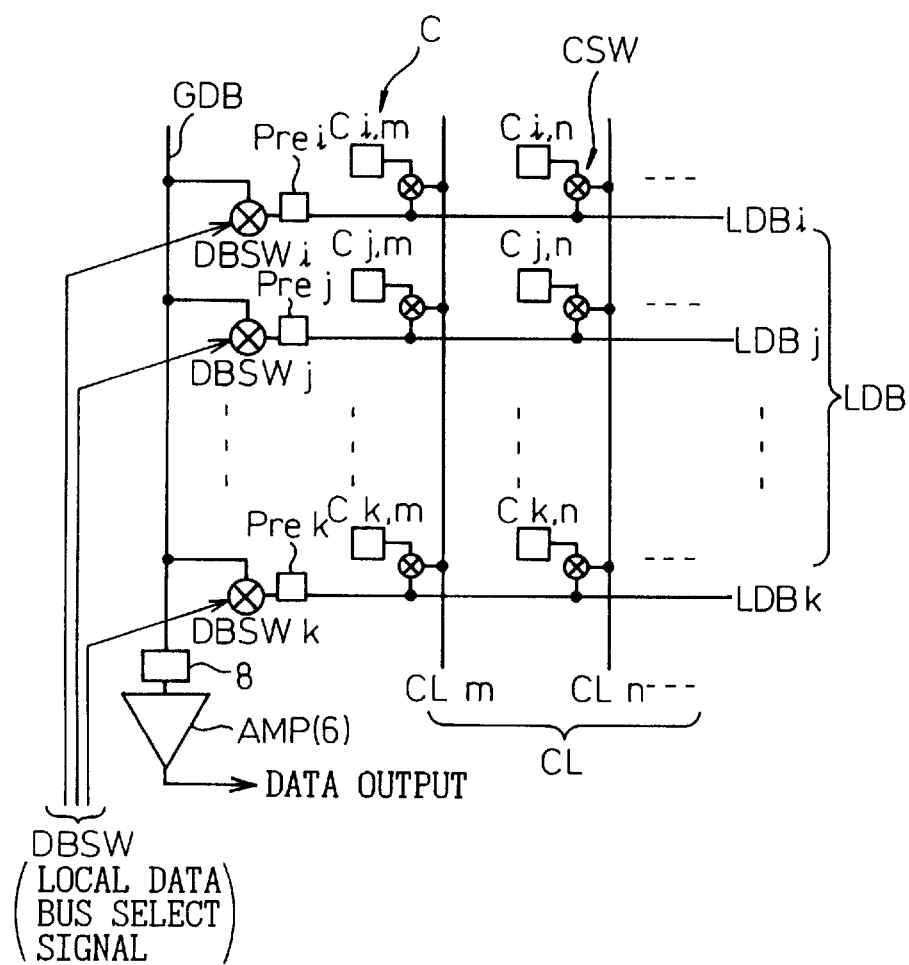
FIG. 27 is a diagram conceptually illustrating a hierarchical bus structure as a modified example of the third embodiment shown in FIG. 21.

FIG. 27 is a diagram conceptually illustrating a hierarchical bus structure as a modified example of the third embodiment shown in FIG. 21.

The hierarchical bus structure shown in FIG. 27 differs from that of the third embodiment shown in FIG. 21 in that a precharge circuit 8 is provided for the global data bus GDB. Otherwise, the structure is the same as that shown in FIG. 21. One effect of providing the precharge circuit 8 for the global data bus GDB, as in this modified example, is that the bus (global data bus) can be precharged and held in the precharged state, for example, when the bus is not in operation, that is, when the bus is in a standby mode. It will, however, be recognized that the global data bus can be precharged and held in the precharged state during standby even when the precharge circuit is not provided for the global data bus.

Figure 28:
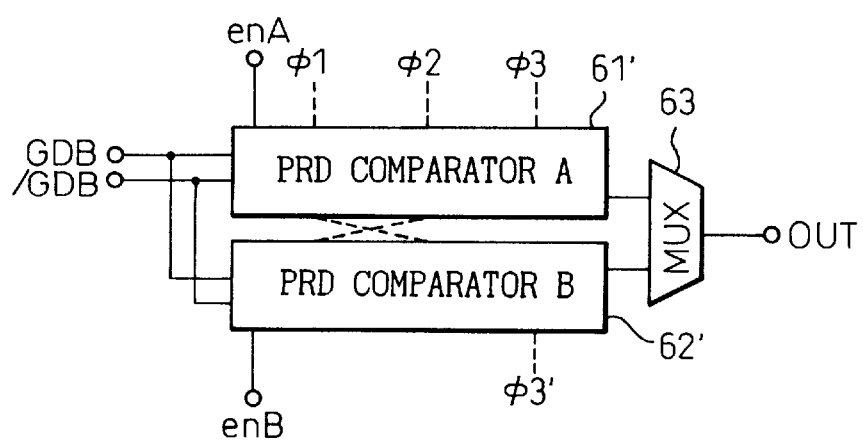
FIG. 28 is a diagram showing in simplified form a PRD-type data bus amplifier as a fifth embodiment of the signal transmission system to which the present invention is applied.

FIG. 28 is a diagram showing in simplified form a PRD-type data bus amplifier as a fifth embodiment of the signal transmission system to which the present invention is applied. In this embodiment, enable signals enA and enB are supplied to control the respective PRD comparators 61 and 62 shown in FIG. 23.

As shown in FIG. 28, the PRD-type data bus amplifier 6 comprises two paralleled PRD comparators 61' and 62' which are driven in interleaving fashion. That is, while one PRD comparator 61' (A) is performing an intersymbol interference estimation operation, the other PRD comparator 62' (B) performs a data decision operation, and while the one PRD comparator 61' is performing a data decision operation, the other PRD comparator 62' performs an intersymbol interference estimation operation. The multiplexer 63 alternately selects the outputs of the two PRD comparators 61' and 62' for connection to the output, thus achieving high-speed signal read operation.

In the data bus amplifier 6 of the fifth embodiment, the enable signals enA and enB are supplied to the respective PRD comparators 61' and 62' so that the bus amplifier 6 (61', 62') does not operate except when transferring data.

Figure 29:
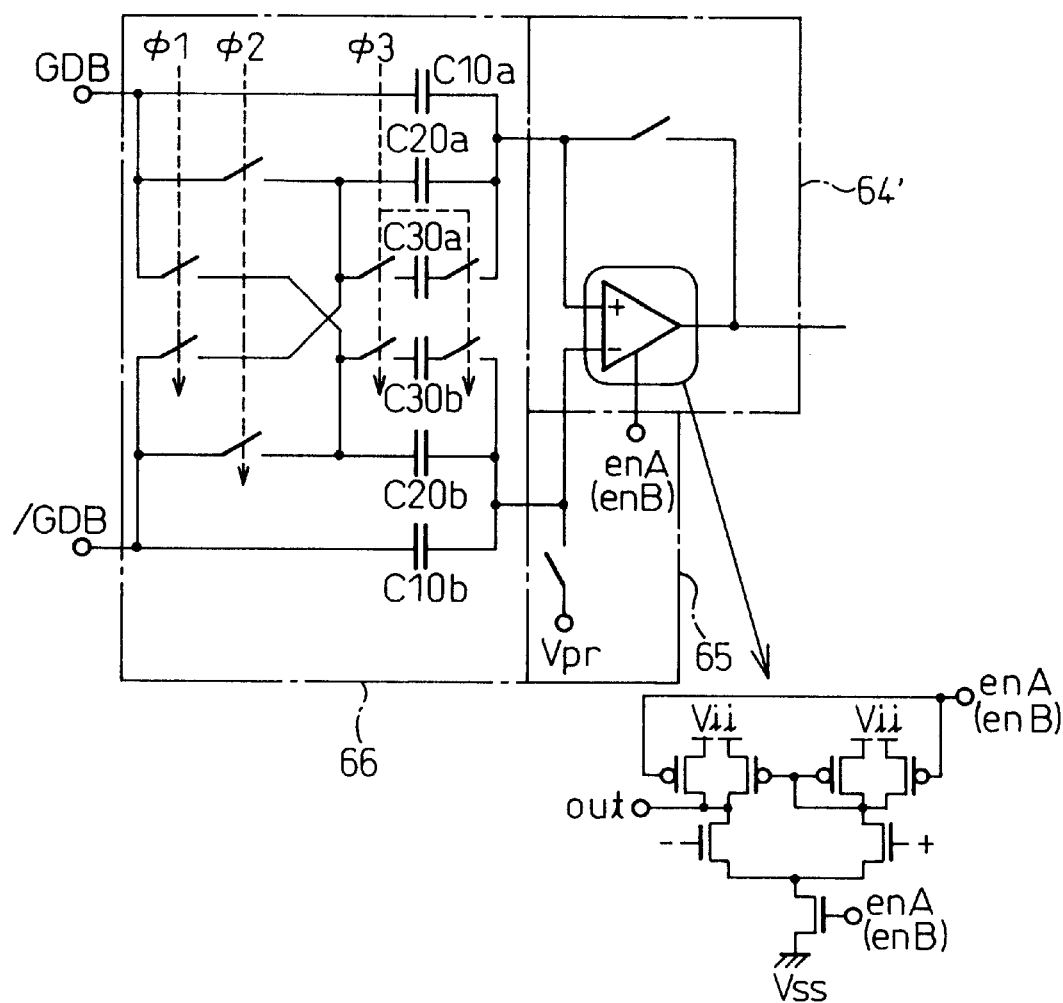
FIG. 29 is a diagram showing a PRD comparator in the data bus amplifier of FIG. 28.

FIG. 29 is a diagram showing the PRD comparator in the data bus amplifier of FIG. 28.

As shown in FIG. 29, the differential amplifier 64' in the PRD comparator 61' (62') is constructed as a current-mirror amplifier whose operation is controlled by the enable signal enA (enB). The PRD functional block 66 and the amplifier precharge circuit 65 are the same as those in the PRD comparator shown, for example, in FIG. 24.

Figure 30:
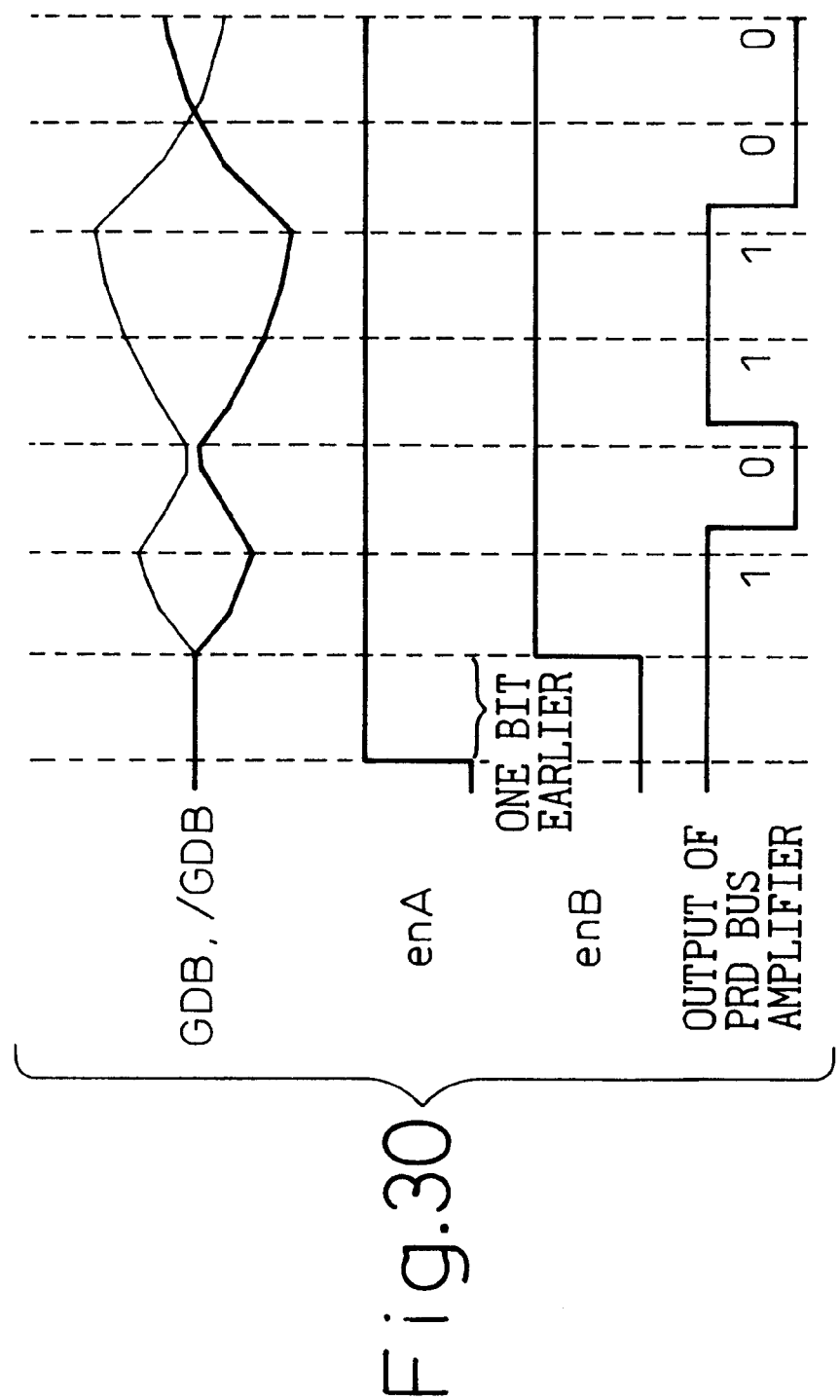
FIG. 30 is a diagram for explaining one example of the operation of the data bus amplifier of FIG. 28.

FIG. 30 is a diagram for explaining one example of the operation of the data bus amplifier of FIG. 28.

As shown in FIG. 30, the enable signal enA for controlling the operation of one PRD comparator 61' is, for example, output one bit earlier than the enable signal enB for controlling the operation of the other PRD comparator 62'; this prevents invalid data of the first bit from being output with the two PRD comparators 61' and 62' starting to operate at the same time. That is, the enable signal enA is output (enabled) first, allowing the one PRD comparator 61' to perform intersymbol interference estimation and comparator auto-zero operations. At this time, the other PRD comparator 62' is not activated yet.

The enable signal enA for the PRD comparator 61' rises one bit time earlier than the arrival of data at the bus amplifier and, at the beginning of the next bit time (the beginning of the initial bit), the enable signal enB for the other PRD comparator 62' is output to enable that other PRD comparator 62'. During this initial bit period, the PRD comparator 61' receives the data and makes a decision on the data, while at the same time, the other PRD comparator 62' performs the intersymbol interference estimation and auto-zero operations. In the fifth embodiment (FIGS. 28 to 30), the PRD comparator (61', 62') has an auto-zero function (a reset function to short-circuit one input of the differential amplifier 64' to the output thereof) to eliminate the asymmetry of the comparator (differential amplifier 64') and to enhance sensitivity.

Here, if the input signal to the bus amplifier (6) is sufficiently large (large enough to compensate for the comparator asymmetry), the auto-zero function need not necessarily be provided. Further, the enable signals enA and enB may be set inactive at the same time, or the two comparators 61' and 62' (differential amplifier 64') may be deactivated, but if the number of bits of output data is known, for example, they may be deactivated in the order in which the data output is complete.

Figure 31:
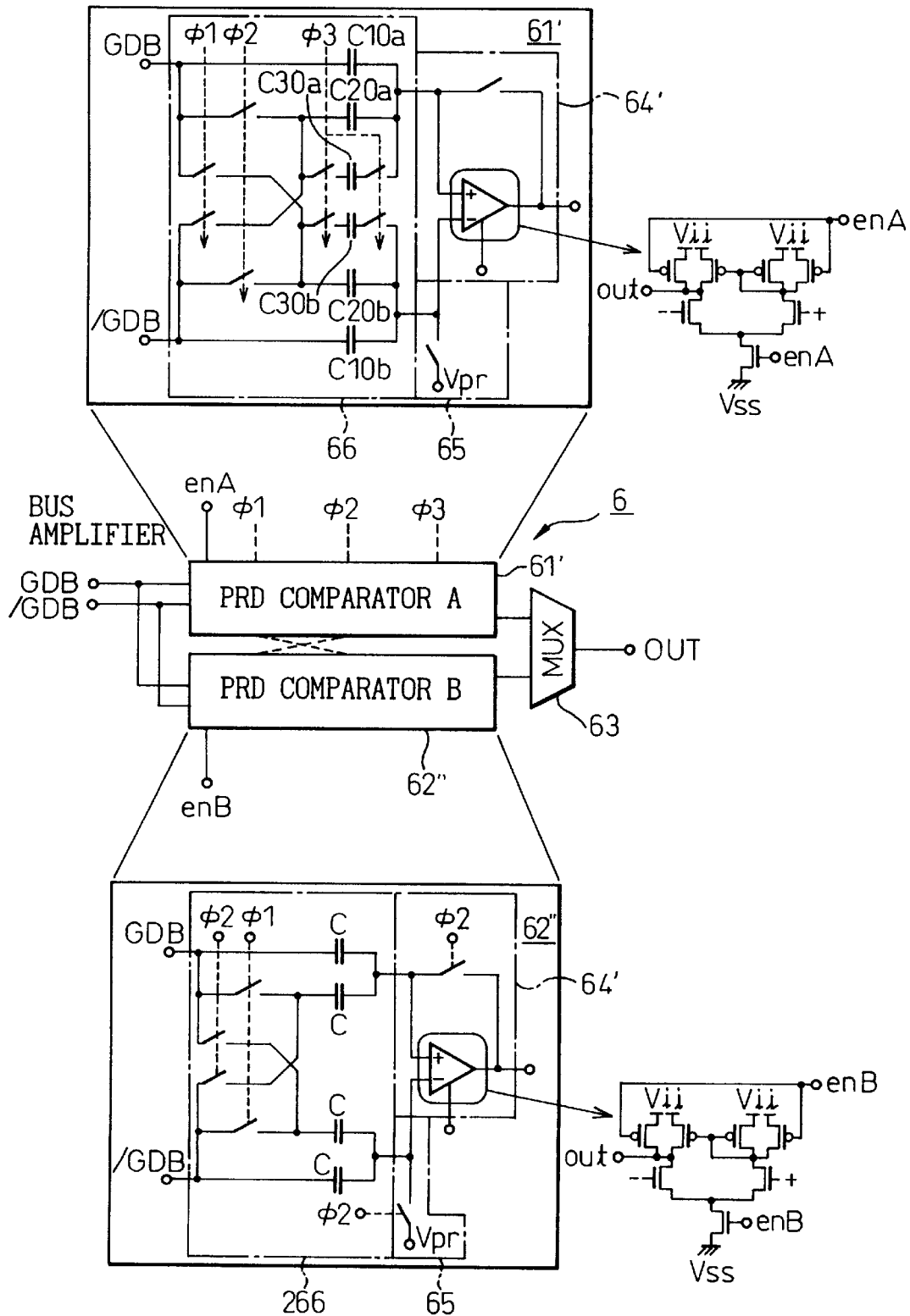
FIG. 31 is a diagram showing a modified example of the data bus amplifier of FIG. 28.
Figure 32:
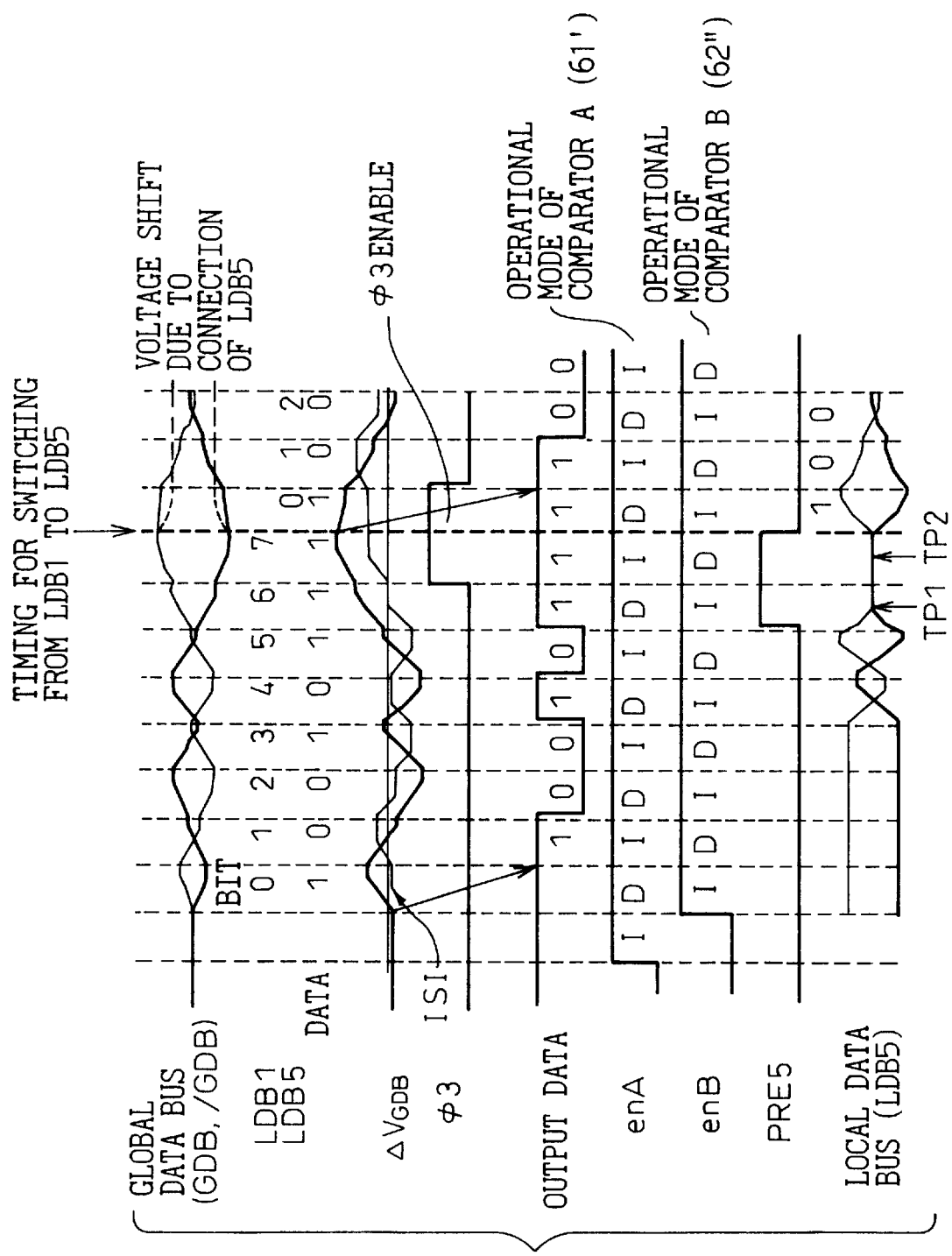
FIG. 32 is a waveform diagram for explaining one example of the operation of the data bus amplifier of FIG. 31.

FIG. 31 is a diagram showing a modified example of the data bus amplifier of FIG. 28, in which data is always read in blocks of an even number of bits, and FIG. 32 is a waveform diagram for explaining one example of the operation of the data bus amplifier of FIG. 31. In FIG. 32, "I" attached alongside the enable signals enA and enB indicates an intersymbol interference (ISI) estimation operation and "D" a signal decision operation.

As can be seen from the comparison between FIGS. 31 and 28, in this modified example the PRD comparator 61' is the same in configuration as that shown in FIG. 28 (29), while the PRD functional block in the other PRD comparator 62" is made identical in configuration to the PRD functional block (266) in the related art shown in FIG. 15. With the enable signals enA and enB, the PRD comparator 61' is activated first. When reading out an even number of bits, the PRD comparator 61' always performs an intersymbol interference component estimation operation (I) during one bit period immediately preceding the bus switching timing and a signal decision operation (D) during one bit period immediately following the bus switching timing.

More specifically, in cases where the bus switching timing occurs for every predetermined even number of bits (which is usually the case), that is, in cases where the bus switching timing occurs synchronously with the switching of the PRD comparator 61' (comparator A) operation from the intersymbol interference component estimation operation I to the signal decision operation D, as shown in FIG. 32, the capacitors C30a and C30b need only be provided in the PRD comparator 61' and their connections controlled by the control signal φ3; as a result, the same effect as previously described can be obtained if the capacitors C30a and C30b and the switch elements controlled by the control signal φ3' are not provided in the PRD functional block (266) in the other PRD comparator 62". In this way, by configuring the circuit in a manner just sufficient and necessary for the intended function, the circuitry can be reduced compared with the PRD bus amplifier 6 in the fifth embodiment shown in FIG. 28. The auto-zero operation of the differential amplifier 64' in the other PRD comparator 62" is controlled by the control signal φ2.

As in the previously described example of FIG. 25, in this example also, precharge of the local data bus (LDB5) to be selected next is initiated two bit times before the local data bus switching (switching from LDB1 to LDB5) occurs, but the precharge may be initiated one bit time before the switching. Alternatively, provisions may be made so that local data buses not in operation are always held in a precharged state and, when local data bus switching occurs, the selected local data bus is released from the precharged state.

Figure 33:
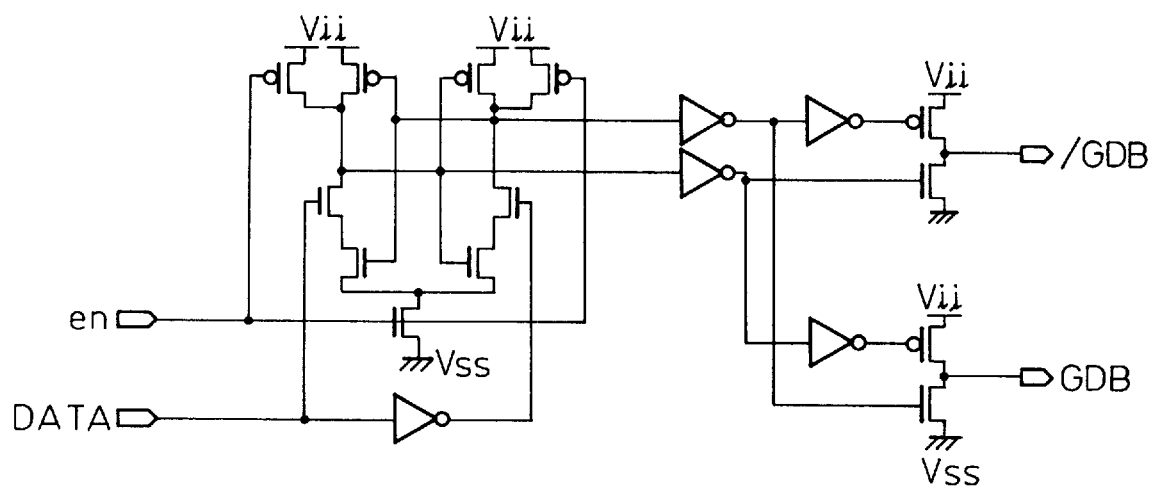
FIG. 33 is a circuit diagram showing one example of a write amplifier in the semiconductor memory device to which the present invention is applied.
Figure 34:
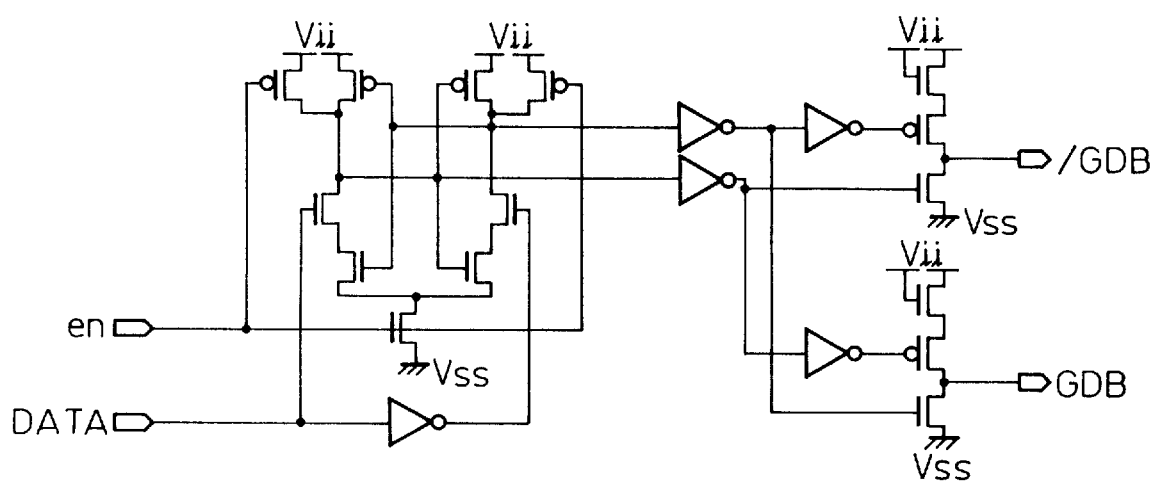
FIG. 34 is a circuit diagram showing another example of the write amplifier in the semiconductor memory device to which the present invention is applied.

FIG. 33 is a circuit diagram showing one example of the write amplifier (10) in the semiconductor memory device to which the present invention is applied, and FIG. 34 is a circuit diagram showing another example of the write amplifier in the semiconductor memory device to which the present invention is applied.

As shown in FIGS. 33 and 34, each write amplifier receives enable signal e and data (write data) DATA and drives the complementary global data buses GDB and /GDB to the levels appropriate to the data DATA.

As can be seen from the comparison between FIGS. 33 and 34, the write amplifier shown in FIG. 34 differs from the write amplifier shown in FIG. 33, in that an additional NMOS transistor is provided in each of the power supplies that drive the respective global data buses GDB and /GDB, that is, the NMOS transistors are inserted each between the PMOS transistor at the output stage and the internal power supply line (Vii), to prevent the data bus (GDB, /GDB) from being driven above the level of "Internal supply voltage (Vii)—NMOS transistor threshold voltage (Vth)". The write operation consists primarily of driving the data on the high level "H" side to the low level "L" by the driving power of the NMOS transistor connected to the low-level voltage supply line (Vss); therefore, the lower the high voltage level "H" of the data bus, the faster the data is driven to the low level "L", and a higher-speed write operation can thus be achieved.

Operation of the write amplifiers shown in FIGS. 33 and 34 will be described in detail later with reference to FIG. 71.

Figure 35:
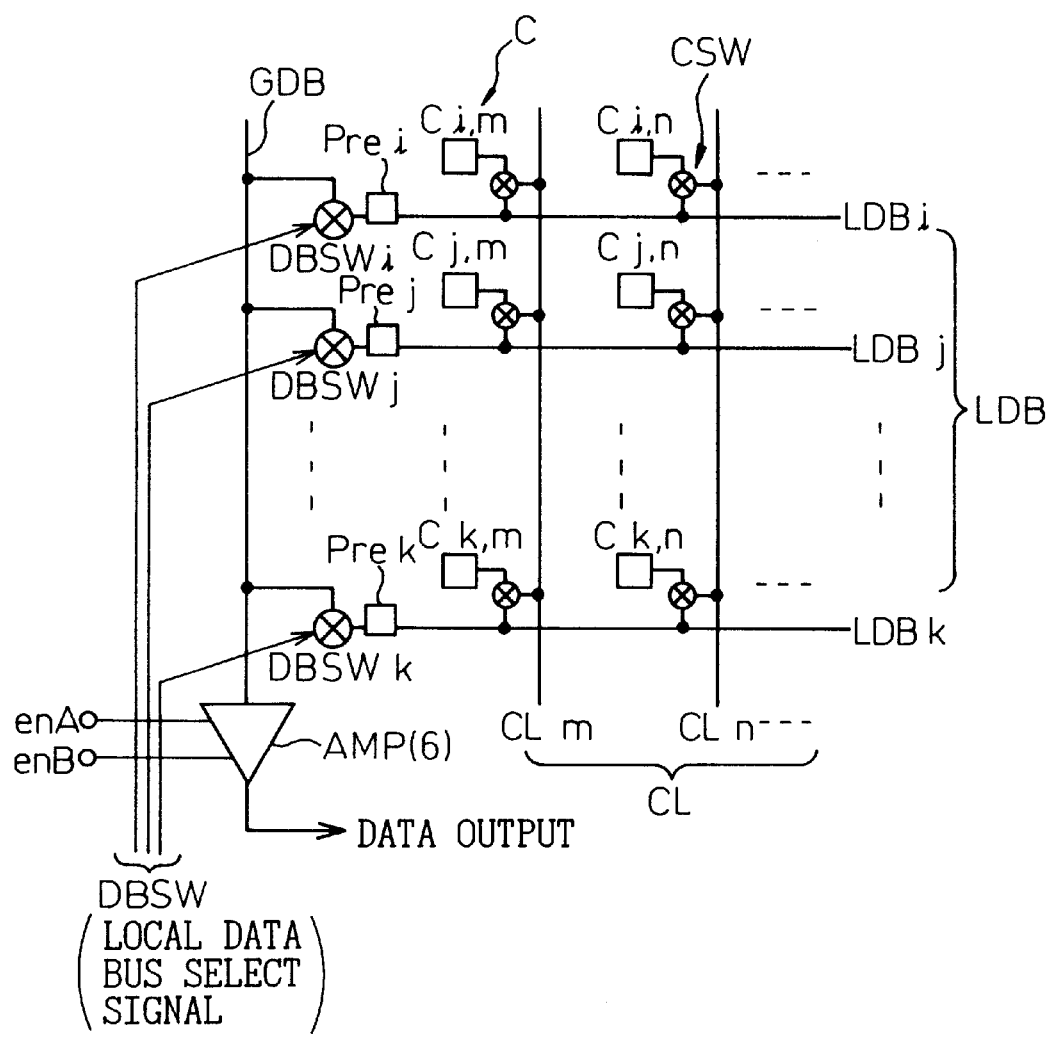
FIG. 35 is a diagram conceptually illustrating a hierarchical bus structure as a sixth embodiment of the signal transmission system to which the present invention is applied.

FIG. 35 is a diagram conceptually illustrating a hierarchical bus structure as a sixth embodiment of the signal transmission system to which the present invention is applied. This bus structure is the same as the hierarchical bus structure of the third embodiment shown in FIG. 21, except that the PRD-type data bus amplifier 6 shown in the third embodiment is replaced by the data bus amplifier of the foregoing fifth embodiment (the data bus amplifier controlled by the enable signals enA and enB, in the modified example of the fifth embodiment). It will also be appreciated that the data bus amplifier controlled by the enable signals enA and enB can also be employed as the PRD-type data bus amplifier 6 used in the branching bus structure of the fourth embodiment shown in FIG. 22.

Figure 36:
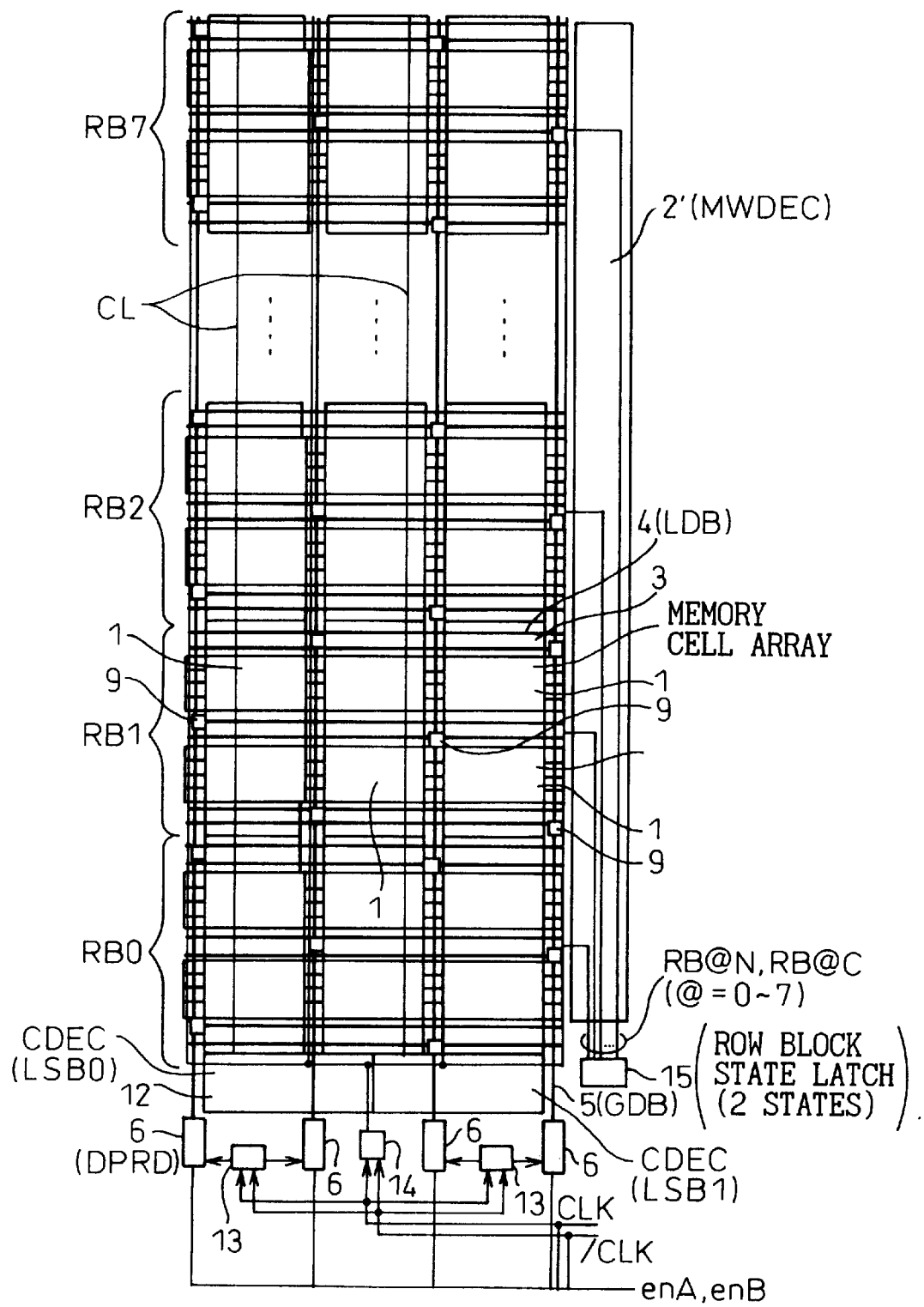
FIG. 36 is a block diagram showing an example of the organization of a semiconductor memory device as a seventh embodiment of the signal transmission system to which the present invention is applied.
Figure 37:
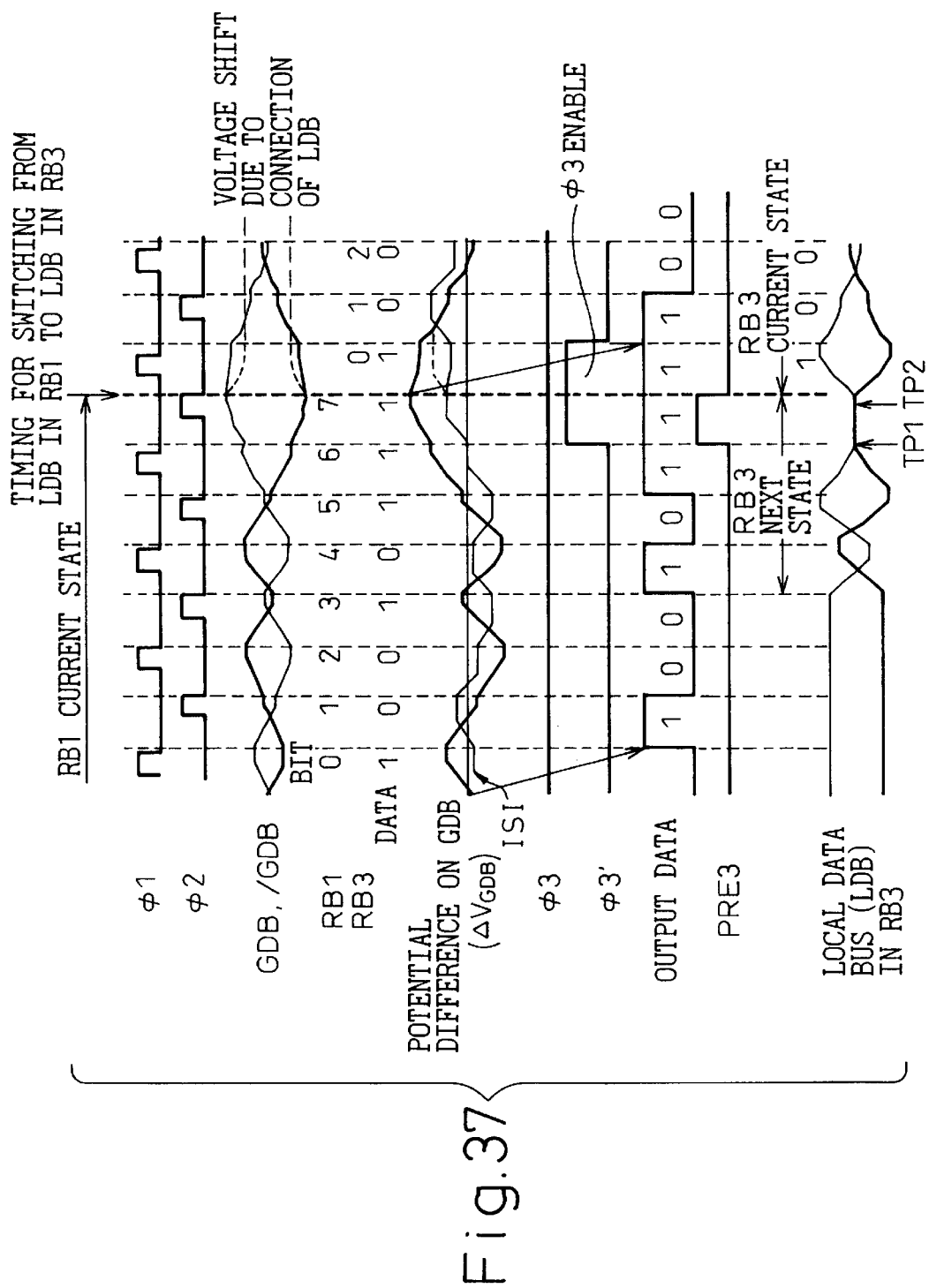
FIG. 37 is a diagram showing one example of operating waveforms in the semiconductor memory device of FIG. 36.

FIG. 36 is a block diagram showing an example of the organization of a semiconductor memory device as a seventh embodiment of the signal transmission system to which the present invention is applied, and FIG. 37 is a diagram showing one example of operating waveforms in the semiconductor memory device of FIG. 36. In FIG. 36, reference numeral 1 is a memory cell array, 2' is a word decoder array (main word decoder: MWDEC), 3 is a sense amplifier (sense amplifier array), 4 is a local data bus (LDB), 5 is a global data bus (GDB), 6 is a data bus amplifier (differential-type PRD data bus amplifier: DPRD), 9 is a local data bus switch, 12 is a column decoder (CDEC), 13 is a PRD pulse generating circuit, 14 is a local data bus switch pulse generating circuit, and 15 is a row block state latch circuit. The PRD pulse generating circuit 13 is a circuit that generates control signals ($\phi1$, $\phi2$, $\phi3$), etc. used in the data bus amplifier 6, and the local data bus switch pulse generating circuit 14 is a circuit that generates signals for controlling the switching of the respective local data bus switches 9.

As shown in FIG. 36, the semiconductor memory device (main section) comprises eight row blocks (RB: RB0–RB7) each of which has a main word decoder (MWDEC) 2' and sub word decoders (SWDEC) 2. When switching the local data bus (LDB) 4 from one row block RB to another, a continuous (gapless and uninterrupted) data read operation is performed, with the sense amplifier 3 acting as a driver. The PRD-type data bus amplifier 6 is provided on each global data bus 5. The invention, however, is not restricted to the semiconductor memory device having the particular configuration shown in FIG. 36, but it will be appreciated that the invention is applicable to semiconductor memory devices of various other configurations.

In the seventh embodiment, data from the sense amplifier 3 is transferred via the selected column gate and local data bus switch 9 and via the global data bus 5, and is amplified by the complementary-type bus amplifier equipped with an intersymbol interference component elimination (estimation) function. The pulses (control signals) used in the PRD bus amplifier 6 are generated by the PRD pulse generating circuit 13. In the seventh embodiment, the pulses from one PRD pulse generating circuit 13 are supplied to two PRD bus amplifiers 6, but the pulse supply method is not limited to the illustrated example. For example, the configuration may be modified so that the pulses from one PRD pulse generating circuit 13 are delivered to four PRD bus amplifiers, or even to all of the PRD bus amplifiers 6.

The clock CLK supplied to the PRD pulse generating circuits 13 is supplied, for example, in a tree form to prevent skew from appearing depending on the location, but the method of clock supply is not limited to this particular example. Further, in the seventh embodiment, the row block state latch circuit 15 is provided to store the row block states necessary to achieve a gapless data read when switching from one local data bus 4 to another; the row block state latch circuit 15 can be constructed as a latch for storing, for example, two states for each row block RB, one state indicating that the row block is the one to be accessed next (NEXT) and the other indicating that the row block is currently being accessed (CURRENT). Signals indicating these states, i.e., an RB@C signal (indicating RB@ is the currently accessed row block) and an RB@N signal (indicating RB@ is the row block to be accessed next), are output from the latch circuit 15 onto the main word decoder (MWDEC) 2', and the RB@C signal and RB@N signal are supplied to the respective row blocks RB (RB0–RB7) (here, @ represents any number from 0 to 7). The select signal (CL) of the selection transistor (column gate) to selectively drive the bus at the time of bus switching is common to both the activated and deactivated local buses.

FIG. 37 shows the case where the currently accessed row block (CURRENT row block) is RB1 (RB1C) and the row block to be accessed next (NEXT row block) is RB3 (RB3N).

In FIG. 37, reference character TP1 shows the timing at which the complementary local data buses 4 (LDB, /LDB) are short-circuited and precharged to an intermediate voltage (Vii/2), and TP2 indicates the timing at which to start activating the switch (local data bus switch 9) connecting the global data bus (GDB: 5) to the local data bus (LDB: 4) in the row block RB3 to be accessed next. The timing TP2 is also the timing at which a deactivate signal rises to deactivate the local data bus switch (9) connecting the global data bus GDB to the local data bus LDB in the currently accessed row block RB1. In the seventh embodiment, the precharge signal (PRE3) for the next row block RB3 is output at the timing (timing TP1) one bit earlier than the switching timing, to precharge the local data bus LDB in the row block RB3. The waveforms shown in FIG. 37 correspond in general to the operating waveforms previously shown in FIG. 25.

Figure 38:
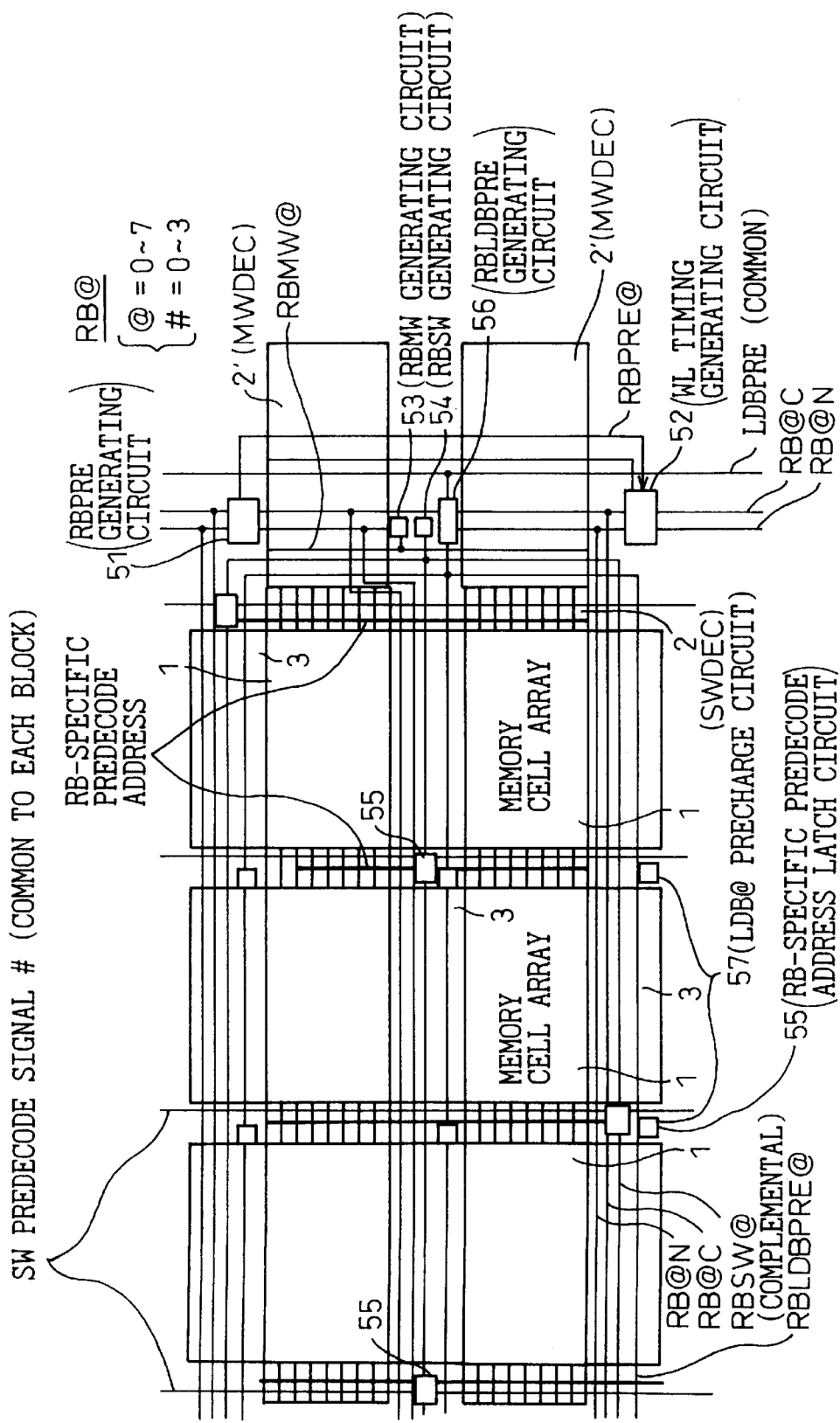
FIG. 38 is a block diagram showing an example of the organization of a row block in the semiconductor memory device of FIG. 36.
Figure 39:
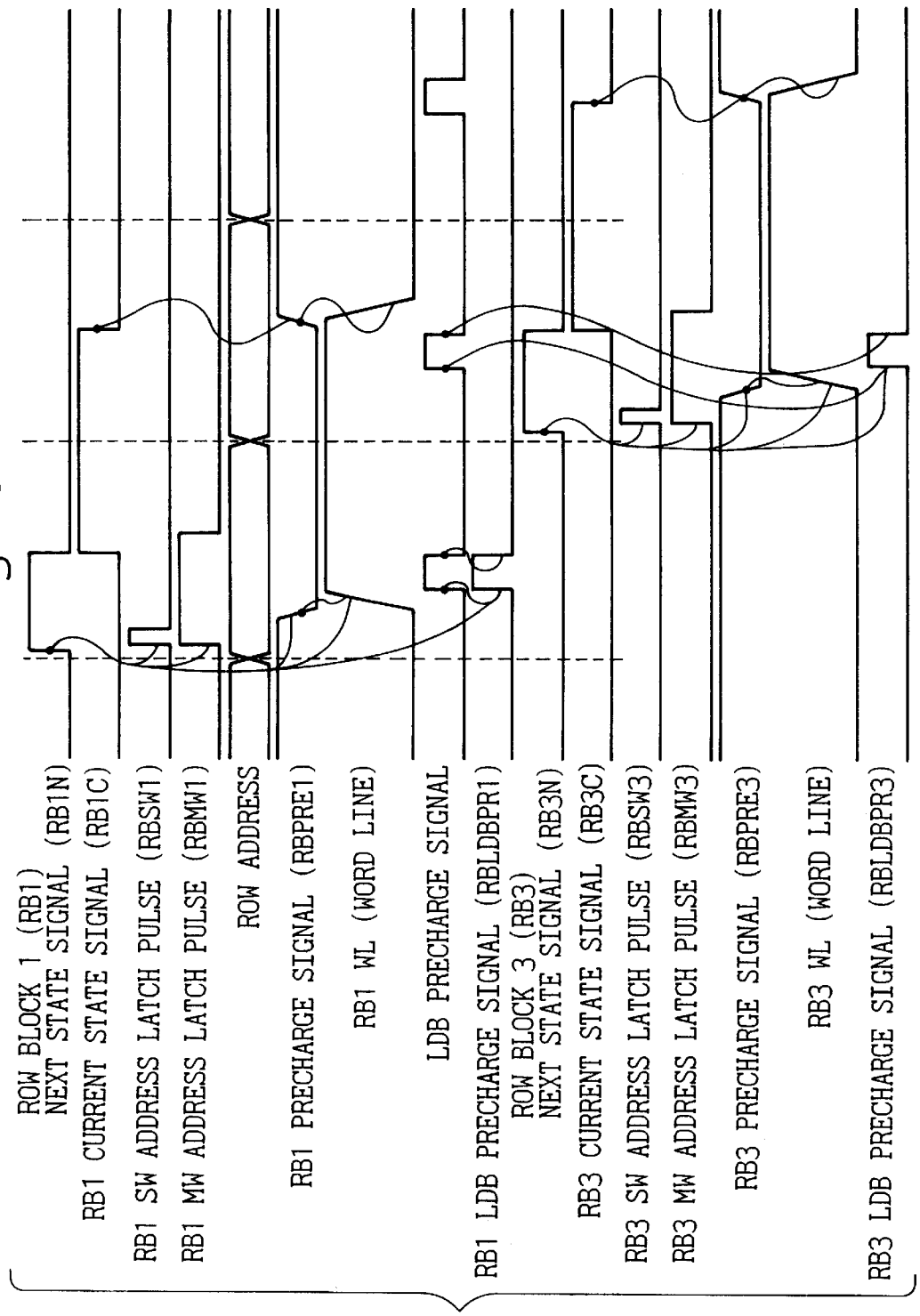
FIG. 39 is a waveform diagram for explaining one example of an operation sequence in FIG. 38.

FIG. 38 is a block diagram showing an example of the organization of one row block (RB@) in the semiconductor memory device of FIG. 36, and FIG. 39 is a waveform diagram for explaining one example of an operation sequence in FIG. 38. In FIG. 38, the column gate select signal lines (CL), global data buses (GDB), local data buses (LDB), and local data bus switches (9) are not shown to avoid complication. Shown in FIG. 39 is one example of the sequence for a block select operation initiated by the signals (RB@C and RB@N) from the row block state latch circuit 15.

In FIGS. 38 and 39, reference character RBPRE@ indicates a row block precharge signal generated by an RBPRE generating circuit 51 in each row block (RB) and supplied within the block (row block). This signal is also supplied to a WL timing signal generating circuit 52. When the RBPRE signal is enabled, the word line (WL) is reset. The WL timing signal generating circuit 52 generates rise timing and fall timing for the word lines (WL) within the block. Further, an RBMW@ signal is generated by an RBMW generating circuit 53 and supplied to the main word decoder (MWDEC) 2' within the block. When the RBMW@ signal is at a high level "H", the main word decoder 2' in the block can accept an address; when the RBMW@ signal is at a low level "L", the selected main word (MW) will remain unaffected if an address signal in the main word decoder 2' changes. Reference numeral 57 is an LDB@ precharge circuit for precharging a local data bus in the block.

An RBSW generating circuit 54 generates an RBSW@ signal (pulse). In the example of FIG. 38, the RBSW@ signal is a complementary signal, which is passed through each sense amplifier array (3) and supplied to an RB-specific SW predecode address latch circuit 55 located at the intersection of the sense amplifier and the sub word decoder (SWDEC) 2. The RB-specific SW predecode address latch circuit 55 latches a common sub word predecode signal (SW predecode signal #) for the block by the RBSW@ signal; in this way, if local data bus switching occurs when the sub word predecode signal tries to access another block, the sub word predecode signal can be retained for each block.

In the seventh embodiment, there are four sub word predecode signals, 0 to 3, and # in the SW predecode signal # represents any number from 0 to 3. An RBLDBPRE generating circuit 56 generates an RBLDBPRE@ signal; the precharge signal (PBLDBPRE@ signal) for the local data buses (LDB) in each block is created from the RB@N signal and LDB precharge signal (RBLDBPRE@ signal). With the RBLDBPRE@ signal, the bus to be selected next can be precharged at least one bit time before the switching occurs. If a gapless write operation (uninterrupted write operation) is also to be performed here, a change must be made to the RBLDBPRE@ signal, as will be described in detail later. It will also be recognized that, in the signal transmission system (bus system) of the present invention applied to the semiconductor memory device, data bus precharge need not be performed during seamless data read.

In a data read operation in the semiconductor memory device, since the number of bits of read data is known in advance, the number of bits already read out is counted by a counter using, for example, the clock signal CLK running through the chip (semiconductor memory device) and, immediately before the final bit switching, the LDBSW signal generating circuit generates a signal for switching the local data bus switch (GDB-LDBSW); the LDB-GDB-SW circuit then takes logic between the switching signal and the RB@N signal for each block so that the local data bus switching operation is initiated just before the switching timing. The seventh embodiment thus employs the method to initiate the bus switching operation just before the switching timing, and its operation is as shown in FIG. 39. In FIG. 36, it is shown that cell arrays are arranged only on one side (upper left side of the figure) of the main word decoder (MWDEC) 2', but it will be appreciated that cell arrays may be arranged on both sides thereof, and also that the arrangement may be modified in various ways.

Figure 40:
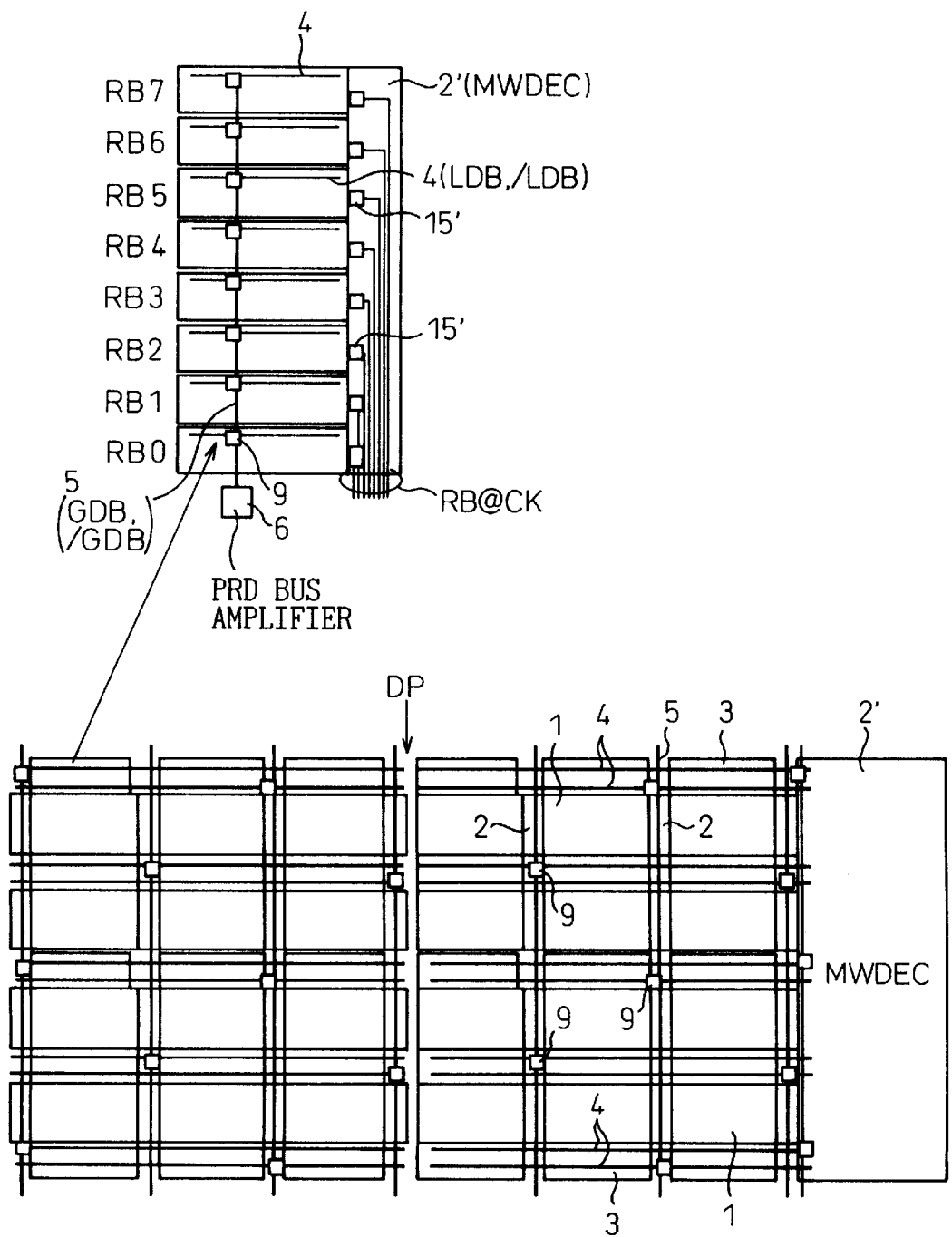
FIG. 40 is a block diagram showing an example of the organization of a semiconductor memory device as an eighth embodiment of the signal transmission system to which the present invention is applied.

FIG. 40 is a block diagram showing an example of the organization of a semiconductor memory device as an eighth embodiment of the signal transmission system to which the present invention is applied. As in the foregoing seventh embodiment, the eighth embodiment also comprises eight row blocks (RB: RB0–RB7), but the number of row blocks RB need not necessarily be limited to 8; for example, a configuration using, for example, four or 16 row blocks is also possible. Further, as in the seventh embodiment, in the eighth embodiment also, a plurality of local data buses 4 (LDB, /LDB) are connected to one global data bus 5 (GDB, /GDB) via local data bus switches 9 (GDB-LDBSW), and a PRD-type data bus amplifier 6 is provided for the global data bus 5. FIG. 40 shows an example having a plurality of such blocks. The row block RB shown in the lower half of the figure has a capacity four times that of the row block RB shown in 2; FIG. 38. Further, each local data bus (LDB) is divided into two parts at position indicated by reference character DP. Reference character RB@CK shows a row block state transition clock, where @ represents any number from 0 to 7.

The column select signal (CL) is activated across the plurality of row blocks (RB0–RB7) each of which, as in the seventh embodiment, has a main word decoder (MWDEC) 2' and sub word decoders (SWDEC) 2. The eighth embodiment concerns an example in which, when switching the local data bus (LDB) from one row block to another, gapless data read is performed, with the sense amplifier 3 acting as a driver.

Further, the pulses (control signals) used in the PRD bus amplifier 6 are generated by the PRD pulse generating circuit (13), which is the same as in the foregoing seventh embodiment and, therefore, is not illustrated in detail here. The pulses from one PRD pulse generating circuit (13) may be supplied to two PRD bus amplifiers 6, as in the seventh embodiment; alternatively, provisions may be made so that the pulses from one PRD pulse generating circuit are delivered, for example, to four PRD bus amplifiers 6, or even to all of the PRD bus amplifiers 6. The clock (CLK) wiring to the PRD pulse generating circuits may be arranged in a tree form to prevent skew from appearing depending on the location, but the wiring need not be limited to the tree arrangement, for example, in cases where a slow operating speed is allowed.

The eighth embodiment shows an example where there are four bus state signals: the first state (NEXT) indicates that bus activation is initiated for the bus to be accessed next, the second state (CURRENT) indicates that the bus is currently activated and being accessed, the third state (PREVIOUS) indicates that the bus is still active but the access is completed, and the fourth state (STANDBY) indicates that the bus is inactive and not being accessed. The STANDBY here means that the row block (RB) is ready for an access operation at any time, and does not mean that the row block is in the dormant state. These four state signals (RB@N, RB@C, RB@P, and PB@S) are held in the row block state latch circuit 15' provided for each row block.

Figure 41:
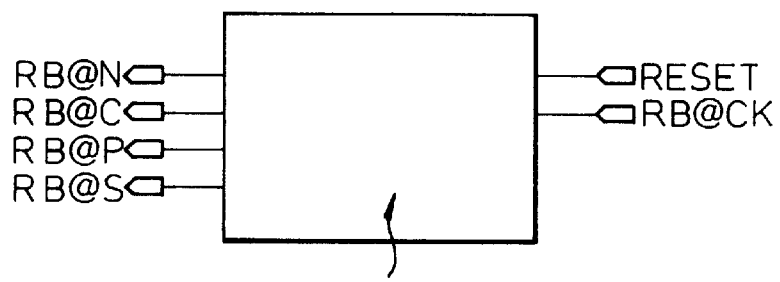
FIG. 41 is a block diagram showing a latch circuit in the eighth embodiment of FIG. 40.
Figure 42:
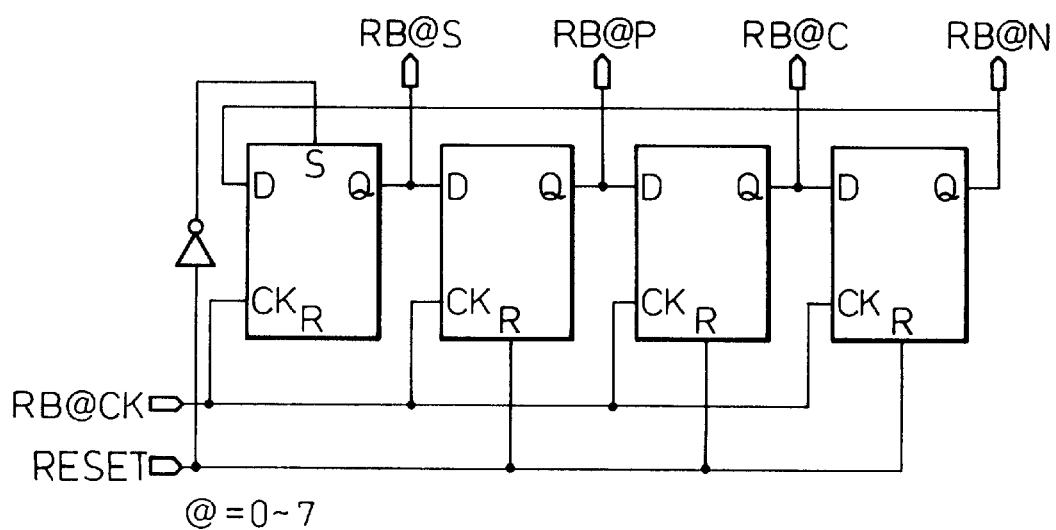
FIG. 42 is a block circuit diagram showing one example of the latch circuit of FIG. 41.
Figure 43:
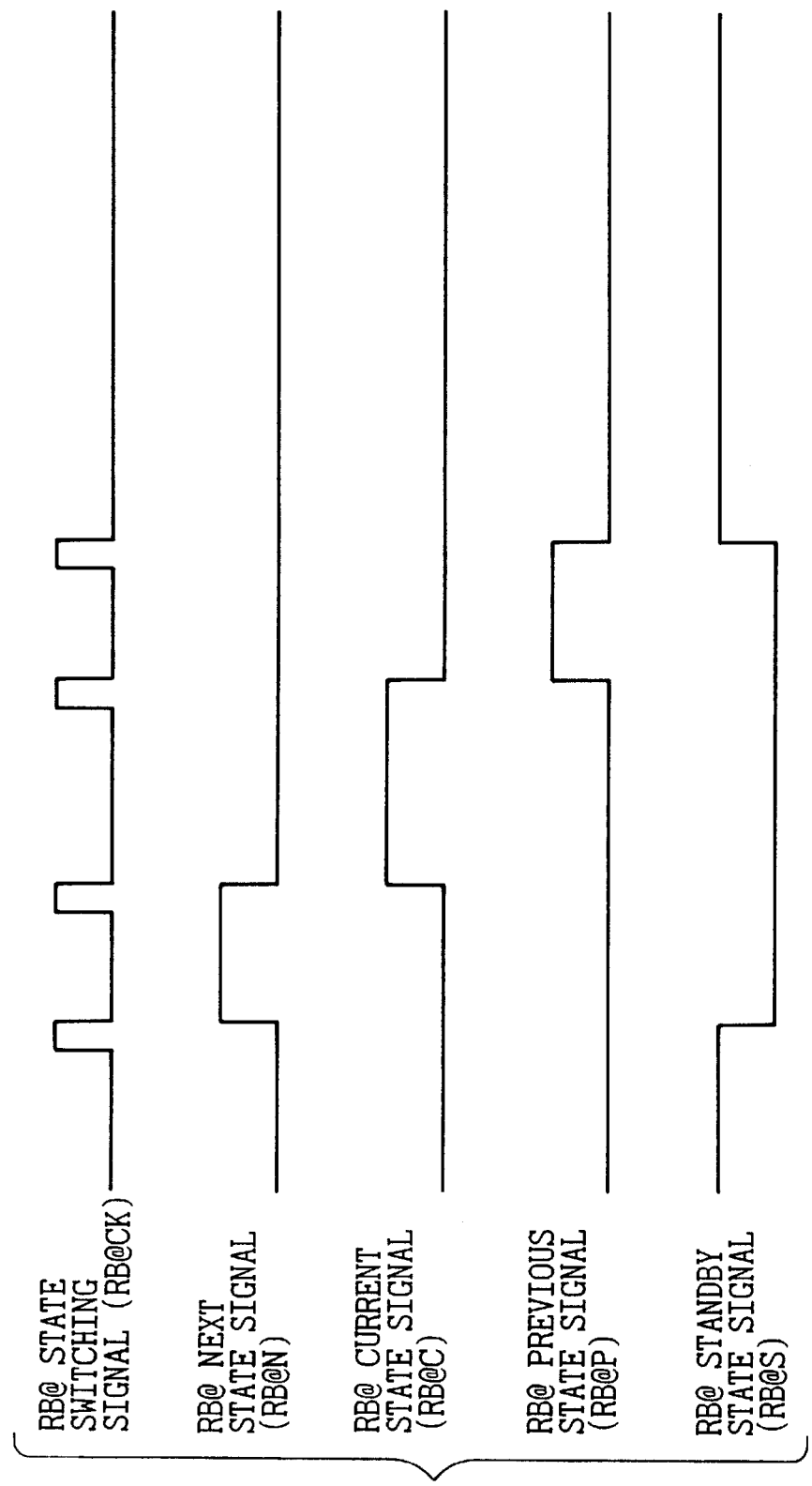
FIG. 43 is a waveform circuit diagram showing one example of the operation of the latch circuit of FIG. 42.

FIG. 41 is a block diagram showing the latch circuit (row block state latch circuit 15') in the eighth embodiment shown in FIG. 40, FIG. 42 is a block circuit diagram showing one example of the latch circuit of FIG. 41, and FIG. 43 is a waveform diagram for explaining one example of the operation of the latch circuit shown in FIG. 42.

As shown in FIGS. 41 and 42, the row block state latch circuit (RB state latch circuit) 15' comprises four flip-flops (RS flip-flops) and an inverter, and is constructed to receive a row block state transition clock (RB@CK signal, where @ represents any number from 0 to 7) and a reset signal (RESET signal) and to hold (output) one of the four state signals (RB@N, RB@C, RB@P, and PB@S).

First, when the RESET signal goes to the high level "H", the RB state latch circuit 15' and its associated row block RB retains the STANDBY state. In the eighth embodiment, the RESET signal is common to all row blocks. For the selected row block (RB@), one RB@CK signal pulse (RB@CK pulse) is applied to the latch circuit 15', causing the latch circuit 15' and the RB@ to transition to the NEXT state. The NEXT state is a preparatory state for data read (or data write); more specifically, in this state, selection and raising of the word line (WL), activation of the sense amplifier (3), etc. are performed.

When the next RB@CK pulse arrives, the RB@ enters the CURRENT state, that is, the state to perform the data read (or data write). When a further RB@CK pulse arrives, the RB state latch circuit 15' and the RB@ enter the PREVIOUS state. In the PREVIOUS state, lowering of the word line (WL), deactivation of the sense amplifier (3), precharging of the bit line (BL), etc. are performed. In a data write operation, a memory cell data restore operation is also performed. In the PREVIOUS state, external access to the row block is prohibited. That is, the signal (RB@P) indicating the PREVIOUS state is also used as an access prohibit signal, and is output externally as necessary. Using this signal (RB@P), it is also possible to put an external access in a waiting state.

In the above operation, to provide gapless data read (or data write) at the time of RB (row block) switching (local data bus LDB switching), the RB to be selected next is put in the NEXT state so that operations such as raising the word line in the RB to be selected next are performed while the currently accessed RB is in the CURRENT state. When data read (or data write) in the current RB is complete, the current RB is put in the PREVIOUS state and, at the same time, the next RB is put in the CURRENT state, thereby preventing a gap (discontinuity) from occurring at the time of RB switching. By performing these operations in parallel, gapless (uninterrupted and seamless) read or write operations can be achieved.

Figure 44:
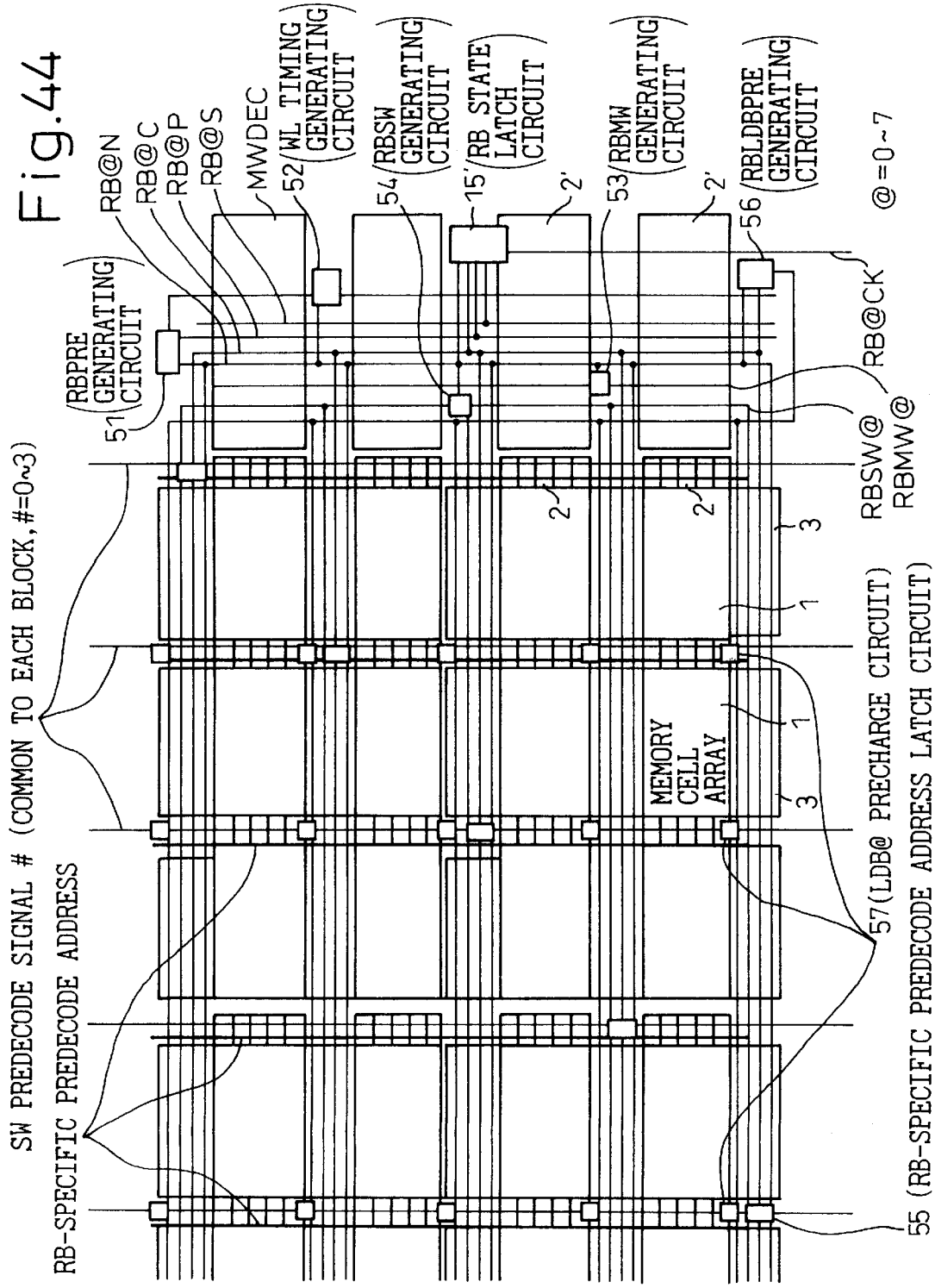
FIG. 44 is a block diagram showing in enlarged form an example of the organization of a row block in the eighth embodiment of FIG. 40.
Figure 45:
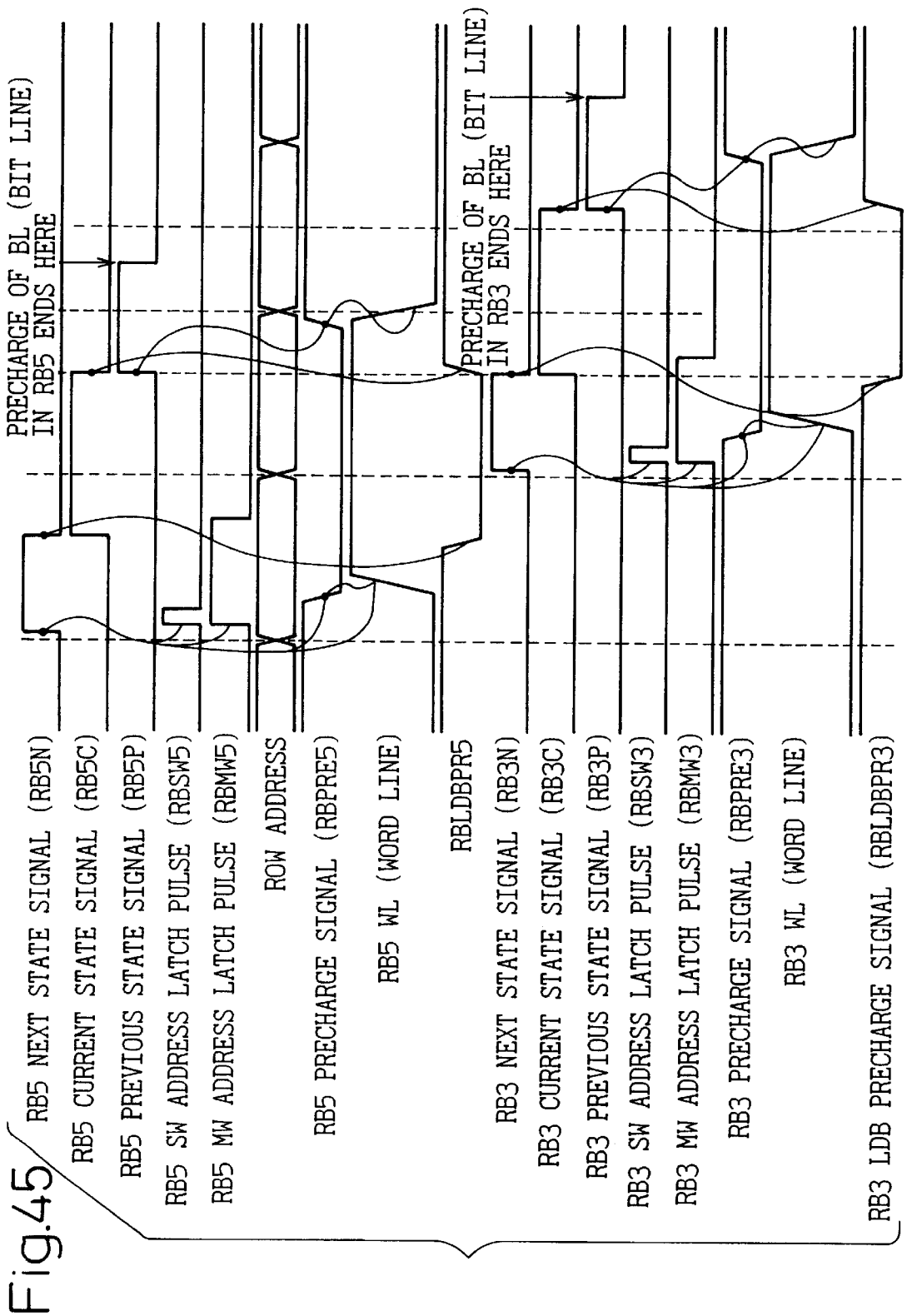
FIG. 45 is a waveform diagram for explaining one example of an operation sequence in the semiconductor memory device of the eighth embodiment shown in FIG. 40.

FIG. 44 is a block diagram showing in enlarged form the organization of a block (main section) in the eighth embodiment shown in FIG. 40, and FIG. 45 is a waveform diagram for explaining one example of an operation sequence in the semiconductor memory device of the eighth embodiment shown in FIG. 40.

As can be seen from the comparison between FIGS. 44 and 38, the row block organization of the semiconductor memory device of the eighth embodiment is essentially the same as that of the foregoing seventh embodiment, except that the number of memory cell arrays (storage capacity) contained in each row block is different. As in FIG. 38, in FIG. 44 also, the column gate select signal lines (CL), global data buses (GDB), local data buses (LDB), and local data bus switches (9) are not shown to avoid complication. Shown in FIG. 45 is one example of the sequence for a block select operation initiated by the signals (RB@C, RB@N, RB@P, RB@S) from the row block state latch circuit (RB state latch circuit) 15'.

As earlier stated, the RB state latch circuit 15' is provided for each RB (row block), and is supplied with RB@CK. The RB state latch circuit 15' outputs one of four state signals, RB@N signal, RB@C signal, RB@P signal, or RB@S signal, depending on the state of the RB. In FIG. 44, reference character RBPRE@ is a row block precharge signal generated from the RB@N signal and RB@C signal by an RBPRE generating circuit 51 in each row block (RB) and supplied within the block. This signal is also supplied to the WL timing signal generating circuit 52. When the RBPRE@ signal is enabled, the word line (WL) is reset. The WL timing signal generating circuit 52 generates rise timing and fall timing for the word lines (WL) within the block. Further, an RBMW@ signal is generated from the RB@N signal by the RBMW generating circuit 53 and supplied to the main word decoder (MWDEC) 2' within the block. When the RBMW@ signal is at a high level "H", the main word decoder 2' in the block can accept an address; when the RBMW@ signal is at a low level "L", the selected main word (MW) will remain unaffected if an address signal in the main word decoder 2' changes. Reference numeral 57 is an LDB@ precharge circuit for precharging a local data bus in the block.

The RBSW generating circuit 54 generates an RBSW@ signal (pulse) from the RB@N signal. In the example of FIG. 44, the RBSW@ signal is a complementary signal, which is passed through each sense amplifier array (3) and supplied to the RB-specific SW predecode address latch circuit 55 located at the intersection of the sense amplifier and the sub word decoder (SWDEC) 2. The RB-specific SW predecode address latch circuit 55 latches a common sub word predecode signal (SW predecode signal #) for the block by the RBSW@ signal; in this way, if local data bus switching occurs when the sub word predecode signal tries to access another block, the sub word predecode signal can be retained for each block.

In the eighth embodiment, there are four sub word predecode signals, 0 to 3, and # in the SW predecode signal # represents any number from 0 to 3. The RBLDBPRE generating circuit 56 generates an RBLDBPRE@ signal from the RB@N signal and RB@C signal; the eighth embodiment employs a method in which LDB precharge in the selected RB is stopped only when reading (or writing) data. This precharge method can also provide a gapless write (continuous write) operation described later (15th embodiment: See FIG. 72). It will also be recognized that, in the signal transmission system (bus system) of the present invention applied to the semiconductor memory device, data bus precharge need not be performed during seamless data read.

As previously described, in the data read operation in the semiconductor memory device of the eighth embodiment, since the number of bits of read data is known in advance, the number of bits already read out is counted by a counter using, for example, the clock signal CLK running through the chip (semiconductor memory device) and, immediately before the final bit switching, the LDBSW signal generating circuit generates a signal for switching the local data bus switch (GDB-LDBSW); the LDB-GDB-SW circuit then takes logic between the switching signal and the RB@N signal for each block so that the local data bus switching operation is initiated just before the switching timing. The eighth embodiment thus employs the method to initiate the bus switching operation just before the switching timing, and its operation is as shown in FIG. 39. In FIG. 40, it is shown that cell arrays are arranged only on one side (upper left side of the figure) of the main word decoder (MWDEC) 2', but it will be appreciated that cell arrays may be arranged on both sides thereof, and also that the arrangement may be modified in various ways.

Figure 46:
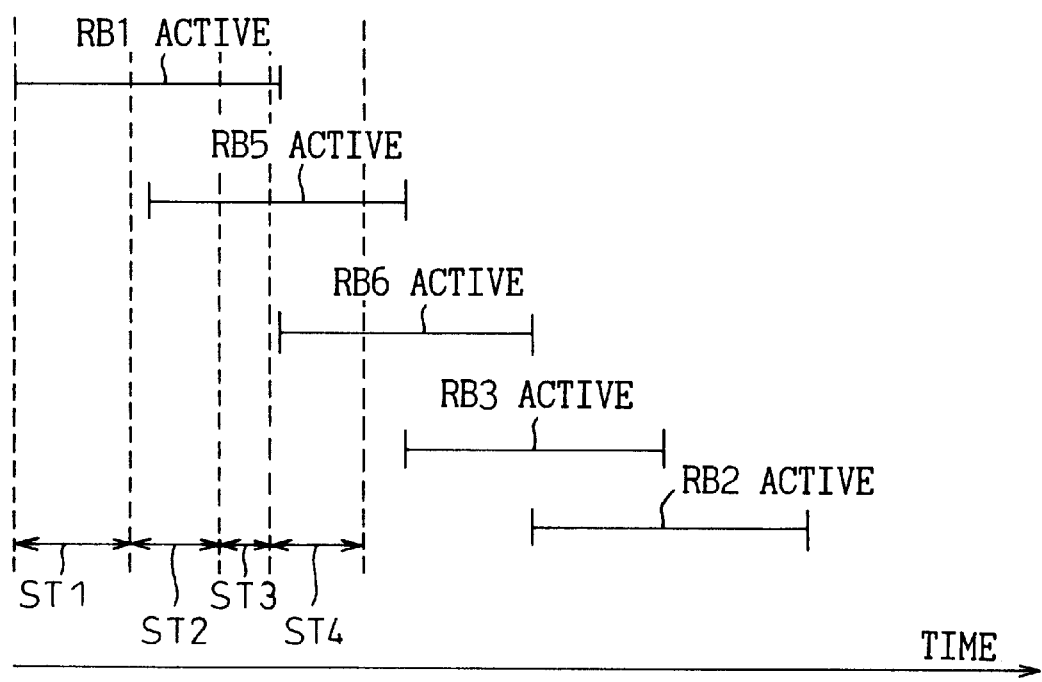

FIGS. 46 and 47 are diagrams showing the operational states of the semiconductor memory device of the eighth embodiment shown in FIG. 40.

As shown in FIGS. 46 and 47, in period ST3, for example, the row block RB5 (local bus group 5) is active and currently being accessed (CURRENT state), while the row block RB1 (local bus group 1) is still active but access to it is completed. Here, an access cannot be made to the RB1 (row block) in the PREVIOUS state until after restoring cell data, lowering the word line (WL), and precharging the bit line (BL) in the RB1. Further, in the RB1 in the PREVIOUS state, the bit line transfer gate is raised (turned on) and the local data bus (LDB) is precharged at the time of SSA schema writing in an embodiment described later. The row block RB6 (local bus group 6) is in the NEXT state, getting ready for access, with the word line beginning to rise and the sense amplifier holding data latched therein. The other row blocks (RB0, RB2, RB3, RB4, and RB7) are inactive and in the STANDBY state. Row blocks in the STANDBY state are ready for selection at any time. In a read operation, in response to the NEXT state signal and the switching signal, the local data bus in the row block in the NEXT state is released from the precharged state just before the switching is made. The read operation waveform is the same as that in the seventh embodiment (see FIG. 37) and, therefore, is not shown here.

Figure 48:
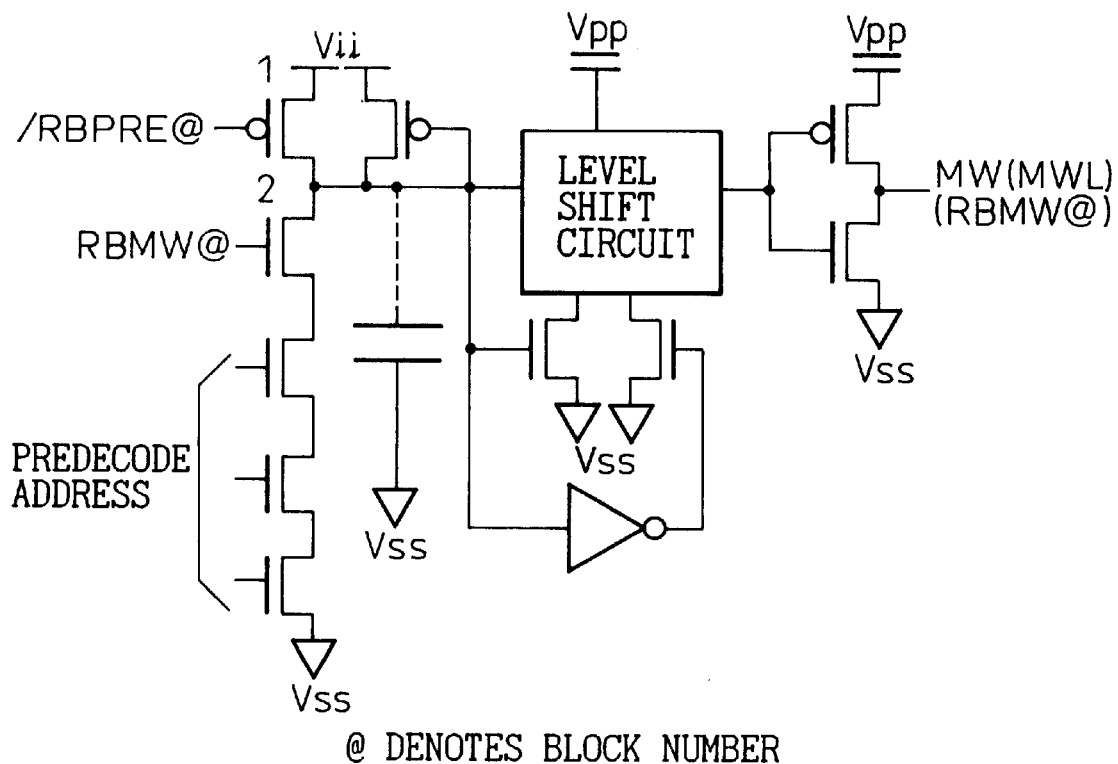
FIG. 48 is a block diagram showing an example of the configuration of a main word decoder in a semiconductor memory device as a ninth embodiment of the signal transmission system to which the present invention is applied.

FIG. 48 is a block circuit diagram showing one example of the main word decoder (MWDEC) 2' in the semiconductor memory device as a ninth embodiment where the present invention is applied. The circuit configuration shown here is applicable to the semiconductor memory devices of the seventh and eighth embodiments described above. Reference character Vpp designates a pull-up voltage level (pull-up voltage supply line).

As shown in FIG. 48 as well as FIGS. 38 and 44, the main word decoder 2' as a holding circuit for main word lines (MWL) is supplied with the RBMW@ signal from the RBMW generating circuit 53, the RBPRE@ signal (actually, its complementary signal /RBPRE@) from the RBPRE generating circuit 51, and a predecode address, and outputs an MW signal (RBMW@ signal) for the MWL. That is, in the semiconductor memory devices of the seventh and eighth embodiments, row selection lines for memory cell arrays are arranged in a parent-child structure (hierarchical structure), with the sub word lines (SWL) arranged at lower levels than the main word lines (MWL).

The MWDEC (main word decoder) 2' holds the state of the MWL (main word line) at a dynamic node; this allows selection of any row address in other RBs despite the fact that the row predecode signal is shared with other RBs (row blocks). More specifically, the MWDEC 2' accepts an address (predecode address) change only when both the RBMW@ and /RBPRE@ signals are high "H". After address transition, the MWDEC 2' will not be affected even if the MWL predecode address changes to raise a MWL in another RB, as long as the RBMW@ signal is at the low level "L". The MWL is lowered when the /RBPRE signal is low "L".

In the ninth embodiment, the high level "H" of the MWL acts as the power supply to the SWDEC (sub word decoder) 2; therefore, when the MWL is reset (to the low level "L"), the operation of the SWDEC2 does not affect the selection of the MWL.

Figure 49:
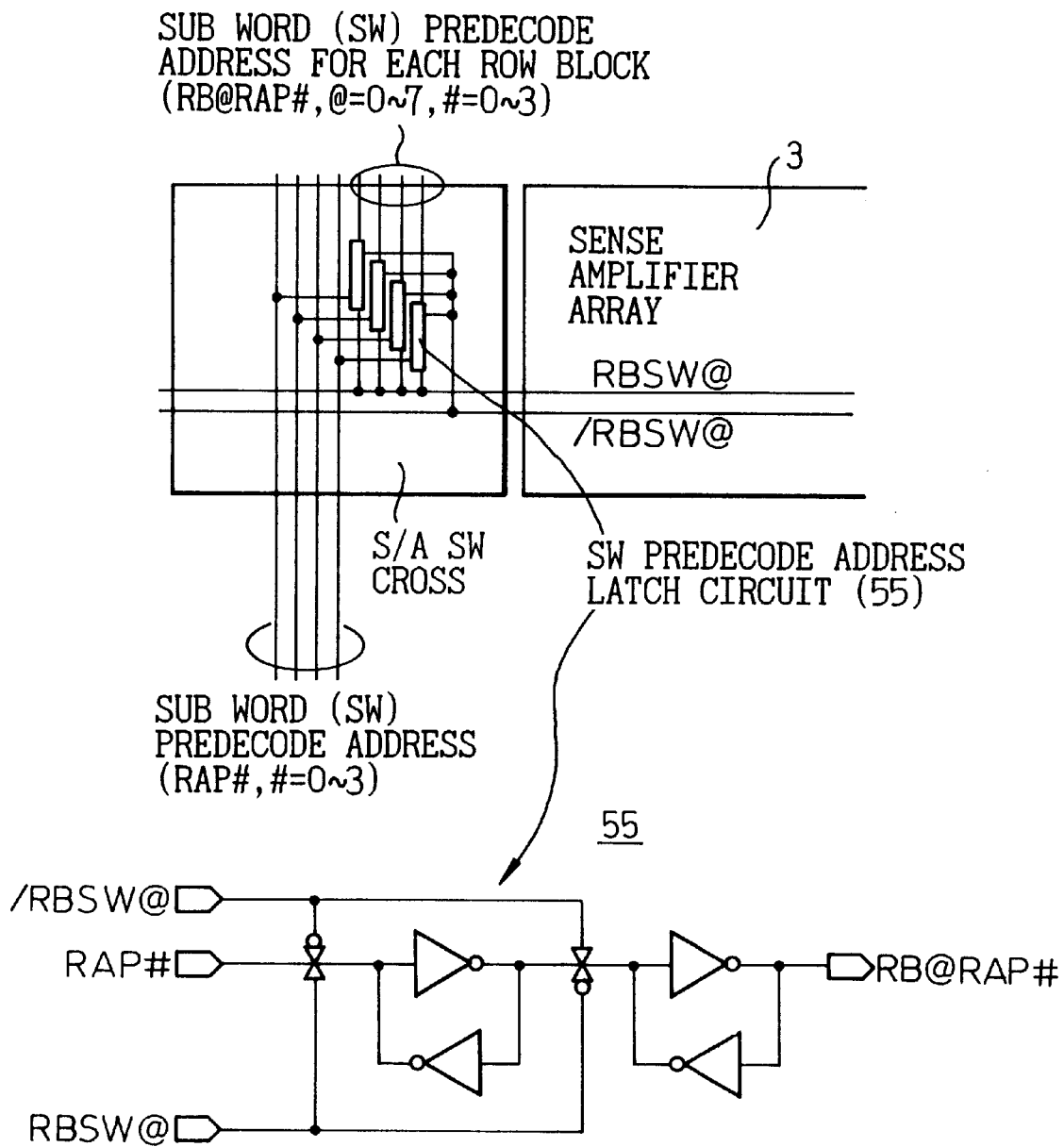
FIG. 49 is a block diagram showing an example of the configuration of a sub word predecode address latch circuit in the semiconductor memory device as the ninth embodiment of the signal transmission system to which the present invention is applied.

FIG. 49 is a block circuit diagram showing one example of the sub word predecode address latch circuit (PB-specific SW predecode address latch circuit 55) in the semiconductor memory device as the ninth embodiment to which the present invention is applied.

As already described in connection with the seventh and eighth embodiments, the ninth embodiment also employs the method in which the sub word predecode address (SW predecode address) common to RBs is held by the SW predecode address latch circuit 55 for each RB. It is of course possible to configure it to dynamically hold SWLs as in the case of MWLs. Since four SWLs are provided for every MWL, four predecode lines are provided.

As shown in FIG. 49, the SW predecode address latch circuit 55 comprises cascaded transfer gates and a latch, and latches the SW predecode address by the RBSW@ signal (RBSW@, /RBSW@) generated for each RB. The SW predecode address latch circuit 55 has a reset function, though not shown here.

Figure 50:
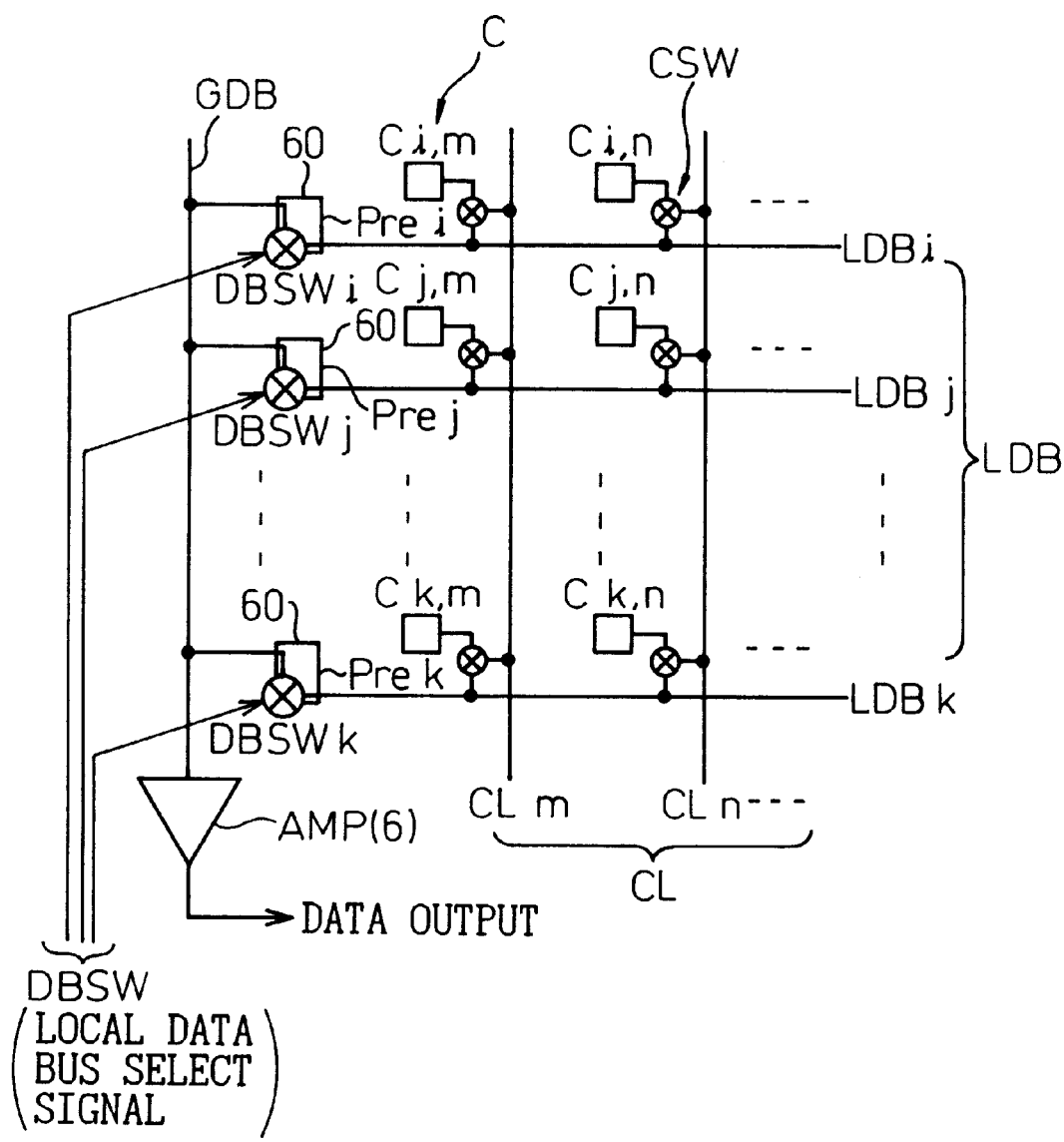
FIG. 50 is a diagram conceptually illustrating a hierarchical bus structure as a 10th embodiment of the signal transmission system to which the present invention is applied.

FIG. 50 is a diagram conceptually illustrating a hierarchical bus structure as a 10th embodiment of the signal transmission system to which the present invention is applied. Shown here is another example of the method in which gapless data read is achieved using the PRD-type bus amplifier when the data path is switched from one local data bus (LDB) to another.

In the 10th embodiment, a global data bus level detection and precharge circuit 60 is provided, for example, at the position of each of the local bus switches DBSW (DBSWi, DBSWJ, . . . , DBSWk: 9) in the sixth embodiment shown in FIG. 35. Precharge signals (Prei, Prej, . . . , Prek) are applied to the respective global data bus level detection and precharge circuits 60 to control the precharge operation of the precharge circuit 60.

More specifically, in the 10th embodiment, each global data bus level detection and precharge circuit 60 detects the voltage on the global data bus (GDB: GDB, /GDB), and supplies a voltage, close to the voltage on the global data bus, as a precharge level to the data bus (LDB5: LDB5, /LDB5) to be selected next, thereby precharging the data bus before it is selected. This allows the use of the conventional PRD-type bus amplifier (the bus amplifier without capacitors C30, shown, for example, in FIGS. 9 and 10). The precharge level supplied by the global data bus level detection and precharge circuit 60 need not necessarily be set to the same level as the global data bus, but need only be set to such a level as to precharge the local data bus (LDB5) in a direction that reduces the amount of the voltage change that occurs when the local data bus (LDB5) to be selected next is connected to the global data bus (GDB). In the latter case, it is preferable to use the PRD-type bus amplifier such as that used in the third and fifth embodiments (see FIGS. 23 and 24 and FIGS. 28 and 29). Further, in the 10th embodiment, the position of each global data bus level detection and precharge circuit 60 is not limited to the position where each local bus switch DBSW is provided.

Figure 51:
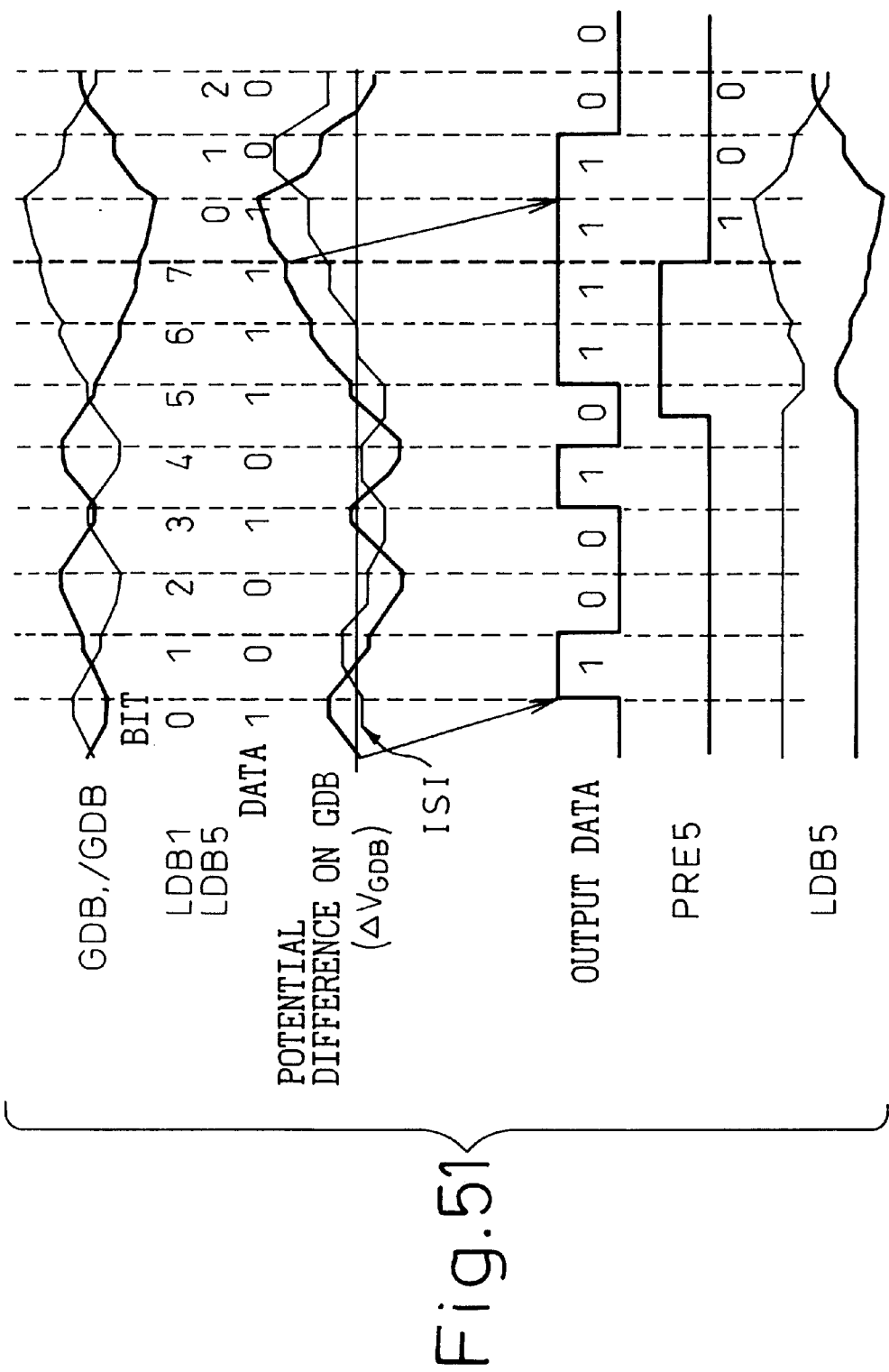
FIG. 51 is a diagram showing one example of operating waveforms in the signal transmission system of FIG. 50.

FIG. 51 is a diagram showing an example of operating waveforms in the signal transmission system of FIG. 50.

As shown in FIG. 51, in the 10th embodiment, just before the data bus switching occurs, a precharge signal (Pre5) of the level close to that of the global data bus GDB is supplied as a precharge level to the local data bus (LDB5) to be selected next, thereby reducing the amount of the voltage change that occurs when the LDB5 is connected to the GDB. The timing for precharging the LDB5 is not limited to one bit time before the switching timing; the only requirement is that the precharge be performed just before the local data bus switching is made.

FIG. 52 is a circuit diagram showing an example of the configuration of a bus level setting circuit as an 11th embodiment of the signal transmission system to which the present invention is applied, and FIG. 53 is a diagram for explaining the operation of the bus level setting circuit of FIG. 52.

Similarly to the foregoing embodiment, in the 11th embodiment, the bus level setting circuit 61 is provided to reduce the amount of the voltage change that occurs when the local data bus (LDB5) to be selected next is connected to the global data bus (GDB), as shown in FIG. 52. As shown in FIG. 53, the bus level setting circuit 61 precharges the local data bus LDB5 to a level close to that of the global data bus GDB by turning on the precharge switch (PreSW) at timing immediately before switching is made to the local data bus LDB5. Here, the NMOS transistor connected to the high-level voltage supply line (Vii) and the PMOS transistor connected to the low-level voltage supply line (Vss) are both required to have a threshold voltage (Vth) close to zero (that is, a very small threshold voltage).

Figure 54:
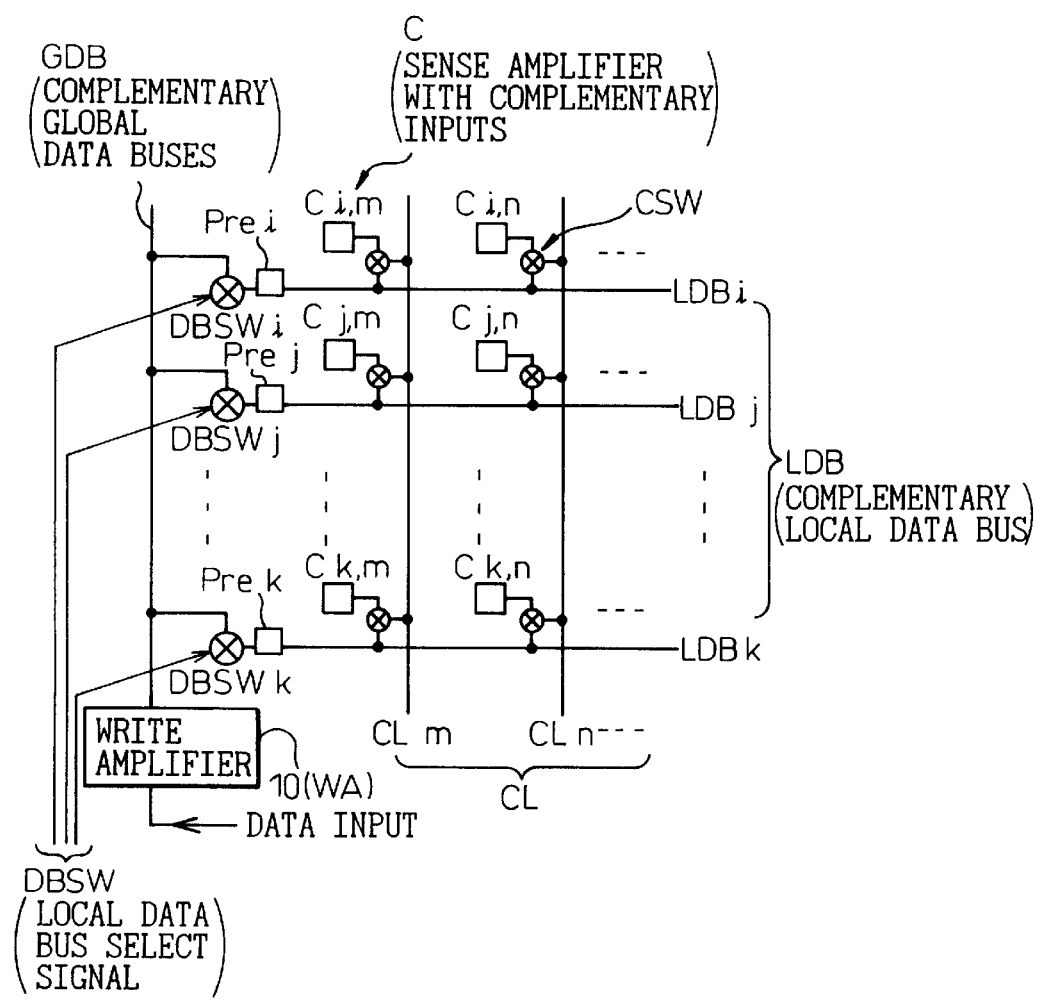
FIG. 54 is a diagram showing an example of the hierarchical bus structure for explaining the basic concept of a gapless write operation according to the present invention.
Figure 55:
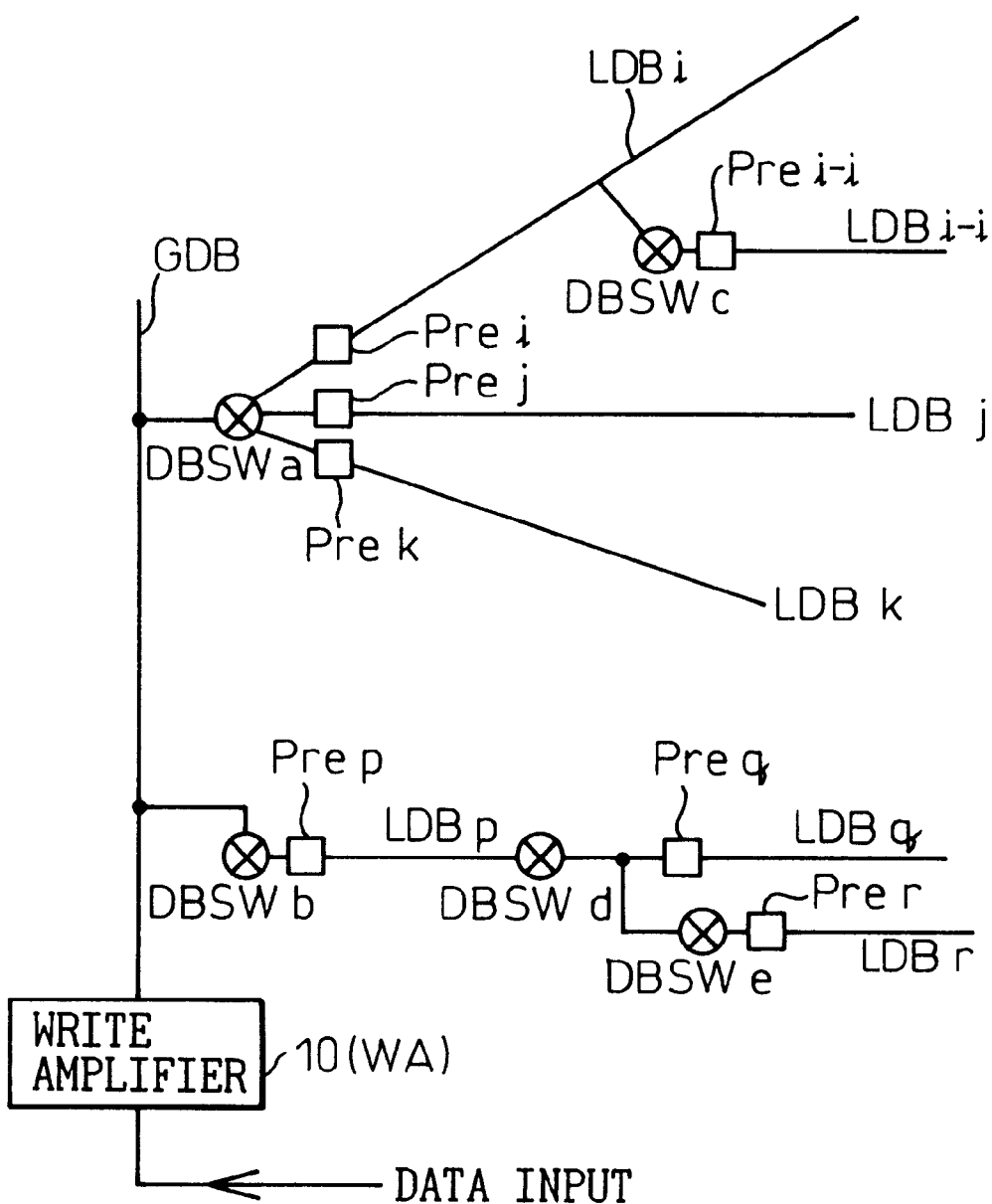
FIG. 55 is a diagram showing an example of the branching bus structure for explaining the basic concept of the gapless write operation according to the present invention.

FIG. 54 is a diagram showing an example of the hierarchical bus structure for explaining the basic concept of the gapless write operation according to the present invention, and FIG. 55 is a diagram showing an example of the branching bus structure for explaining the basic concept of the gapless write operation according to the present invention. FIGS. 54 and 55 correspond to previously given FIGS. 21 and 22, respectively, with the PRD-type data bus amplifier 6 in FIGS. 21 and 22 configured here as a write amplifier.

In FIGS. 54 and 55, during the period when data are being written to the units C on the same local data bus, basically precharge is not performed on that local data bus, thus providing high-speed write operation. Here, the global data bus (GDB) and the local data buses (LDBi, LDBj, . . . , LDBk) are constructed as complementary data buses (GDB, /GDB; LDB, /LDB), and each unit C is constructed, for example, as a sense amplifier having complementary inputs.

Figure 56:
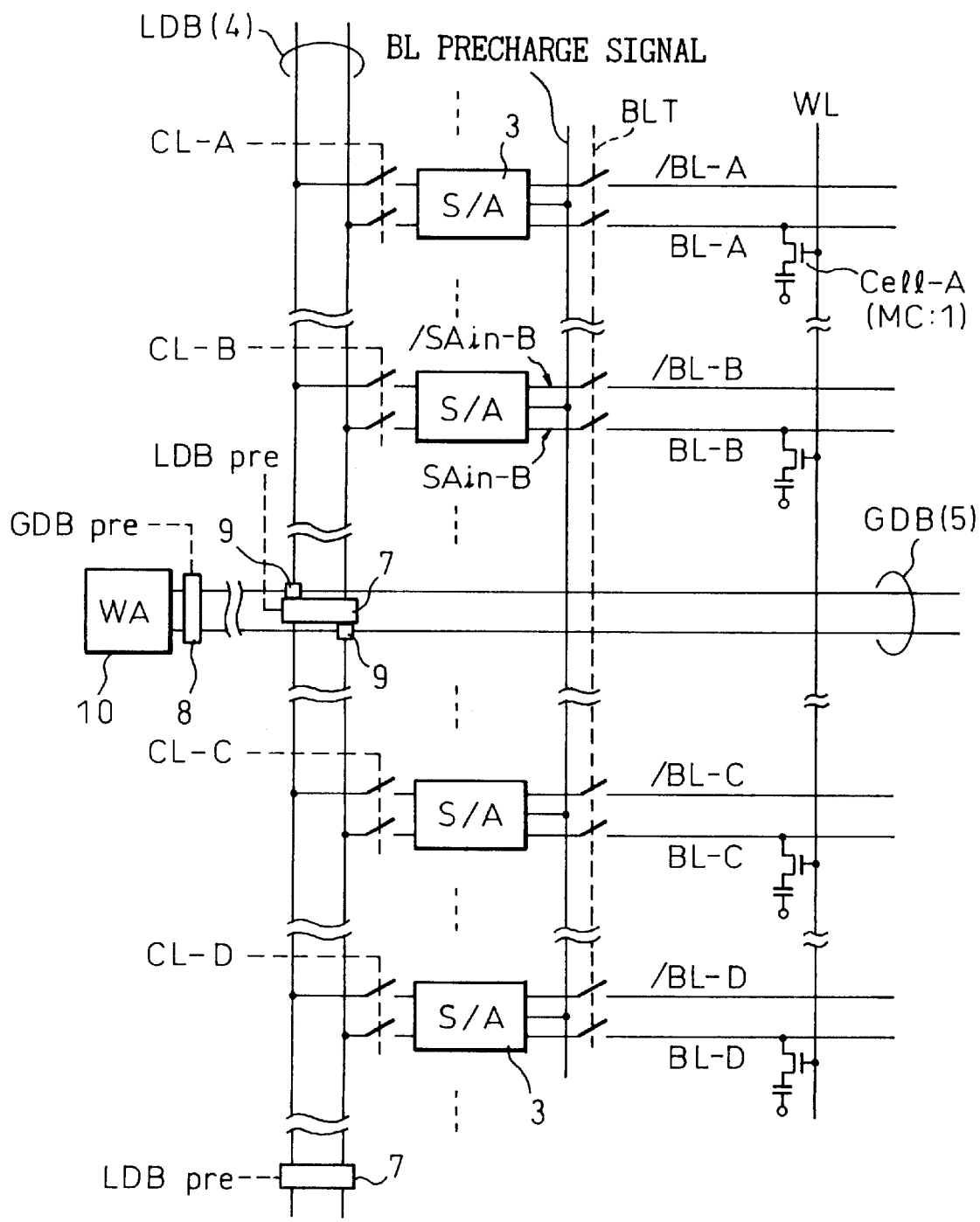
FIG. 56 is a block diagram showing an example of the organization of a semiconductor memory device as a 12th embodiment of the signal transmission system to which the present invention is applied.

FIG. 56 is a block diagram showing an example of the organization of a semiconductor memory device as a 12th embodiment of the signal transmission system to which the present invention is applied, illustrating an example of high-speed data write in a dynamic random-access memory (DRAM: semiconductor memory device) using a separated sense amplifier (SSA) method. The organization itself is fundamentally the same as that of a conventional DRAM.

What makes the semiconductor memory device of the 12th embodiment different from conventional DRAMs is the control circuit (control signal BLT) for the bit line transfer gate connecting the sense amplifier (S/A: 3) to its associated bit line (BL). More specifically, in a conventional DRAM, when a data write operation is initiated, the word line (WL) of the cell where data is to be written is already opened and the sense amplifier is holding therein the previous data that was stored in the cell before the current write operation. Therefore, if the data to be written into the cell is the same as the already written data, the write operation is immediately completed. On the other hand, if the data to be written is opposite to the already written data, this is a worst case write operation, which accordingly determines the time required for the write operation.

More specifically, if the data to be written is opposite to the already written data, the write amplifier (WA) connected to the global data bus (GDB: GDB, /GDB) operates to invert the data latched in the sense amplifier (S/A) through the global data bus GDB (5), the data bus switch (9), and the local data bus LDB (LDB, /LDB: 4) and via the column transfer gate (CL). Then, the potentials on the bit line pair (BL, /BL) connected to the sense amplifier are also inverted. Here, when local data bus switching is not performed, the precharge circuits (8 and 7) for the global data bus and local data bus need not necessarily be provided.

FIGS. 57 to 62 are diagrams illustrating a write operation sequence in the semiconductor memory device of FIG. 56.

Figure 57:
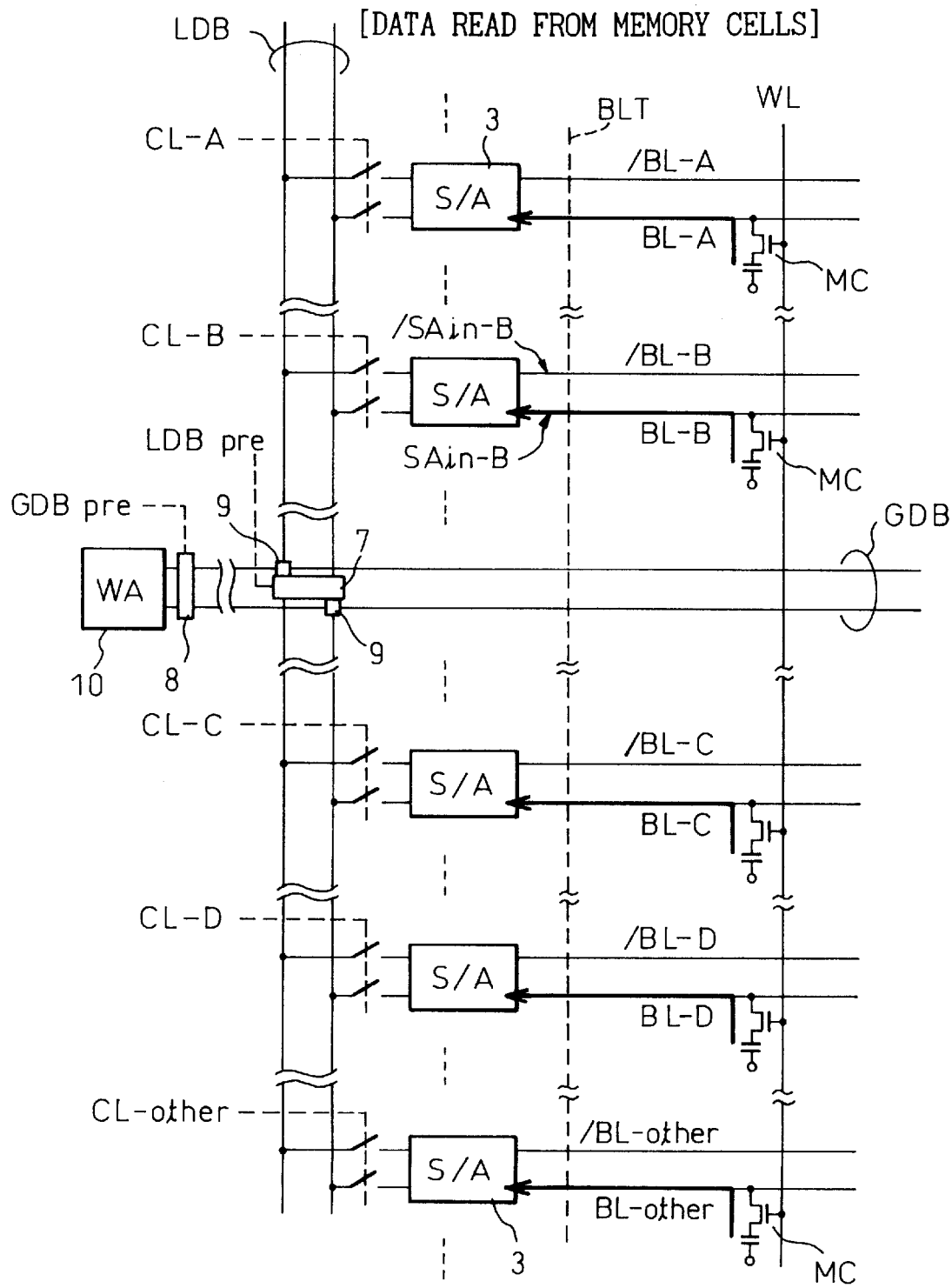
FIGS. 57, 58, 59, 60, 61, and 62 are diagrams showing a write operation sequence in the semiconductor memory device of FIG. 56.

First, as shown in FIG. 57, data is read out of each memory cell (MC), and the data retrieved from the MC is amplified to some degree by the associated sense amplifier (S/A), after which the bit line transfer gate (BLT) is closed to disconnect the sense amplifier from the bit line pair (BL, /BL). Here, amplifying to some degree means amplifying the data to a degree sufficient to prevent the data in the S/A from being inverted by the BLT closing operation, and means that the bit line pair need not be opened as wide as when restoring data to the memory cell. After that, the column transfer gate (CL) is opened, and the data in the sense amplifier is inverted by the action of the write amplifier (WA) through the global data bus (GDB), the data bus switch (DBSW), and the local data bus (LDB). At this time, since the bit line pair is not connected to the sense amplifier, high-speed inversion takes place in the sense amplifier.

Figure 58:
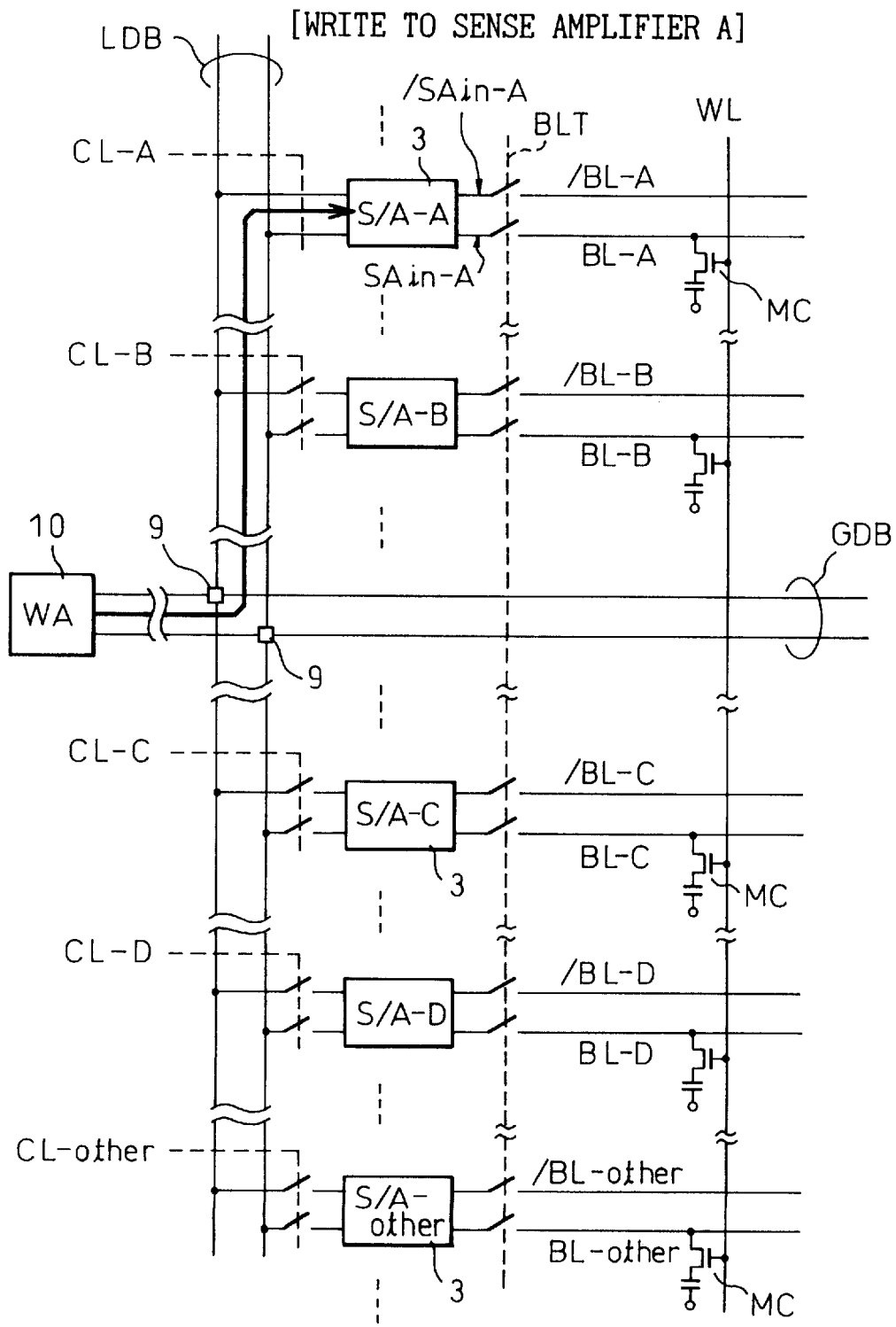
Figure 59:
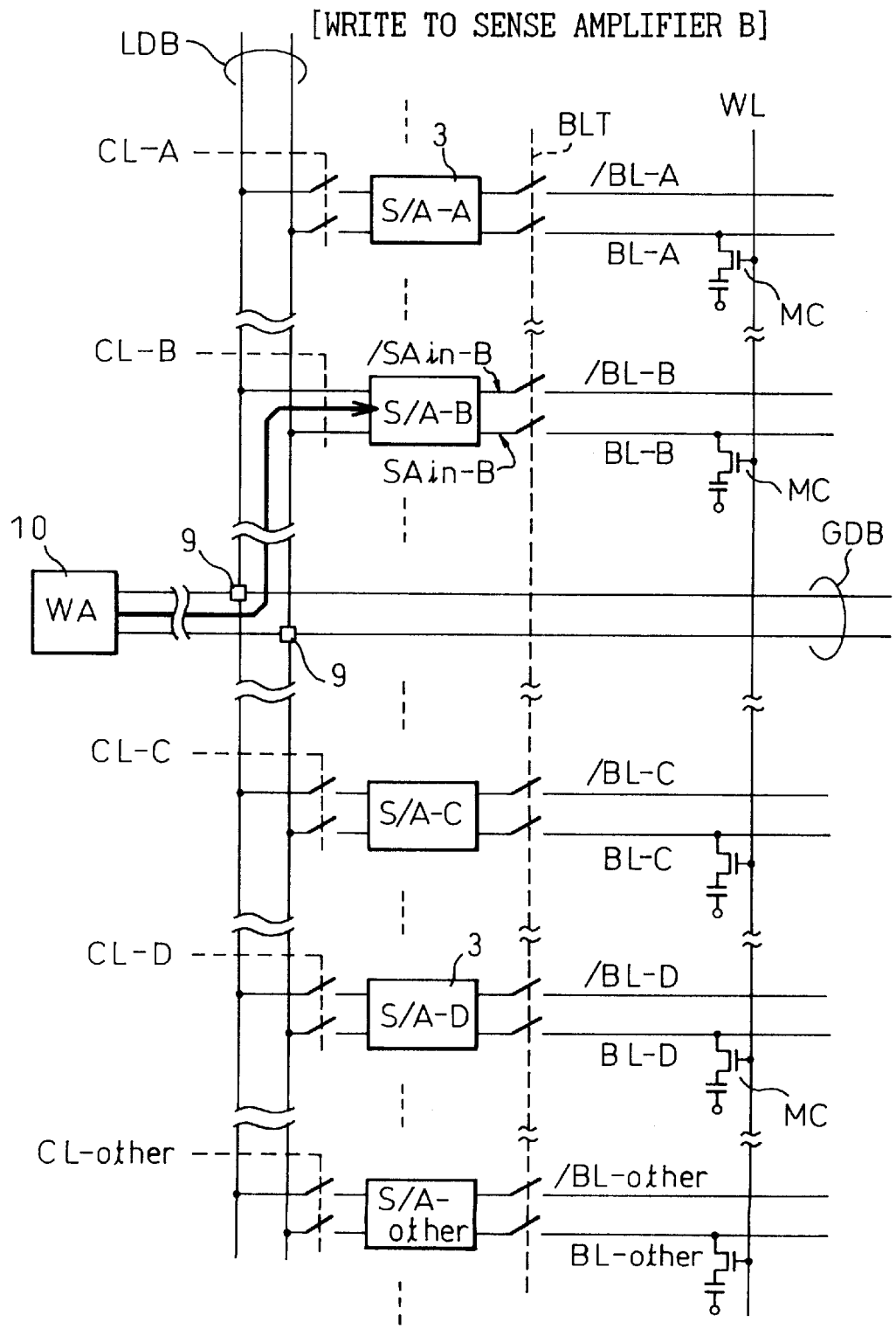
Figure 60:
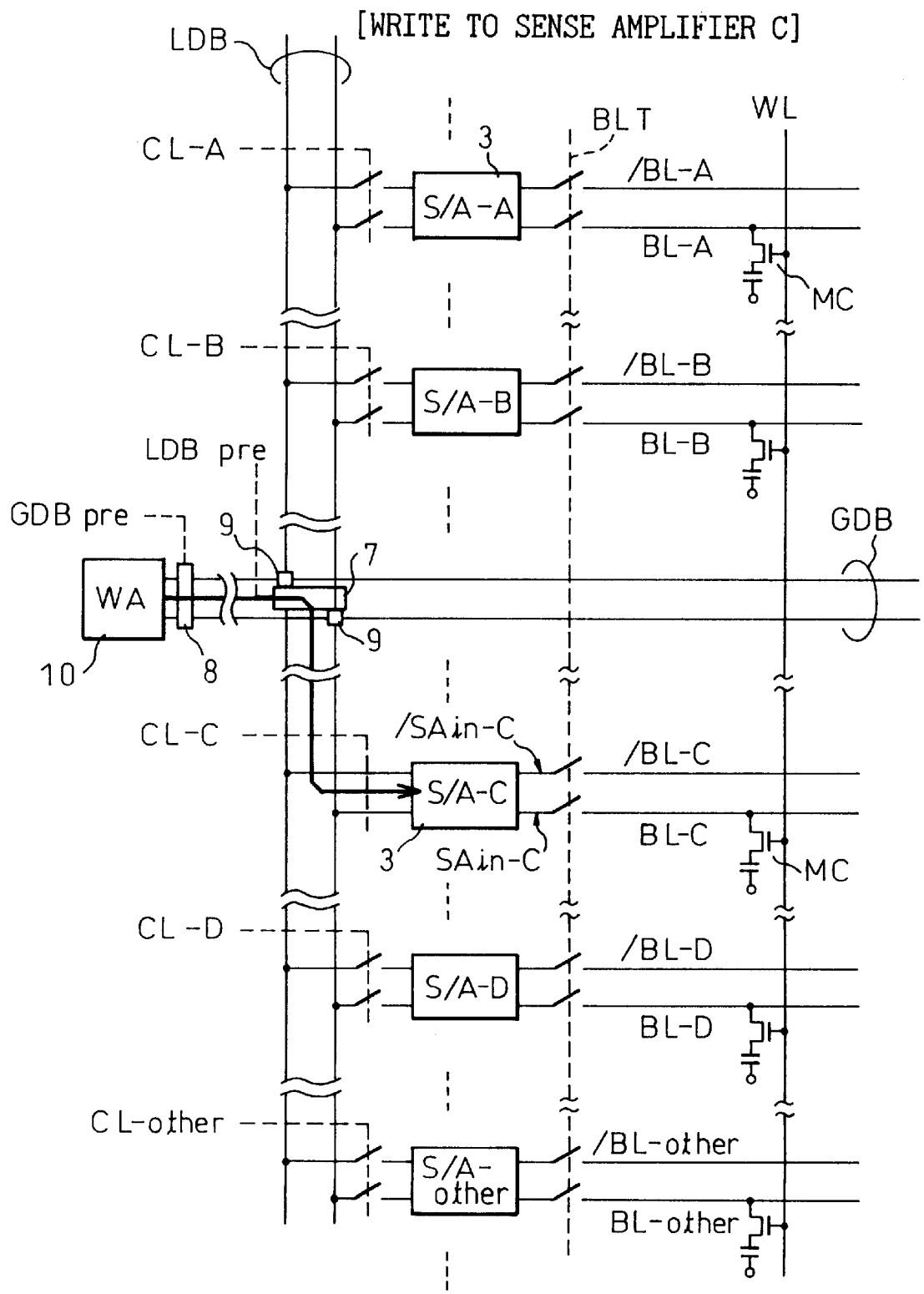

Further, the column transfer gates connected to the same local data bus are opened one after another, as shown in FIGS. 58 to 61, to sequentially write data from the write amplifier to the respective sense amplifiers. Data can thus be written at speed, for example, about two times as fast as that achieved by the conventional write method. Here, FIG. 58 shows a data write from the write amplifier WA to the sense amplifier A, FIG. 59 a data write from the write amplifier WA to the sense amplifier B, FIG. 60 a data write from the write amplifier WA to the sense amplifier C, and FIG. 61 a data write from the write amplifier WA to the sense amplifier D.

Figure 62:
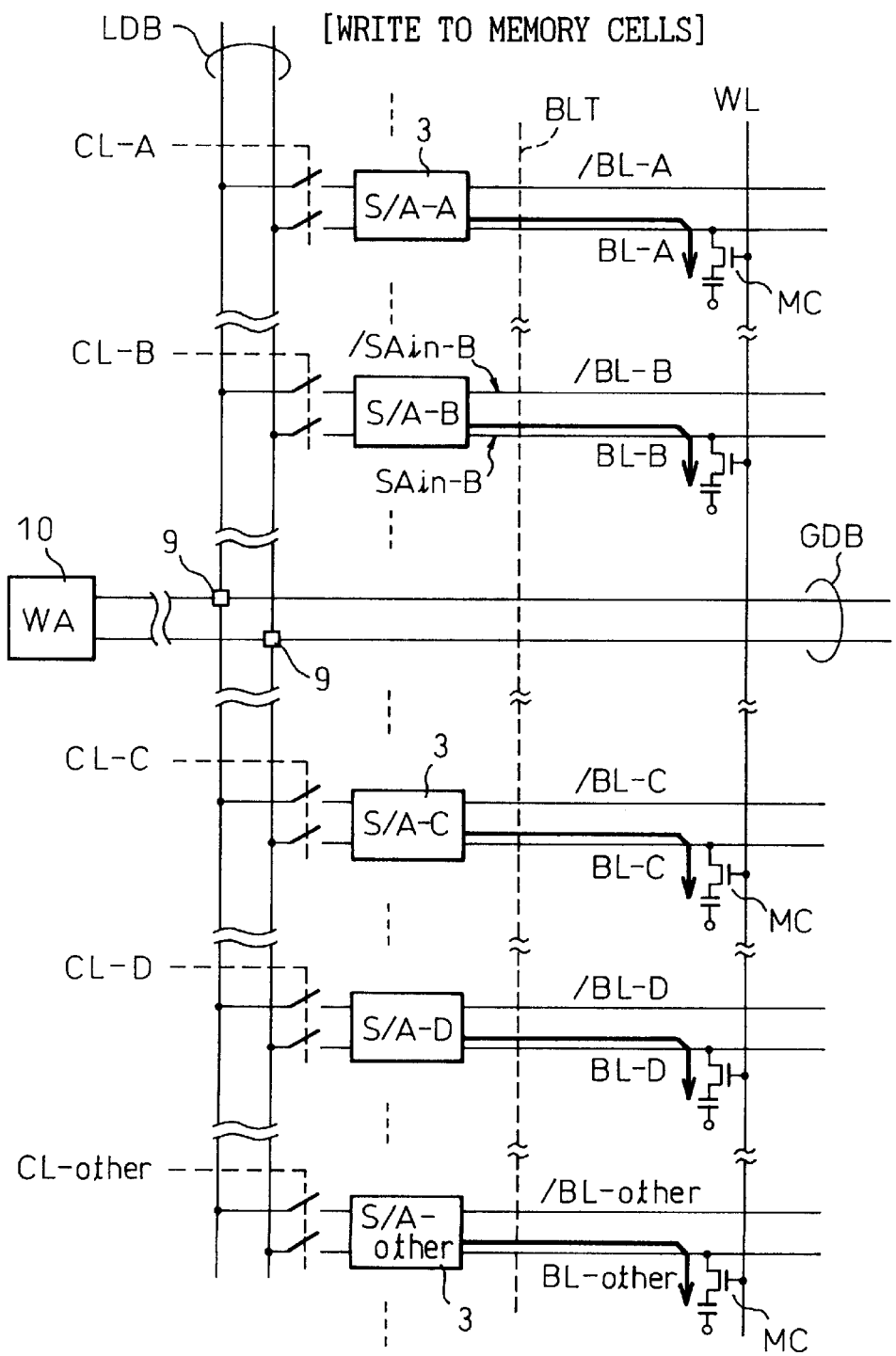

Then, as shown in FIG. 62, after the data have been written to the respective sense amplifiers, the BLTs are opened to write the data in the sense amplifiers into the corresponding memory cells (MCs). When the data restore operation to each memory cell is completed, the word line (WL) is lowered, the sense amplifiers are deactivated, and the bit line pairs (BL, /BL) are precharged.

The sequence shown in FIGS. 57 to 62 has dealt with an example in which bus precharge is not performed either before or after the write operation. If bus precharge is to be performed before and after the write operation, the bus(es) (LDB and/or GDB) are precharged by the LDB precharge circuit (7) and/or the GDB precharge circuit (8) either during the period (TT1) when data is read from the memory cell in FIG. 57 and amplified to some degree by the sense amplifier and the sense amplifier is disconnected from the bit line pair, or during a period preceding the period TT1 and continuing into a portion of the period TT1; or the bus(es) (LDB and/or GDB) are precharged by the LDB precharge circuit (7) and/or the GDB precharge circuit (8) after the end of the period (TT2) during which data are written sequentially to the sense amplifiers from the write amplifier as shown in FIGS. 58 to 61.

Figure 63:
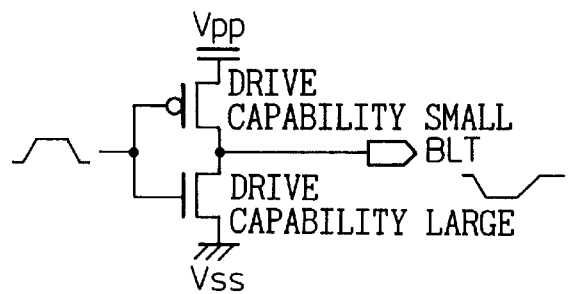
FIG. 63 is a circuit diagram showing one example of a circuit for slowing the rising speed of a bit line, applicable to the semiconductor memory device of FIG. 56.

FIG. 63 is a circuit diagram showing one example of a circuit for slowing the rising speed of the bit line (bit line transfer gate control circuit), applicable to the semiconductor memory device of FIG. 56.

As shown in FIG. 63, this circuit is constructed with an inverter consisting of a PMOS transistor with a small drive capability and an NMOS transistor with a large drive capability inserted between the pull-up voltage supply line (Vpp) and the low-level voltage supply line (Vss). The rising speed of the BLT (bit line transfer gate control signal) is thus slowed by introducing a delay, to prevent the data in the sense amplifier being inverted when writing data from the sense amplifier to the memory cell. In this example, the rising speed of the BLT is slowed using a delay circuit; an alternative method of preventing the inversion of the sense amplifier data is by causing the BLT to rise in two or three steps.

Figure 64:
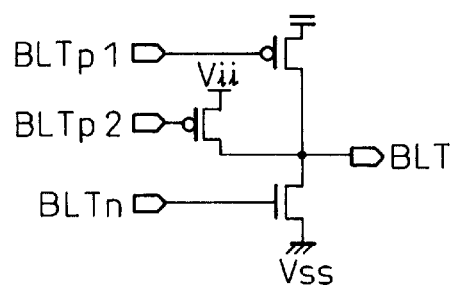
FIG. 64 is a circuit diagram showing one example of a circuit for causing the bit line to rise in a steplike manner, applicable to the semiconductor memory device of FIG. 56.
Figure 65:
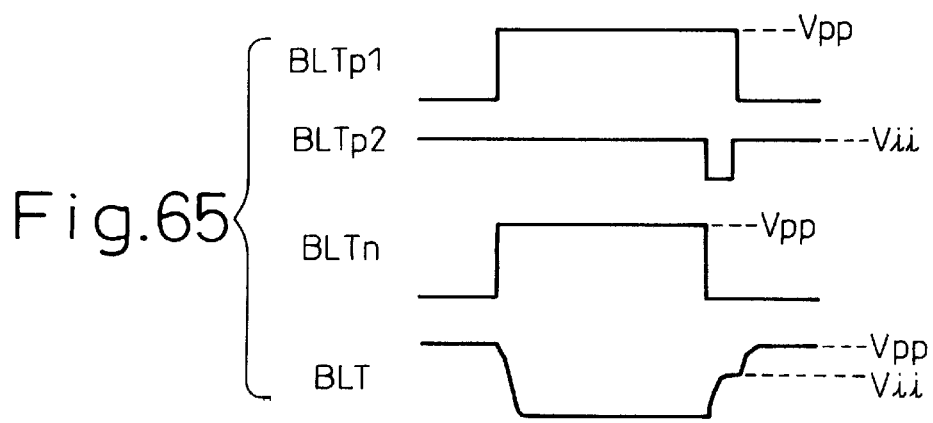
FIG. 65 is a diagram showing signal levels used in the circuit of FIG. 64.

FIG. 64 is a circuit diagram showing one example of a circuit for causing the bit line to rise in a steplike manner (bit line transfer gate control circuit) applicable to the semiconductor memory device of FIG. 56. In this example, the BLT is caused to rise in two steps. FIG. 65 is a diagram showing signal levels used in the circuit of FIG. 64.

As shown in FIG. 64, this circuit comprises a first PMOS transistor connected to the pull-up voltage supply line (Vpp), a second PMOS transistor connected to the high-level voltage supply line (Vcc), and an NMOS transistor connected to the low-level voltage supply line (Vss).

The first PMOS transistor is supplied at its gate with a control signal BLTp1, the second PMOS transistor is supplied at its gate with a control signal BLTp2, and the NMOS transistor is supplied at its gate with a control signal BLTn. The waveforms of these control signals BLTp1, BLTp2, and BLTn are as shown in FIG. 65. With these control signals, the bit line transfer gate control signal (BLT) is caused to rise in two steps. This also serves to prevent the data in the sense amplifier from being inverted when writing data from the sense amplifier to the memory cell.

Figure 66:
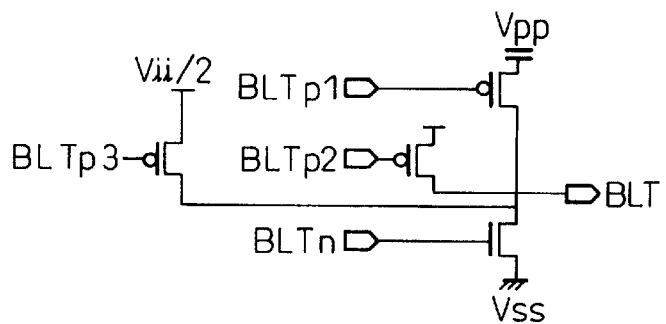
FIG. 66 is a circuit diagram showing another example of the circuit for causing the bit line to rise in a steplike manner, applicable to the semiconductor memory device of FIG. 56.

FIG. 66 is a circuit diagram showing another example of the circuit for causing the bit line to rise in a steplike manner (bit line transfer gate control circuit) applicable to the semiconductor memory device of FIG. 56. In this example, the BLT is caused to rise in three steps.

As can be seen from the comparison between FIGS. 66 and 64, in this circuit, a third PMOS transistor is added between the second PMOS transistor and the NMOS transistor in the circuit of FIG. 64, and an intermediate voltage (Vii/2) is applied to the source of the third PMOS transistor and a control signal BLTp3 to the gate thereof. With this arrangement, the BLT rises in three steps, making it possible to prevent the data in the sense amplifier from being inverted when writing data from the sense amplifier to the memory cell. The control signal BLTp3 can be implemented by providing an interval between the falling of the control signal BLTn and the falling of the control signal BLTp2 in FIG. 65, and by setting the control signal BLTp3 low "L" during that interval.

Figure 67A:
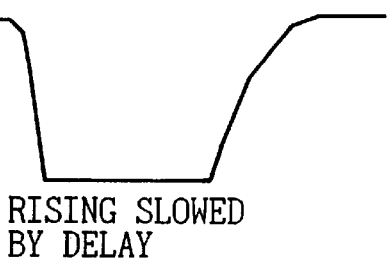
FIGS. 67A, 67B, and 67C are diagrams showing how the bit line rises according to the circuits of FIGS. 63, 64, and 66, respectively.
Figure 67B:
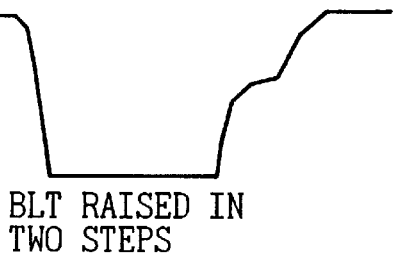
Figure 67C:
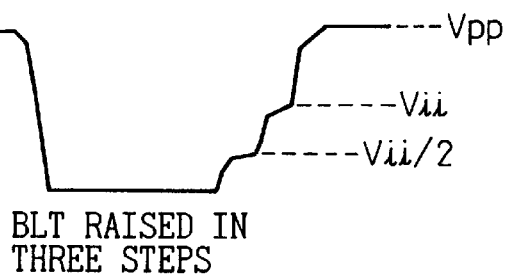

FIGS. 67A, 67B, and 67C show how the bit line rises according to the circuits of FIGS. 63, 64, and 66, respectively.

As shown in FIG. 67A, the BLT signal (bit line transfer gate control signal) from the circuit of FIG. 63 rises slowly due to the action of the PMOS transistor with small drive capability, and thus prevents the sense amplifier data from being inverted.

As shown in FIG. 67B, the BLT signal from the circuit of FIG. 64 rises in two steps, and as shown in FIG. 67C, the BLT signal from the circuit of FIG. 66 rises in three steps, to prevent the inversion of the sense amplifier data.

In any of the above circuits, the BLT signal is not caused to fall slowly or to fall in a steplike manner, because it is preferable to lower the BLT as quickly as possible. Further, when writing data sequentially to the sense amplifiers connected to the same local data bus, no bus precharge is performed, as in read operations. That is, by eliminating bus precharge periods, the interval between write timings can be shortened, achieving faster write operations.

Figure 68:
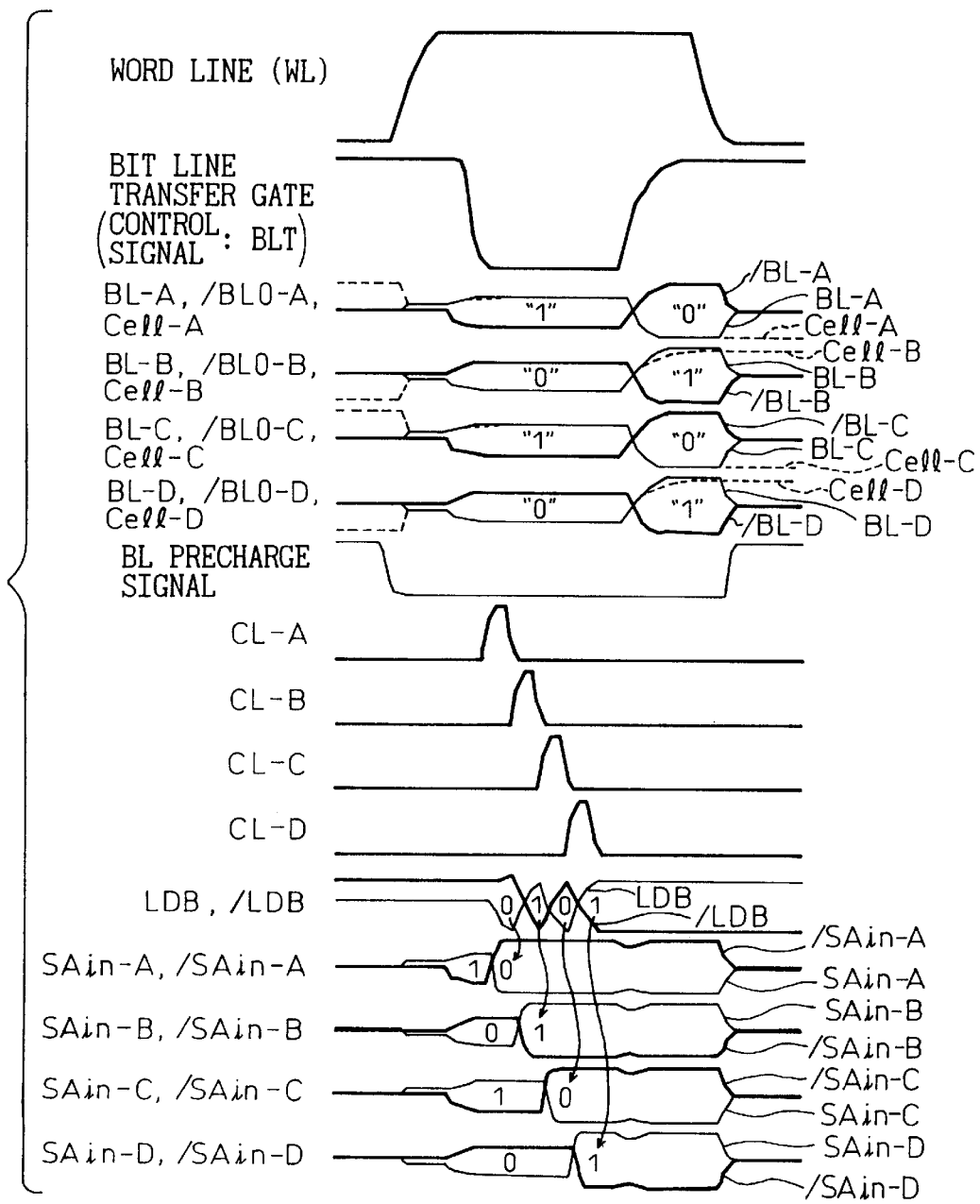
FIG. 68 is a waveform diagram showing one example of the write operation in the semiconductor memory device of FIG. 56.

FIG. 68 is a waveform diagram showing one example of the write operation in the semiconductor memory device of FIG. 56. The example shown here performs the write operation at a speed of 400 Mbps. That is, the 12th embodiment hereinafter described achieves a write speed more than two times faster as compared with the conventional method.

Continuous writing, for example, to four sense amplifiers (for example, S/A-A to S/A-D shown in FIGS. 58 to 62) connected to the same local data bus (LDB, /LDB) is performed as shown in FIG. 68. First, the word line WL rises to the high level "H", and data are read out of the respective memory cells (Cell-A to Cell-D) and amplified to some degree by the corresponding sense amplifiers (S/A-A to S/A-D). In the example of FIG. 68, data "1", "0", "1", and "0" are previously stored in the memory cells Cell-A, Cell-B, Cell-C, and Cell-D, respectively. Accordingly, the sense amplifier nodes SAin-A, /SAin-B, SAin-C, and /SAin-D (bit lines BL-A, /BL-B, BL-C, and /BL-D) are at the high level "H", and the sense amplifier nodes /SAin-A, SAin-B, /SAin-C, and SAin-D (bit lines /BL-A, BL-B, /BL-C, and BL-D) are at the low level "L".

Next, the bit line transfer gate control signal BLT is set to the low level "L" to close the respective bit transfer gates, thereby separating the respective bit line pairs (BL-A, /BL-A; BL-B, /BL-B; BL-C, /BL-C; and BL-D, /BL-D) from their associated sense amplifiers (S/A-A; S/A-B; S/A-C; and S/A-D).

Then, the data to be written into the respective memory cells (Cell-A to Cell-D) are supplied onto the local data bus (LDB, /LDB) and, by sequentially opening the column transfer gates (CL-A to CL-D), the data are written into the corresponding sense amplifiers (S/A-A to S/A-D). In the example of FIG. 68, the data to be written are "0", "1", "0", and "1", requiring inverting (rewriting) all of the stored data.

Figure 61:
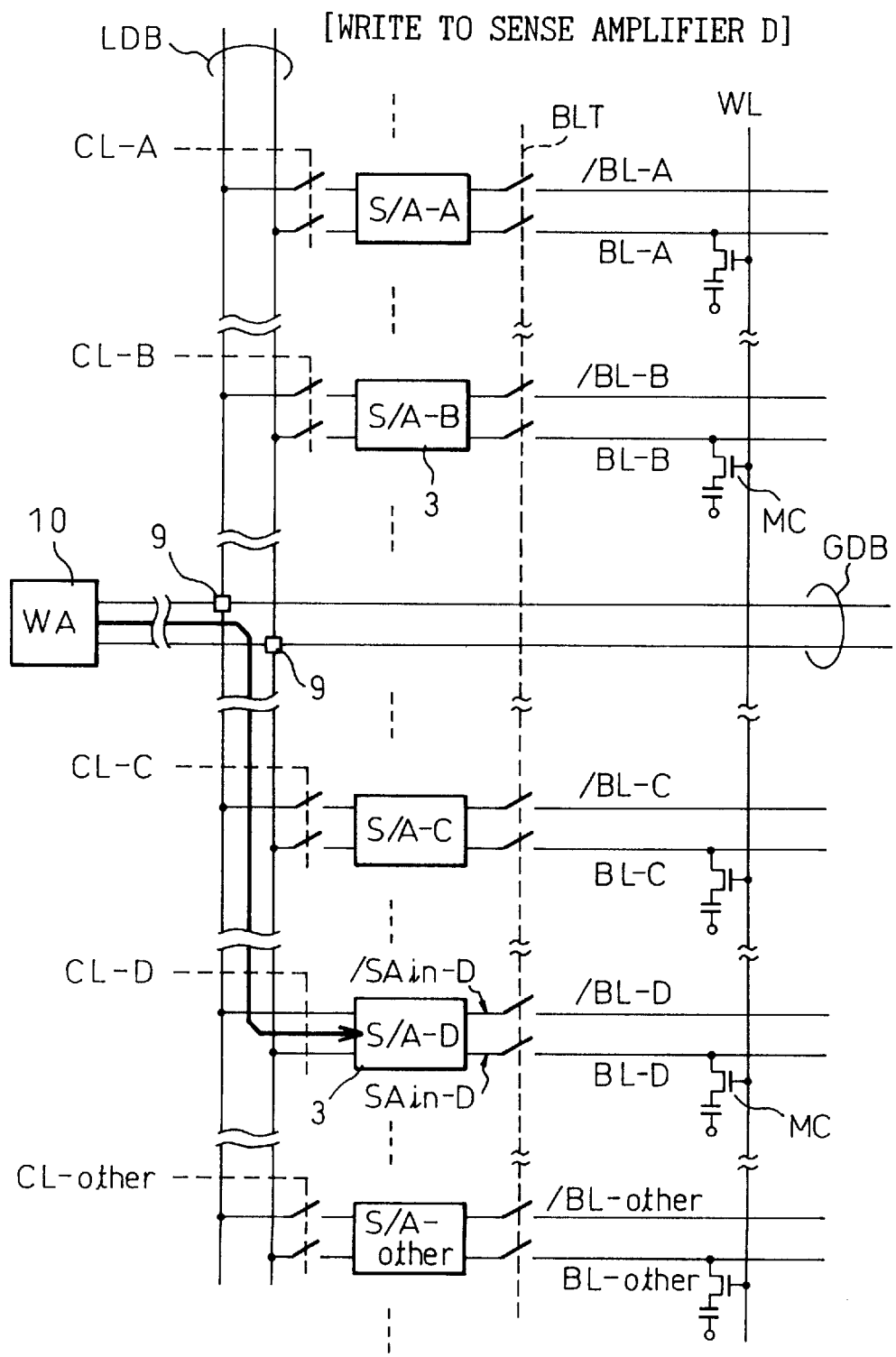

First, by setting the column transfer gate control signal CL-A to the high level "H", the data ("1") in the sense amplifier S/A-A is inverted to data "0" (see FIG. 58), and next, by setting the column transfer gate control signal CL-B to the high level "H", the data ("0") in the sense amplifier S/A-B is inverted to data "1" (see FIG. 59); further, by setting the column transfer gate control signal CL-C to the high level "H", the data ("1") in the sense amplifier S/A-C is inverted to data "0" (see FIG. 60), and finally, by setting the column transfer gate control signal CL-D to the high level "H", the data ("0") in the sense amplifier S/A-D is inverted to data "1" (see FIG. 61). At this time, since the sense amplifiers (S/A-A to S/A-D) are not connected to the respective bit line pairs (BL-A, /BL-A; BL-B, /BL-B; BL-C, /BL-C; and BL-D, /BL-D), data inversion in each sense amplifier can be performed at high speed.

Thereafter, the bit line transfer gate control signal BLT is set to the high level "H" to open the respective bit line transfer gates, thus writing the data in the sense amplifiers (S/A-A to S/A-D) into the corresponding memory cells (Cell-A to Cell-D) (see FIG. 62). That is, by setting the bit lines BL-A, /BL-B, BL-C, and /BL-D to the low level "L", and the bit lines /BL-A, BL-B, /BL-C, and BL-D to the high level "H", data in the respective memory cells are rewritten, and the word line WL is then lowered to the low level "L". In the example of FIG. 68, provisions are made to set the BL precharge signal to the high level "H" before and after raising the word line WL to the high level "H", to precharge each bit line pair (BL, /BL).

The number of bits for the continuous write need not be limited to four; rather, the number of bits may be increased to eight or even to 16, for example.

Figure 69:
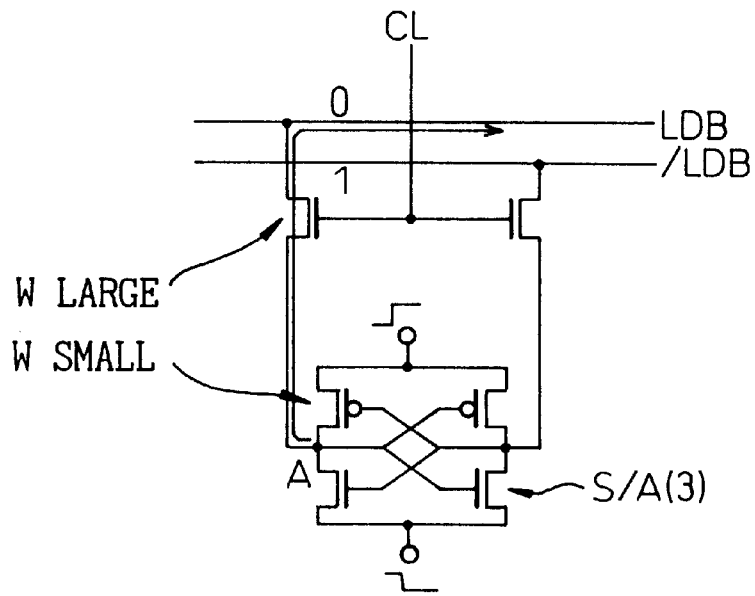
FIG. 69 is a diagram for explaining the relationship between sense amplifier transistors and column transfer gate transistors, applicable to the semiconductor memory device of FIG. 56.

FIG. 69 is a diagram for explaining the relationship between the sense amplifier transistors and column transfer gate transistors, applicable to the semiconductor memory device of FIG. 56.

As shown in FIG. 69, as the column transfer gate for controlling the connection with the complementary local data buses (LDB, /LDB), two N-channel MOS transistors (NMOS transistors) are used for each sense amplifier (S/A:

3), and the ratio between the PMOS transistors of the sense amplifier (S/A) and the NMOS transistors of the column transfer gate is made small, making it easier for the sense amplifier to pulled to the lower voltage side of the complementary buses. In the above-described example of the 12th embodiment, no precharge is performed either before or after the data write operation.

Figure 70:
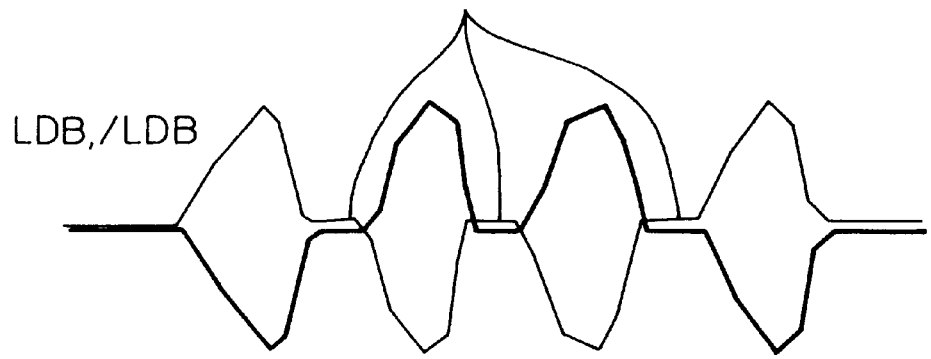
FIG. 70 is a diagram for explaining one example of the operation of a semiconductor memory device as a 13th embodiment of the signal transmission system to which the present invention is applied.

FIG. 70 is a diagram for explaining one example of the operation of a semiconductor memory device as a 13th embodiment of the signal transmission system to which the present invention is applied.

As shown in FIG. 70, the 13th embodiment is essentially the same as the foregoing 12th embodiment, except that, when performing continuous writing to the sense amplifiers connected to the same local data bus (LDB, /LDB), a precharge is performed on the local data bus, as in conventional DRAMs. The write operation, therefore, is slower than the foregoing 12th embodiment, but the write speed is nevertheless about 1.5 times as fast as that of conventional DRAMs.

Figure 71:
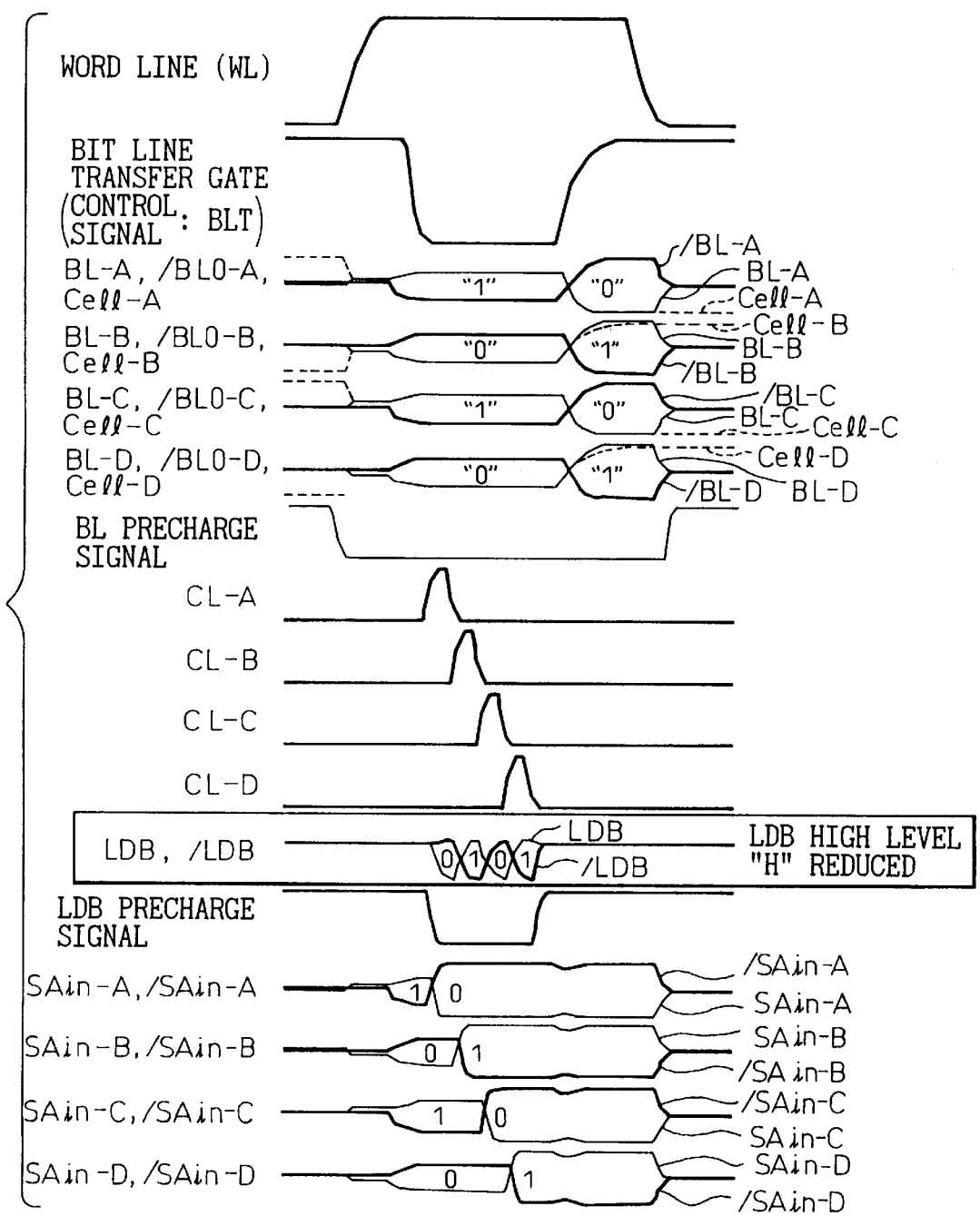
FIG. 71 is a diagram for explaining one example of the operation of a semiconductor memory device as a 14th embodiment of the signal transmission system to which the present invention is applied.

FIG. 71 is a diagram for explaining one example of the operation of a semiconductor memory device as a 14th embodiment of the signal transmission system to which the present invention is applied.

As can be seen from the comparison between FIGS. 71 and 68, in the 14th embodiment the local data bus (LDB, /LDB) is precharged by the LDB precharge signal before and after write data are supplied to the sense amplifiers (SA-A to SA-D) via the local data bus (LDB, /LDB). That is, the local data bus (LDB, /LDB) is precharged before data is written into the first sense amplifier (S/A-A) and after data has been written into the last sense amplifier (S/A-D).

The 14th embodiment employs the write amplifier (WA: 10) previously shown in FIG. 33, and reduces the high level "H" of the local data bus (LDB). That is, as can be seen from the waveform of the LDB, the lower the high level "H" of the local data bus (LDB), the faster it is driven to the low level "L", and the longer the low level "L" period. In this case, a greater operating margin can be obtained for the same operating speed. In other words, the length of time that the bus must be held at the low level "L" can be reduced to, for example, approximately the same length as that shown in the LDB waveform in FIG. 68; therefore, the operating frequency can be further increased for higher speed operation.

Figure 72:
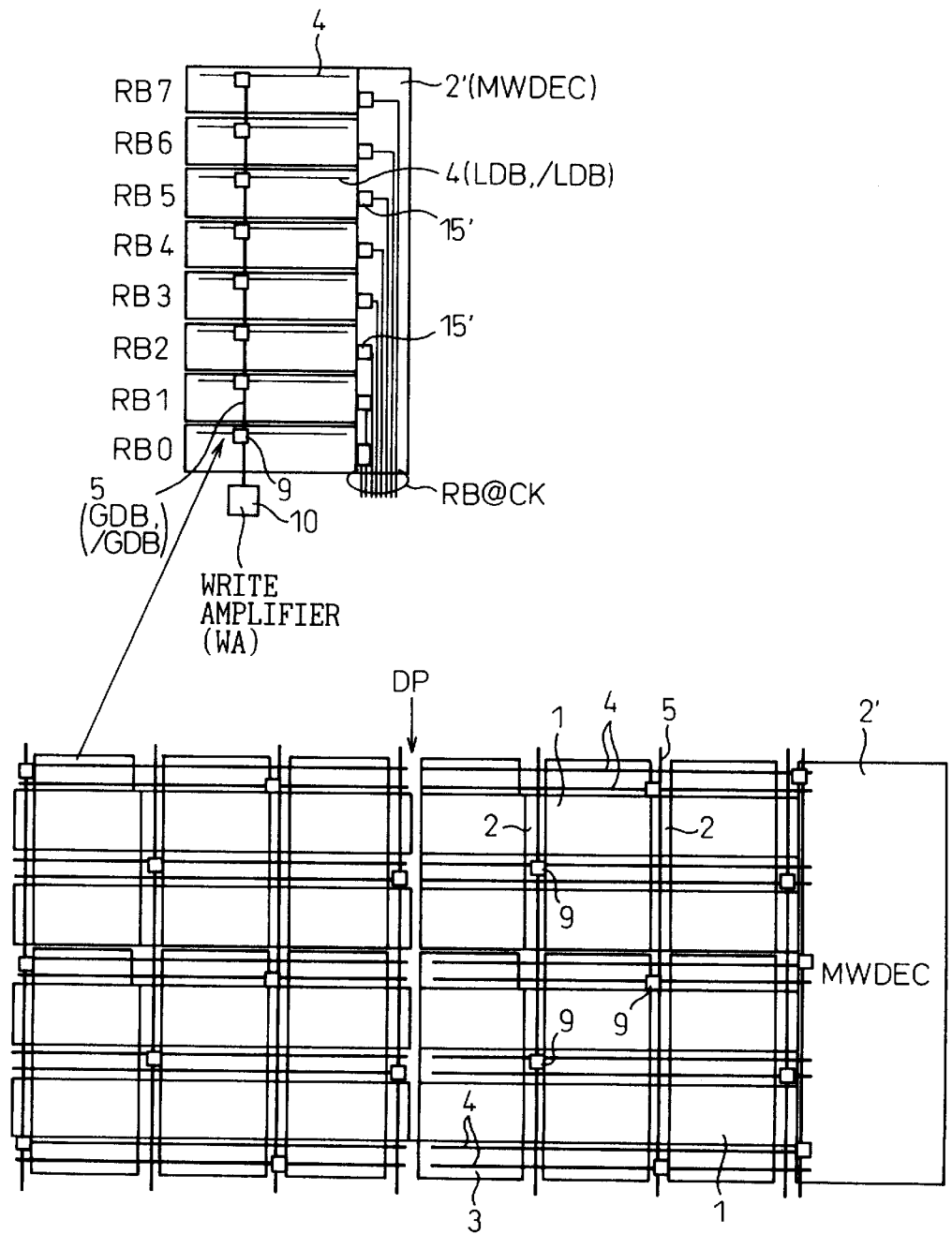
FIG. 72 is a block diagram showing an example of the organization of a semiconductor memory device as a 15th embodiment of the signal transmission system to which the present invention is applied.

FIG. 72 is a block diagram showing an example of the organization of a semiconductor memory device as a 15th embodiment of the signal transmission system to which the present invention is applied.

The semiconductor memory device of the 15th embodiment shown in FIG. 72, as in the eighth embodiment shown in FIG. 40, comprises eight row blocks (RB: RB0–RB7), and is configured to an achieve gapless write operation. The basic organization is the same as that of the eighth embodiment shown in FIG. 40, and explanation of the detailed internal organization, signal generating circuits, etc. will not be given here. The difference between the 15th embodiment and the eighth embodiment is that the write amplifier (WA) 10 is provided instead of the PRD bus amplifier (8) used in the eighth embodiment. The write operation sequence also is the same as that of the eighth embodiment.

That is, as in the eighth embodiment, the 15th embodiment also uses the four row block (RB) states (CURRENT state, PREVIOUS state, NEXT state, and STANDBY state). It should, however, be noted that basically the same operation is possible if the number of states is larger than four or smaller than four. This is also true of gapless read operation (eighth embodiment). Explanation of each state is the same as that given in the eighth embodiment and, therefore, will not be repeated here, except to note that the important states in the gapless write operation are the CURRENT state and PREVIOUS state.

In the 15th embodiment, when switching from one local data bus (LDB) to the next, the next LDB need not be precharged beforehand; instead, the LDB (local data bus) being deselected is quickly precharged when the write operation on the same LDB is completed and switching is made to the next LDB, or immediately before or after that timing, that is, at the end of the CURRENT state. This serves to prevent an erroneous write to the deselected row block when the column select signal is shared among the plurality of row blocks.

Further, by setting this LDB precharge level to a higher level, it becomes possible to prevent an erroneous write from being done when some other column gate is opened in order to select a sense amplifier in another row block while the deselected row block is in the PREVIOUS state and its word line is still open. That is, a higher LDB precharge level serves to prevent the data on the bit line (BL) from being pulled toward the low level "L", because, basically, the write operation is accomplished through a column selection gate by a transition from the high level "H" state to the low level "L" state. Accordingly, for the write operation, it is most preferable to set the precharge level equal to the internal supply voltage (Vii).

Accessing the row block in the PREVIOUS state is prohibited as long as it is held in the PREVIOUS state. In the row block in the PREVIOUS state, the BLT (bit line transfer gate control signal) that was lowered before initiating the write operation is raised, data is restored to the memory cell, the word line (WL) is lowered, the sense amplifier is deactivated, and the bit line is precharged.

The operational states of the semiconductor memory device of the 15th embodiment are the same as those of the semiconductor memory device of the eighth embodiment shown in FIG. 46 and 47, and the explanation thereof will not be repeated here.

Figure 73:
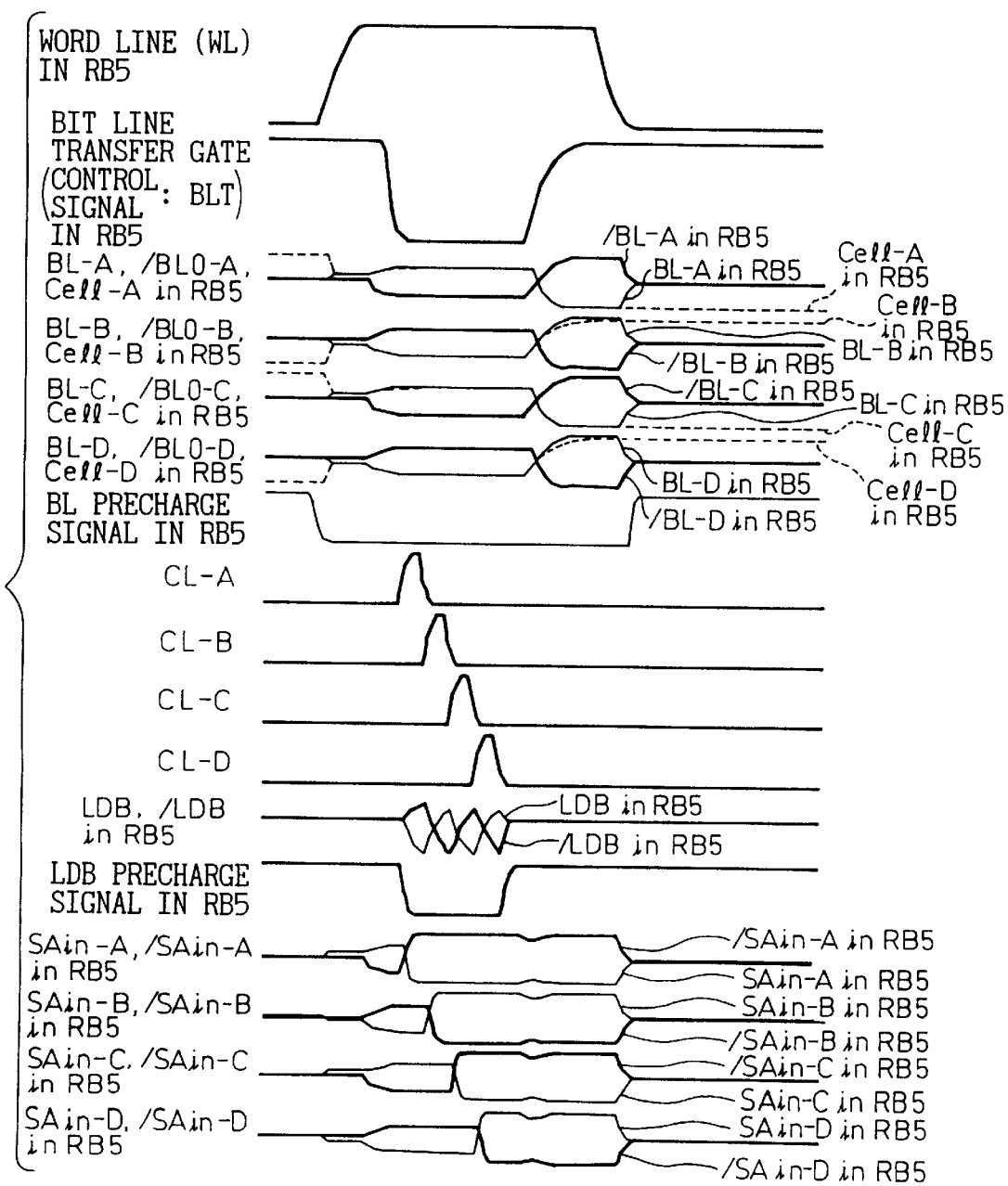
FIGS. 73 and 74 are diagrams showing one example of the write operation in the semiconductor memory device of the 15th embodiment shown in FIG. 72.
Figure 74:
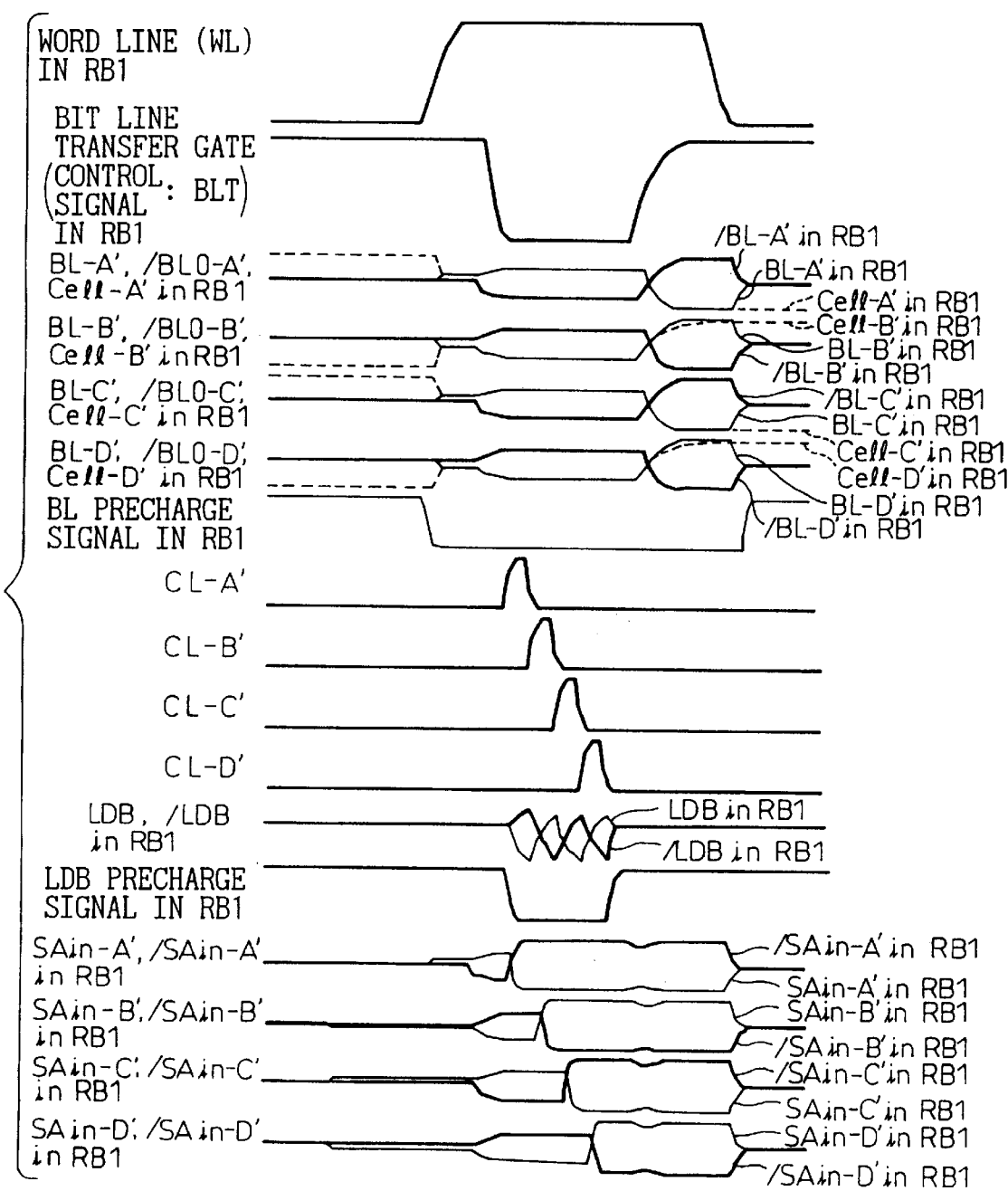

FIGS. 73 and 74 are diagrams showing one example of the write operation in the semiconductor memory device of the 15th embodiment shown in FIG. 72. The write operation shown in FIGS. 73 and 74 corresponds to that shown in FIG. 71: FIG. 73 shows the writing of four bits of data in the row block RB5, and FIG. 74 shows the writing of four bits of data in the row block RB1.

First, as shown in FIG. 73, in the row block RB5, data are written continuously (in an uninterrupted and gapless fashion) into the four memory cells, Cell-A to Cell-D, by the four sense amplifiers connected to the local data bus (LDB, /LDB), as in the case of FIG. 71 (FIG. 68); further, as shown in FIG. 74, in the row block RB1, data are written in gapless fashion into the four memory cells, Cell-A' to Cell-D', by the four sense amplifiers connected to the local data bus (LDB, /LDB), as in the case of FIG. 71 (FIG. 68). By repeating these operations, continuous data write is performed sequentially. Here, the number of bits of data continuously written is not limited to four, as previously noted.

Figure 75:
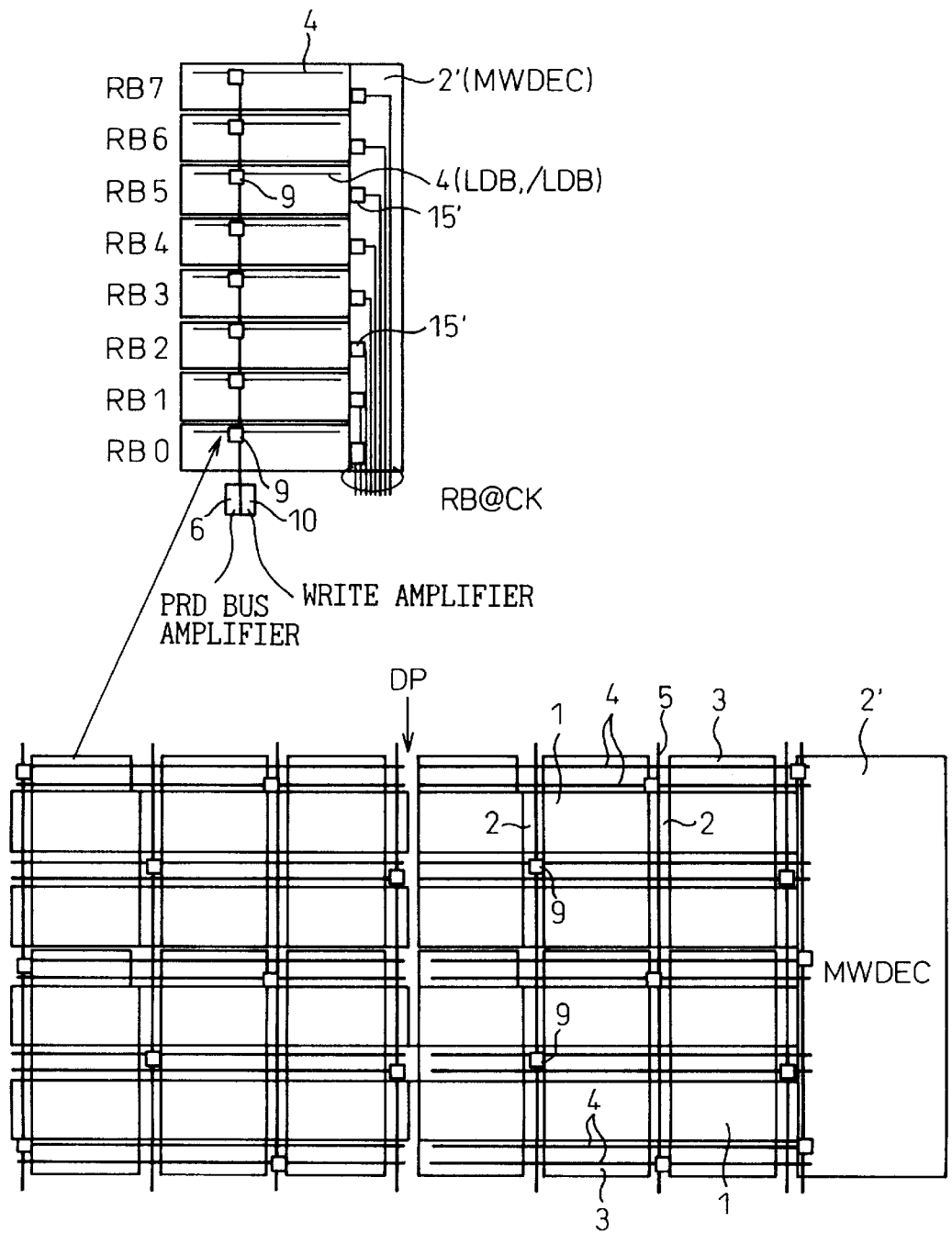
FIG. 75 is a block diagram showing an example of the organization of a semiconductor memory device as a 16th embodiment of the signal transmission system to which the present invention is applied.

FIG. 75 is a block diagram showing an example of the organization of a semiconductor memory device as a 16th embodiment of the signal transmission system to which the present invention is applied. This embodiment is a combination of the eighth embodiment shown in FIG. 40 and the 15th embodiment shown in FIG. 72. That is, the semiconductor memory device of the 16th embodiment includes both the PRD bus amplifier 6 and the write amplifier 10 to perform gapless read and write operations. As in the eighth and 15th embodiments, the 16th embodiment uses the four row block (RB) states (CURRENT state, PREVIOUS state, NEXT state, and STANDBY state).

As shown in FIG. 75, the semiconductor memory device of the 16th embodiment comprises eight row blocks (RB: RB0–RB7) and, by using the PRD method and varying the capacitance within the PRD comparators, as in the eighth (ninth) embodiment, accomplishes gapless data read even when switching is made from one row block to another. For the write operation, the method of the 15th embodiment is employed to accomplish gapless data write. The operational states of the semiconductor memory device of the 16th embodiment are the same as those of the semiconductor memory device of the eighth embodiment, and therefore, the explanation thereof will not be repeated here. In the 16th embodiment also, precharging of the local data bus is not performed while a continuous read is in progress on the same local data bus.

Figure 76:
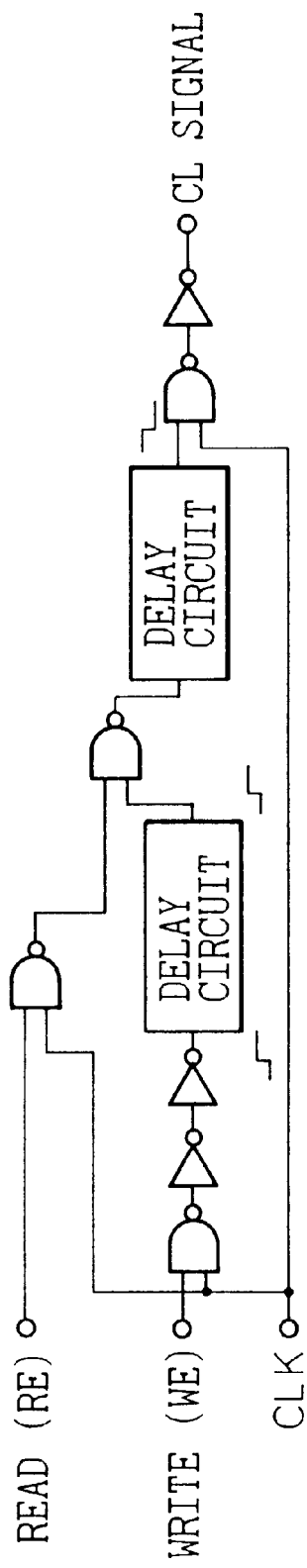
FIG. 76 is a circuit diagram showing one example of a column select signal generating circuit in a semiconductor memory device as a 17th embodiment of the signal transmission system to which the present invention is applied.

FIG. 76 is a circuit diagram showing one example of a column select signal generating circuit in a semiconductor memory device as a 17th embodiment of the signal transmission system to which the present invention is applied.

As shown in FIG. 76, in the 17th embodiment, in order to vary the pulse length of the column select signal (CL), delay time is controlled by the readout signal (RE) and write signal (WE), thereby controlling the pulse duration of the column select signal CL. More specifically, for data read, the pulse duration of the column select signal CL is made shorter than that for data write, because the read operation using the PRD method is basically faster than the write operation and, therefore, is capable of being performed with shorter pulses. Making the pulse duration (length) of the column select signal CL shorter for data read serves to make operation timing easier and to also prevent an erroneous write from being caused by the read operation. This in turn means that the pulse duration of the column select signal CL is made longer for data write, since the data write operation is basically slower than the data read operation of the PRD method.

FIG. 77 is a diagram showing local data bus precharge levels in a semiconductor memory device as an 18th embodiment of the signal transmission system to which the present invention is applied.

In the 18th embodiment shown in FIG. 77, the precharge level at the end of the NEXT state in a read operation (read precharge level) is made different from the precharge level of the local data bus at the end of data read in a write operation (write precharge level); the precharge levels are thus set at optimum values for the respective operations.

That is, as shown in FIG. 77, the write precharge level of the local data bus (LDB) is set at a higher value (higher than Vii/2), and the read precharge level is set at an intermediate voltage (for example, Vii/2). Setting the write precharge level to a higher value serves to make it difficult for the data already written in the row block (RB1) in the PREVIOUS state to be destroyed when an access is being made to another row block (RB5) (which is in the CURRENT state) while the row block (RB1) is in the PREVIOUS state. Of course, the LDB precharge level may be set to the same value for both read and write operations.

The various embodiments so far described have dealt primarily with applications to semiconductor memory devices (DRAMs), but it will be appreciated that the signal transmission system of the present invention is not limited in application to DRAMs, nor is the signal transmission system limited to the data buses in DRAMs.

As described in detail above, according to the present invention, not only is a continuous (gapless) column read made possible, but both read and write operations are also made faster, thus improving the overall speed of semiconductor memory devices.

Many different embodiments of the present invention may be constructed without departing from the spirit and scope of the present invention, and it should be understood that the present invention is not limited to the specific embodiments described in this specification, except as defined in the appended claims.

What is claimed is:

1. A signal transmission system for transmitting data over a signal transmission line without requiring precharging said signal transmission line for every bit, by eliminating an intersymbol interference component introduced by preceding data, wherein:

said signal transmission line comprises a plurality of switchable signal transmission lines organized in a branching structure or a hierarchical structure, at least one target unit from which to read data is connected to each of a plurality of said switchable signal transmission lines, and a readout circuit including a circuit for eliminating said intersymbol interference component is connected to said signal transmission line, said readout circuit being a circuit employing a partial-response detection method to correct the intersymbol interference component elimination when switching said signal transmission line; and said intersymbol interference component elimination circuit reduces noise introduced when said signal transmission line is switched between said plurality of switchable signal transmission lines, and thereby provides a smooth intersymbol interference component elimination operation when said signal transmission line is switched.

2. A signal transmission system as claimed in claim 1, wherein response time of said signal transmission line is set approximately equal to or longer than the length of a transmitted symbol.

3. A signal transmission system as claimed in claim 1, wherein, when transferring continuous data from a same signal transmission line, precharging of said signal transmission line for every bit is not performed, and during a period preceding the switching of said signal transmission line and during a period when continuous data transmission is not performed, some of said plurality of switchable signal transmission lines are precharged to a predetermined voltage level.

4. A signal transmission system as claimed in claim 1, wherein, when said signal transmission line is switched from a first switchable signal transmission line to a second switchable signal transmission line, said second switchable signal transmission line to be selected next is precharged to a predetermined voltage level before said signal transmission line is switched.

5. A signal transmission system as claimed in claim 1, wherein said readout circuit corrects the intersymbol interference component elimination, when said signal transmission line is switched, by varying an input capacitance value.

6. A signal transmission system as claimed in claim 5, wherein said readout circuit employing said partial-response detection method includes: an intersymbol interference estimation means for estimating intersymbol interference from a previously received signal; and a decision means for making a logic decision on a currently received signal by subtracting said estimated intersymbol interference from said currently received signal.

7. A signal transmission system as claimed in claim 5, wherein said readout circuit employing said partial-response detection method includes first and second partial-response detection amplifiers arranged in parallel with each other, and wherein said first partial-response amplifier performs an intersymbol interference estimation operation while said second partial-response detection amplifier is performing a data decision operation and, at the next timing, performs the data decision operation while said second partial-response detection amplifier is performing the intersymbol interference estimation operation.

8. A signal transmission system as claimed in claim 1, wherein said signal transmission line is configured as complementary buses and said readout circuit is configured as a complementary-type bus amplifier.

9. A signal transmission system as claimed in claim 1, wherein said readout circuit operates only when data is transferred via said signal transmission line.

10. A signal transmission system as claimed in claim 1, wherein, when said signal transmission line is switched, a first driver select signal for selecting a driver on an activated signal transmission line currently transmitting data thereon and a second driver select signal for selecting a driver on a signal transmission line currently inactive and expected to be activated after the switching are generated as a common driver select signal, and said inactive signal transmission line is precharged during a period that includes the last cycle of the state in which data in an arbitrary driver on said inactive signal transmission line, selected simultaneously when selecting the driver on said activated signal transmission line, is transmitted on said inactive signal transmission line.

11. A signal transmission system as claimed in claim 10, wherein said common driver select signal is also supplied in common to a plurality of signal transmission lines other than said signal transmission line.

12. A signal transmission system as claimed in claim 1, wherein a timing signal for carrying out the switching of said signal transmission line is generated externally and distributed to a switching circuit for said signal transmission line, or is supplied at timing before the last one cycle of amplification of a currently activated signal transmission line.

13. A signal transmission system as claimed in claim 1, wherein before switching said signal transmission line an inactive signal transmission line is precharged in such a direction as to reduce the noise that has an effect on an intersymbol interference component elimination operation subsequently performed in said readout circuit, or precharged to a voltage level within a range of plus or minus a predetermined voltage about a voltage at one half of either a read or write maximum amplitude of said signal transmission line, said predetermined voltage being smaller than a transistor threshold voltage.

14. A signal transmission system as claimed in claim 1, wherein said signal transmission system includes a state latch circuit for holding at least two states consisting of a CURRENT state indicating a bus currently in an active state and a NEXT state indicating a bus to be selected and activated next, or four states consisting of said CURRENT state, said NEXT state, a STANDBY state indicating a bus in a standby state, and a PREVIOUS state indicating a bus just deactivated.

15. A signal transmission system for transmitting data over a signal transmission line without requiring precharging said signal transmission line for every bit, by eliminating an intersymbol interference component introduced by preceding data, wherein
said signal transmission line comprises a plurality of switchable transmission lines, and when said signal transmission line is switched from a first switchable transmission line to a second switchable transmission line, said first switchable transmission line is not precharged on or before switching said signal transmission line, and said second switchable transmission line to be selected next is precharged to a predetermined level before switching said signal transmission line, in order to continue data transmission.

16. A signal transmission system as claimed in claim 15, wherein said signal transmission system includes a state latch circuit for holding at least two states consisting of a CURRENT state indicating a bus currently in an active state and a NEXT state indicating a bus to be selected and activated next, or four states consisting of said CURRENT state, said NEXT state, a STANDBY state indicating a bus in a standby state, and a PREVIOUS state indicating a bus just deactivated.

17. A signal transmission system for transmitting data over a signal transmission line without requiring precharging said signal transmission line for every bit, by eliminating an intersymbol interference component introduced by preceding data, wherein
said signal transmission line comprises a plurality of switchable transmission lines, and when said signal transmission line is switched from a first switchable transmission line to a second switchable transmission line, said second switchable transmission line to be selected next is precharged to a predetermined level before switching said signal transmission line, in order to continue data transmission; and a readout circuit, employing a partial-response detection method to correct the intersymbol interference component elimination when switching said signal transmission line, is connected to said signal transmission line.

* * * * *